(12) United States Patent  
Ushikubo

(10) Patent No.: US 8,664,849 B2  
(45) Date of Patent: Mar. 4, 2014

(54) LIGHT-EMITTING ELEMENT, LIGHTING DEVICE, LIGHT-EMITTING DEVICE, AND ELECTRONIC DEVICE

(75) Inventor: Takahiro Ushikubo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/614,151

(22) Filed: Sep. 13, 2012

(65) Prior Publication Data

US 2013/0009140 A1    Jan. 10, 2013

Related U.S. Application Data

(63) Continuation of application No. 12/234,258, filed on Sep. 19, 2008, now Pat. No. 8,283,856.

(30) Foreign Application Priority Data

Sep. 27, 2007    (JP) ................................. 2007-250512

(51) Int. Cl.  
*H01J 1/63* (2006.01)

(52) U.S. Cl.  
USPC ........................................................ 313/504

(58) Field of Classification Search  
USPC ................................................ 313/502–506  
See application file for complete search history.

(56) References Cited

U.S. PATENT DOCUMENTS

| | | | |
|---|---|---|---|
| 6,803,120 B2 | 10/2004 | Fukuoka et al. | |
| 6,866,947 B1 | 3/2005 | Fukuoka et al. | |
| 7,723,722 B2 * | 5/2010 | Kawakami et al. | ............. 257/40 |
| 8,039,122 B2 | 10/2011 | Kawakami et al. | |
| 8,298,687 B2 | 10/2012 | Kawakami et al. | |
| 2005/0019606 A1 | 1/2005 | Fukuoka et al. | |
| 2005/0129982 A1 | 6/2005 | Fukuoka et al. | |
| 2006/0088729 A1 * | 4/2006 | Begley et al. | ................. 428/690 |
| 2007/0049760 A1 | 3/2007 | Kawakami et al. | |

(Continued)

FOREIGN PATENT DOCUMENTS

| | | |
|---|---|---|
| EP | 1 182 244 A1 | 2/2002 |
| EP | 1 905 809 A2 | 4/2008 |

(Continued)

OTHER PUBLICATIONS

Adachi, C., *Device Physics, Material Chemistry, and Device Application of Organic Light Emitting Diodes*, Chapter 25, Organic EL as Lighting Application, Dec. 14, 2007, pp. 257-267 (with English translation, pp. 1-12).

*Primary Examiner* — Anh Mai  
*Assistant Examiner* — Brenitra M Lee  
(74) *Attorney, Agent, or Firm* — Husch Blackwell LLP

(57) ABSTRACT

A light-emitting element whose degree of deterioration with driving time is improved and of which emission colors are easily controlled. A light-emitting emitting element having a first electrode, a second electrode, and a layer containing an organic compound located between the first electrode and the second electrode, in which the layer containing the organic compound at least has, from the second electrode side, a light-emitting layer in which a first layer, a second layer, and a third layer are stacked, and a hole-transporting layer provided in contact with the third layer; the first layer contains a first organic compound and a second organic compound; the second layer contains a third organic compound and a fourth organic compound; and the third layer contains the first organic compound and a fifth organic compound.

14 Claims, 28 Drawing Sheets

(56) References Cited

U.S. PATENT DOCUMENTS

| | | |
|---|---|---|
| 2007/0134515 A1 | 6/2007 | Fukuoka et al. |
| 2007/0194711 A1 | 8/2007 | Matsuura et al. |
| 2008/0017853 A1 | 1/2008 | Egawa et al. |
| 2008/0268284 A1* | 10/2008 | Kawakami et al. ........... 428/691 |
| 2009/0004506 A1* | 1/2009 | Nomura et al. ............... 428/690 |
| 2009/0102366 A1 | 4/2009 | Ushikubo et al. |
| 2009/0108734 A1 | 4/2009 | Begley et al. |
| 2009/0284139 A1 | 11/2009 | Ushikubo et al. |
| 2013/0005067 A1 | 1/2013 | Kawakami et al. |

FOREIGN PATENT DOCUMENTS

| | | |
|---|---|---|
| EP | 2 479 814 A1 | 7/2012 |
| JP | 2002-329578 | 11/2002 |
| JP | 2004-311231 | 11/2004 |
| JP | 2006-114796 | 4/2006 |
| JP | 2007-39431 | 2/2007 |
| JP | 2007-91722 | 4/2007 |
| JP | 2007-201491 | 8/2007 |
| JP | 2007-220593 | 8/2007 |
| WO | WO 2006/104221 A1 | 10/2006 |
| WO | WO 2007/026626 A1 | 3/2007 |

* cited by examiner

LIGHT-EMITTING ELEMENT, LIGHTING DEVICE, LIGHT-EMITTING DEVICE, AND ELECTRONIC DEVICE

This application is a continuation of application Ser. No. 12/234,258 filed on Sep. 19, 2008 now U.S. Pat. No. 8,283,856.

BACKGROUND OF THE INVENTION

1. Field of the Invention

The present invention relates to a light-emitting element at least part of which includes an organic compound. The present invention also relates to a lighting device, a light-emitting device, and an electronic device which are provided with the light-emitting element.

2. Description of the Related Art

Development of a light-emitting device in which a layer containing an organic compound is provided between a pair of electrodes and light emission is obtained by current flowing between the pair of electrodes has been advanced. Such a light-emitting device is capable of being reduced in thickness and weight in comparison with a display device which is currently called a "thin-film display device". Moreover, because of self-emission type, such a light-emitting device has a high level of visibility and high response speed. Therefore, such a light-emitting device has been actively developed as a next-generation display device, and has been partly put into practical use at present.

Such a light-emitting element can emit light of various colors depending on a material contained in a layer containing an organic compound, which serves as an emission center. Moreover, by stacking of layers containing an emission center substance which exhibits different emission colors, light emission overlap, and more variations of emission colors can be obtained. In particular, the emphasis is put on white light which can be obtained by overlapping of red light, green light, and blue light or overlapping of emission colors which are in a relationship of complementary colors because white light is suitable for the use of a backlight or lighting, in addition to a display.

Deterioration of a light-emitting element is given as one of the reasons why such a light-emitting device with many advantages is limited to a partial practical use. A light-emitting element is deteriorated such that luminance is lowered with accumulation of driving time even if the same amount of current is fed. In order to promote the light-emitting element, it is essential to obtain a light-emitting element whose degree of deterioration is acceptable for an actual product. A light-emitting element has been researched from many aspects such as aspects of a driver circuit, sealing, an element structure, and a material (for example, see Patent Document 1: Japanese Published Patent Application No. 2006-114796) and Patent Document 2: Japanese Published Patent Application No. 2007-220593).

However, actually, there are various causes of decrease in luminance with accumulation of driving time, and the present measures are not enough.

SUMMARY OF THE INVENTION

It is an object of the present invention to provide a light-emitting element or a lighting device whose degree of deterioration with driving time is improved.

It is another object of the present invention to provide a light-emitting device or an electronic device which has high reliability of a display portion.

It is another object of the present invention to provide a light-emitting element or a lighting device of which emission colors are easily controlled.

It is another object of the present invention to provide a light-emitting device or an electronic device which has high display quality.

One feature of the present invention is a light-emitting element including a first electrode, a second electrode, and a layer which contains an organic compound and is located between the first electrode and the second electrode. The layer containing the organic compound includes at least a light-emitting layer in which a first layer, a second layer, and a third layer are stacked from the second electrode side, and a hole-transporting layer provided in contact with the third layer. The first layer contains a first organic compound and a second organic compound. The second layer contains a third organic compound and a fourth organic compound. The third layer contains the first organic compound and a fifth organic compound. The amount of the second organic compound contained in the first layer is larger than that of the first organic compound in the first layer. The amount of the fifth organic compound contained in the third layer is larger than that of the first organic compound in the third layer. Decrease in the luminance of the light-emitting element of the present invention which has such a structure with accumulation of driving time is small, and thus the reliability of the light-emitting element can be improved. Moreover, emission colors of the light-emitting element can be easily controlled.

Another feature of the present invention is a light-emitting element including a first electrode, a second electrode, and a layer which contains an organic compound and is located between the first electrode and the second electrode. The layer containing the organic compound includes at least a layer playing a role of emitting light, in which a first layer, a second layer, and a third layer are stacked from the second electrode side, and a hole-transporting layer provided in contact with the third layer. The first layer contains a first organic compound and a second organic compound. The second layer contains a third organic compound and a fourth organic compound. The third layer contains the first organic compound and a fifth organic compound. The proportion of the first organic compound in the first layer is greater than or equal to 0.1 wt % and less than 50 wt %. The proportion of the third organic compound in the second layer is greater than or equal to 0.1 wt % and less than 50 wt %. The proportion of the first organic compound in the third layer is greater than or equal to 0.1 wt % and less than 50 wt %. Decrease in the luminance of the light-emitting element of the present invention which has such a structure with accumulation of driving time is small, and thus the reliability of the light-emitting element can be improved. Moreover, emission colors of the light-emitting element can be easily controlled.

Another feature of the present invention is a light-emitting element including a first electrode, a second electrode, and a layer which contains an organic compound and is located between the first electrode and the second electrode. The layer containing the organic compound includes at least a layer playing a role of emitting light, in which a first layer, a second layer, and a third layer are stacked from the second electrode side, and a hole-transporting layer provided in contact with the third layer. The first layer contains a first organic compound and a second organic compound. The second layer contains a third organic compound and a fourth organic compound. The third layer contains the first organic compound and a fifth organic compound. The proportion of the first organic compound in the first layer is greater than or equal to 0.1 wt % and less than 50 wt %. The proportion of the third organic compound in the second layer is greater than or equal to 0.1 wt % and less than 50 wt %. The proportion of the first organic compound in the third layer is greater than or equal to 0.1 wt % and less than 50 wt %. Light is emitted from the first organic compound and the third organic compound when voltage is applied between the first electrode and the second electrode so that the potential of the first electrode becomes higher than that of the second electrode. Decrease in the luminance of the light-emitting element of the present invention which has such a structure with accumulation of driving time is small, and thus the reliability of the light-emitting element can be improved. Moreover, emission colors of the light-emitting element can be easily controlled.

Another feature of the present invention is a light-emitting element including a first electrode, a second electrode, and a layer which contains an organic compound and is located between the first electrode and the second electrode. The layer containing the organic compound includes at least a layer playing a role of emitting light, in which a first layer, a second layer, and a third layer are stacked from the second electrode side, and a hole-transporting layer provided in contact with the third layer. The first layer contains a first organic compound and a second organic compound. The second layer contains a third organic compound and a fourth organic compound. The third layer contains the first organic compound and a fifth organic compound. The proportion of the first organic compound in the first layer is greater than or equal to 0.1 wt % and less than 50 wt %. The proportion of the third organic compound in the second layer is greater than or equal to 0.1 wt % and less than 50 wt %. The proportion of the first organic compound in the third layer is greater than or equal to 0.1 wt % and less than 50 wt %. The first organic compound is an emission center substance in the first layer and the third layer. The third organic compound is an emission center substance in the second layer. Decrease in the luminance of the light-emitting element of the present invention which has such a structure with accumulation of driving time is small, and thus the reliability of the light-emitting element can be improved. Moreover, emission colors of the light-emitting element can be easily controlled.

Another feature of the present invention is a light-emitting element in which the fourth organic compound and the fifth organic compound are a material having a hole-transporting property and the second organic compound is a material having an electron-transporting property in the above-described structures. Decrease in the luminance of the light-emitting element of the present invention which has such a structure with accumulation of driving time is small, and thus the reliability of the light-emitting element can be improved. Moreover, emission colors of the light-emitting element can be easily controlled.

Another feature of the present invention is a light-emitting element in which the fourth organic compound is a condensed polycyclic substance in the above-described structures. In the light-emitting element of the present invention which has such a structure, the condensed polycyclic substance which has a wide band gap and is suitable as a host material is used as a host of an emission center substance, and decrease in the luminance with accumulation of driving time is small; thus, the reliability of the light-emitting element can be improved. Moreover, emission colors of the light-emitting element can be easily controlled.

Another feature of the present invention is a light-emitting element in which the fourth organic compound is a tricyclic, tetracyclic, pentacyclic, or hexacyclic condensed polycyclic aromatic compound in the above-described structures. In the light-emitting element of the present invention which has such a structure, a tricyclic, tetracyclic, pentacyclic, or hexacyclic condensed polycyclic aromatic compound which has a wide band gap and is suitable as a host material is used as a host of an emission center substance, and decrease in the luminance with accumulation of driving time is small; thus, the reliability of the light-emitting element can be improved. Moreover, emission colors of the light-emitting element can be easily controlled.

Another feature of the present invention is a light-emitting element in which the fourth organic compound is an anthracene derivative in the above-described structures. In the light-emitting element of the present invention which has such a structure, the anthracene derivative which has a wide band gap and is suitable as a host material is used as a host of an emission center substance, and decrease in the luminance with accumulation of driving time is small; thus, the reliability of the light-emitting element can be improved. Moreover, emission colors of the light-emitting element can be easily controlled.

Another feature of the present invention is a light-emitting element in which the fourth organic compound and the fifth organic compound are the same substance in the above-described structures. The light-emitting element of the present invention which has such a structure has the features of the above-described structures, and further can be manufactured by a simplified process.

Another feature of the present invention is a light-emitting element in which a peak wavelength of light emitted from the first organic compound is shorter than that of light emitted from the third organic compound in the above-described structures. The light-emitting element of the present invention which has such a structure has the features of the above-described structures, and further emission colors can be easily controlled.

Another feature of the present invention is a light-emitting element in which a color of light emitted from the first organic compound and a color of light emitted from the third organic compound are in a relationship of complementary colors in the above-described structures. The light-emitting element of the present invention which has such a structure has the features of the above-described structures, and further white light emission can be obtained. The light-emitting element of the present invention of which emission colors can be easily controlled can be preferably applied to a white light-emitting element.

Another feature of the present invention is a light-emitting element in which the first organic compound emits blue light and the third organic compound emits yellow light in the above-described structures. The light-emitting element of the present invention which has such a structure has the features of the above-described structures, and further white light emission can be obtained. The light-emitting element of the present invention of which emission colors can be easily controlled can be preferably applied to a white light-emitting element.

Another feature of the present invention is a light-emitting element in which a peak wavelength of light emitted from the first organic compound is in the range of 400 nm to 480 nm and a peak wavelength of light emitted from the third organic compound is in the range of 540 nm to 600 nm. The light-emitting element of the present invention which has such a structure has the features of the above-described structures, and white light emission can be obtained. The light-emitting element of the present invention of which emission colors can be easily controlled can be preferably applied to a white light-emitting element.

Another feature of the present invention is a light-emitting element in which the first organic compound emits blue green light and the third organic compound emits red light in the above-described structure. The light-emitting element of the present invention which has such a structure has the features of the above-described structures, and white light emission can be obtained. The light-emitting element of the present invention of which emission colors can be easily controlled can be preferably applied to a white light-emitting element.

Another feature of the present invention is a light-emitting element in which a peak wavelength of light emitted from the first organic compound is in the range of 480 nm to 520 nm and a peak wavelength of light emitted from the third organic compound is in the range of 600 nm to 700 nm. The light-emitting element of the present invention which has such a structure has the features of the above-described structures, and white light emission can be obtained. The light-emitting element of the present invention of which emission colors can be easily controlled can be preferably applied to a white light-emitting element.

Another feature of the present invention is a lighting device in which the above-described light-emitting element is used. The lighting device which has such a structure can be a lighting device with little decrease in luminance with accumulation of driving time and long life. Moreover, emission colors can be easily controlled, and thus emission colors corresponding to the purpose of the lighting device can be easily provided.

Another feature of the present invention is a light-emitting device which is provided with a light-emitting element and a unit for controlling emission of the light-emitting element. The light-emitting device which has such a structure can be a light-emitting device with little decrease in luminance with accumulation of driving time and long life. Moreover, emission colors can be easily controlled, and thus the light-emitting device can have high display quality.

Another feature of the present invention is an electronic device in which the above-described light-emitting device is mounted on a display portion. The electronic device which has such a structure can be an electronic device having a display portion with long life. Moreover, emission colors can be easily controlled, and thus the electronic device can have a display portion with high display quality.

The present invention makes it possible to provide a light-emitting element whose degree of deterioration with driving time can be improved.

In addition, a lighting device whose degree of deterioration with driving drive is improved can be provided.

Further, a light-emitting device or an electronic device which has a display portion with high reliability can be provided.

Moreover, a light-emitting element or a lighting device of which emission colors can be easily controlled can be provided.

Furthermore, a light-emitting device or an electronic device with high display quality can be provided.

DETAILED DESCRIPTION OF THE INVENTION

Embodiment Modes of the present invention will be hereinafter described with reference to the accompanying drawings. Note that the present invention can be implemented in many different modes and it is easily understood by those skilled in the art that modes and details of the present invention can be modified in various ways without departing from the purpose and scope of the present invention. Therefore, the present invention should not be interpreted as being limited to the description below of Embodiment Modes.

[Embodiment Mode 1]

Figure 2:
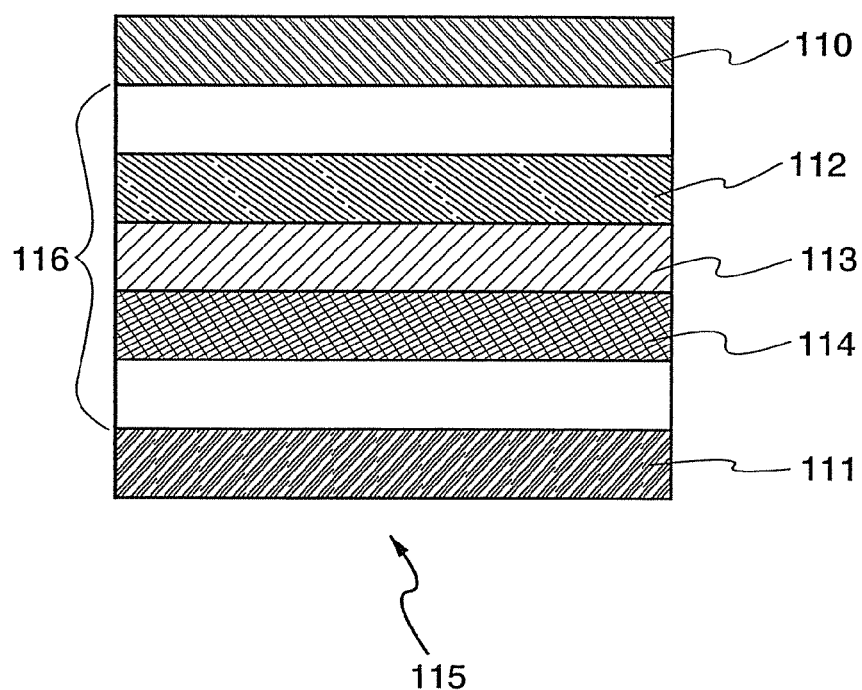
FIG. 2 is a schematic view of a conventional light-emitting element.

FIG. 2 is a schematic view of a conventional light-emitting element 115 corresponding to the present invention. The light-emitting element 115 has a structure in which a layer 116 containing an organic compound is provided between a first electrode 111 and a second electrode 110. In the layer 116 containing the organic compound, a second layer 113 and a first layer 112 are stacked in this order from the first electrode 111 side, and a hole-transporting layer 114 is provided in contact with the second layer 113. The first layer 112 contains a first organic compound which serves as an emission center and a second organic compound as a host material which disperses the first organic compound. The second layer 113 contains a third organic compound which serves as an emission center and a fourth organic compound as a host material which disperses the third organic compound. The second organic compound is formed of a material having an electron-transporting property. The fourth organic compound is formed of a material having a hole-transporting property. Note that in this specification, the words "having an electron-transporting property" mean that at least an electron-transporting property is higher than a hole-transporting property, and the words "having a hole-transporting property" mean that at least a hole-transporting property is higher than an electron-transporting property. The hole-transporting layer 114 is provided for a space between the electrodes and the layer which emits light and is formed of a material having a hole-transporting property.

In the light-emitting element 115, when voltage is applied between the first electrode 111 and the second electrode 110 so that the potential of the first electrode 111 becomes higher than that of the second electrode 110, electrons are injected from the second electrode 110 to the layer 116 containing the organic compound and holes are injected from the first electrode 111 to the layer 116 containing the organic compound. Most of the injected carriers are recombined in the vicinity of an interface between the first layer 112 and the second layer 113 and the first organic compound and the third organic compound emit light, whereby light emission in which the two emission spectrums overlap can be obtained. Note that in the layer 116 containing the organic compound, a layer may be provided or is not necessarily provided as appropriate between the second electrode 110 and the first layer 112 and between the first electrode 111 and the hole-transporting layer 114

The inventor found that in such a light-emitting element 115, the degree of deterioration of the light-emitting element with driving time can be improved when the third layer containing the first organic compound which is an emission center substance contained in the first layer 112 and the fifth organic compound as a host material dispersing the first organic compound is provided between the second layer 113 and the hole-transporting layer 114.

Figure 1:
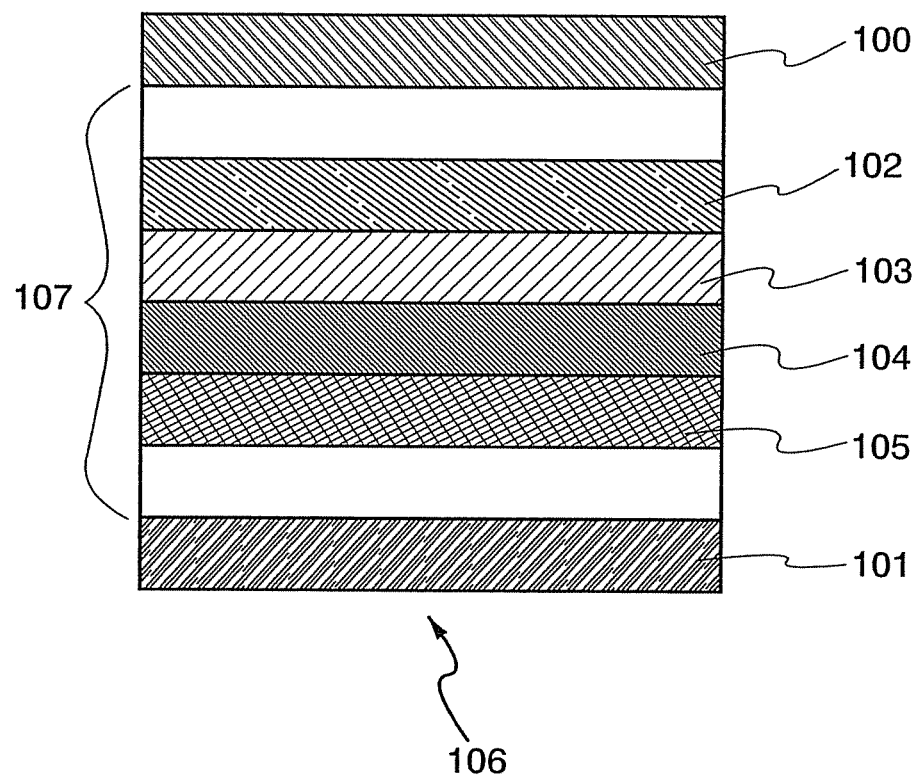
FIG. 1 is a schematic view of a light-emitting element of the present invention.

FIG. 1 is a schematic view of a light-emitting element 106 of this embodiment mode. Between a first electrode 101 and a second electrode 100, a third layer 104, a second layer 103, and a first layer 102 are stacked from the first electrode 101 side. Moreover, a hole-transporting layer 105 is provided in contact with the third layer 104. The first layer 102 contains a first organic compound which serves as an emission center and a second organic compound as a host material which disperses the first organic compound. The second layer 103 contains a third organic compound which serves as an emission center and a fourth organic compound as a host material which disperses the third organic compound. The third layer 104 contains a first organic compound which serves as an emission center and a fifth organic compound as a host material which disperses the first organic compound. Here, the first organic compound in the first layer 102 and the first organic compound in the third layer 104 are the same substance. The second organic compound is formed of a material having an electron-transporting property, and the fourth organic compound is formed of a material having a hole-transporting property.

Also in the light-emitting element 106, similarly to in the light-emitting element 115, when voltage is applied between the first electrode 101 and the second electrode 100 so that the potential of the first electrode 101 becomes higher than that of the second electrode 100, and light emission can be obtained from the first organic compound and the third organic compound. Since the light-emitting element 106 is provided with the third layer 104, the degree of deterioration with driving time can be improved.

The reason why the degree of deterioration is improved is considered as follows: in the light-emitting element 115, electrons which do not contribute to recombination at the interface between the first layer 112 and the second layer 113 penetrate the second layer 113 to reach the hole-transporting layer 114, and thus deterioration occurs, whereas in the light-emitting element 106, the number of electrons reaching the hole-transporting layer 105 is decreased due to the provision of the third layer 104.

Note that if the fifth organic compound contained in the third layer 104 as a host material which disperses an emission center substance is a material having a hole-transporting property, the number of electrons reaching the hole-transporting layer 105 can be further reduced, which is preferable. Note that the fourth organic compound and the fifth organic compound may be formed of the same material. In this case, a host material does not need to be exchanged in forming the second layer 103 and the third layer 104, and thus the manufacturing process can be somewhat simplified. Note that in the case of such a structure, the second layer 103 and the third layer 104 are distinguished by the kind of an emission center substance (the third organic compound or the first organic compound) which is a dopant.

As a preferable material as the host material which disperses an emission center substance, a condensed polycyclic material such as a condensed polycyclic aromatic compound typified by an anthracene derivative is given. Such a material has a large band gap; thus, excitation energy is difficult to transfer from an emission center substance and decline in emission efficiency or deterioration of color purity is unlikely to be caused. Moreover, such a material has either an electron-transporting property or a hole-transporting property depending on a substituent, and can be applied to light-emitting elements with various structures. However, in some cases, since a skeleton itself of the condensed polycyclic material has an electron-transporting property, the condensed polycyclic material also has ability to transport certain amount of electrons even when it is made to have a high hole-transporting property by a substituent, and effects of deterioration due to penetration of the electrons are increased depending on conditions. In such a case, the use of the light-emitting element 106 of this embodiment mode makes it possible to effectively suppress deterioration. Note that as the condensed polycyclic material used as a host material, tricyclic, tetracyclic, pentacyclic, and hexacyclic condensed aromatic compounds are especially effective.

Substances which emit different colors from each other may be used as the first organic compound and the third organic compound each of which is an emission center substance. Accordingly, the light-emitting element 106 can emit light in which these two lights overlap, and various emission colors can be obtained. The use of the structure of the light-emitting element 106 of this embodiment mode makes it possible to obtain a light-emitting element which emits light with a desired color and whose degree of deterioration with driving time is improved.

As described above, in the light-emitting element 106 of this embodiment mode, a recombination region of electrons and holes is located at the interface between the first layer 102 and the second layer 103; thus, in some cases, energy transfer from an organic compound which emits light with a shorter wavelength from an organic compound which emits light with a longer wavelength occurs. In such a case, light emission from the organic compound which emits light with a longer wavelength is inevitably becomes higher, and it becomes difficult to have balance depending on a combination of colors. Therefore, especially in the structure in which a substance which emits light with a wavelength shorter than that of light emitted from the third organic compound is used as the first organic compound, little light emission from the first organic compound can be obtained by recombination of the electrons penetrating the second layer 103 and holes in the third layer 104. Thus, it becomes easy to balance emission colors of the light-emitting element. Accordingly, a light-emitting element which emits light with a desired color can be easily obtained.

Note that the above-described structure of the light-emitting element 106 of this embodiment is very effective in obtaining white light emission. When the structure of the light-emitting element 106 of this embodiment mode is used, a white light-emitting element in which desired white balance is realized and whose degree of deterioration with driving time is improved can be obtained. Moreover, in the case where a structure is employed in which in the light-emitting element 106, a substance which emits light with a wavelength shorter than that of light emitted from the third organic compound is used as the first organic compound, a light-emitting element can be obtained more easily in which desired white balance is realized and whose degree of deterioration with driving time is improved.

In the case where a white light-emitting element is manufactured using the structure of the light-emitting element 106 of this embodiment mode, as a combination of light emitted from the first organic compound and the third organic compound, a combination of colors which are in a relationship of complementary colors, such as red and blue green; or yellow and blue is preferably used. In particular, a structure in which a substance which emits light with a wavelength shorter than that of light emitted from the third organic compound is used as the first organic compound, for example, a combination of a substance which emits light of blue as the first organic compound and a substance which emits light of yellow as the third organic compound, or a combination of a substance which emits light of blue green as the first organic compound and a substance which emits light of red as the third organic compound, is preferable because such a structure makes it easy to balance emission colors of the light-emitting element.

In the case where a white light-emitting element is manufactured using the structure of the light-emitting element 106 of this embodiment mode, as examples of the combination of light emitted from the first organic compound and light emitted from the third organic compound, there are a combination of light whose peak wavelength ranges from 600 nm to 700 nm and light whose peak wavelength ranges from 480 nm to 520 nm, and a combination of light whose peak wavelength ranges from 540 nm to 600 nm and light whose peak wavelength ranges from 400 nm to 480 nm. Needless to say, also in this case, the structure using a substance which emits light with a wavelength shorter than that of light emitted from the third organic compound is used as the first organic compound is preferable because the structure makes it easy to balance emission colors of the light-emitting element.

Next, the light-emitting element described above will be described more specifically with a manufacturing method thereof. Note that an element structure and a manufacturing method described here are just an example, and other known structures, materials, and manufacturing methods can be applied without departing from the purpose of the present invention.

FIG. 1 is a schematic view showing an example of an element structure of the light-emitting element of the present invention. The light-emitting element shown in FIG. 1 has a structure including a layer 107 containing an organic compound, between the second electrode 100 and the first electrode 101. The layer 107 containing the organic compound has at least a light-emitting layer having a stacked structure in which the third layer 104 containing the first organic compound which is an emission center substance and the fifth organic compound which is a host material; the second layer 103 containing the third organic compound which is an emission center substance and the fourth organic compound which is a host material; and the first layer 102 containing the first organic compound and the second organic compound which is a host material are stacked in this order from the first electrode 101 side (here, whether the third layer emits light or not is no object), and a hole-transporting layer 105 provided in contact with the third layer 104. An electron-injecting layer, an electron-transporting layer, or the like may be provided between the light-emitting layer and the second electrode 100 as appropriate, and a layer such as a hole-injecting layer may be provided between the hole-transporting layer 105 and the first electrode 101 as appropriate. One of the first electrode 101 and the second electrode 100 is an anode, and the other is a cathode. In this embodiment mode, the case where the first electrode 101 is an anode and the second electrode 100 is a cathode will be described. Note that the anode in the present invention means an electrode which injects holes to a layer containing a light-emitting material and the cathode means an electrode which injects electrons to the layer containing the light-emitting material.

First, the anode is formed over an insulating surface. For the anode, metal, an alloy, a conductive compound, a mixture thereof, or the like having a high work function (specifically, 4.0 eV or higher) is preferably used. Specifically, for example, the anode is formed using indium tin oxide (ITO), indium tin oxide containing silicon or silicon oxide, indium oxide containing zinc oxide (ZnO), indium oxide containing tungsten oxide and zinc oxide (IWZO), or the like. Such a conductive metal oxide film is generally formed by sputtering; however, it may be formed by application of a sol-gel method or the like. For example, indium oxide containing zinc oxide (ZnO) can be formed by a sputtering method using a target in which 1 wt % to 20 wt % of zinc oxide is added to indium oxide. In addition, indium oxide containing tungsten oxide and zinc oxide (IWZO) can be formed by a sputtering method using a target in which 0.5 wt % to 5 wt % of tungsten oxide and 0.1 wt % to 1 wt % of zinc oxide are added to indium oxide. Moreover, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used.

Subsequently, the layer containing the organic compound is formed. For the layer 107 containing the organic compound, either a low molecular material or a high molecular material can be used. In addition, the material forming the layer 107 containing the organic compound is not limited to a material containing only an organic compound material, and may partially contain an inorganic compound. In addition, the layer 107 containing the organic compound is generally formed of a combination of functional layers as appropriate, such as a hole-injecting layer, a hole-transporting layer, a hole blocking layer, a light-emitting layer, an electron-transporting layer, and an electron-injecting layer. The layer 107 containing the organic compound may include a layer having two or more functions of the above layers, or not all the above layers may be formed. Needless to say, a layer having a function other than the functions of the above-described layers may be provided. In this embodiment mode, description is made using a light-emitting element, as an example, in which a stacked layer including a hole-injecting layer, a hole-transporting layer, a light-emitting layer (stacked body including the third layer 104, the second layer 103, and the first layer 102), an electron-transporting layer, and an electron-injecting layer in this order from the anode side is used as the layer 107 containing the organic compound.

In the case of using a hole-injecting layer, metal oxide such as vanadium oxide, molybdenum oxide, ruthenium oxide, and aluminum oxide, and the like are given as a material which functions as the hole-injecting layer. Alternatively, a porphyrin-based compound is effective among organic compounds, and phthalocyanine ($H_2Pc$), copper phthalocyanine (CuPc), or the like can be used. A high molecular compound (e.g., an oligomer, a dendrimer, or a polymer) can be used as well for the hole-injecting layer. For example, high molecular compounds such as poly(N-vinylcarbazole) (PVK), poly(-vinyl triphenylamine) (PVTPA), poly[N-(4-{N'-[4-(4-diphenylamino)phenyl]phenyl-N'-phenylamino}phenyl)methacrylamide] (PTPDMA), and poly[N,N'-bis(4-butylphenyl)-N,N'-bis(phenyl)benzidine (Poly-TPD) are given. In addition, high molecular compounds mixed with acid such as poly(3,4-ethylenedioxythiophene)/poly(styrenesulfonic acid) (PEDOT/PSS) and polyaniline/poly(styrenesulfonic acid) (PAni/PSS) can be used. The hole-injecting layer is formed in contact with the anode, and with use of the hole-injecting layer, a carrier injection barrier is reduced and carriers are efficiently injected to the light-emitting element, which results in reduction of driving voltage.

Alternatively, for the hole-injecting layer, a material in which an acceptor material is contained in a substance having a hole-transporting property (hereinafter, the material is referred to as a "composite material") can be used. Note that, by use of the substance having a high hole-transporting property containing an acceptor substance, the substance can have an ohmic contact with an electrode and a material used to form an electrode may be selected regardless of its work function. In other words, besides a material having a high work function, a material with a low work function can be used as the anode. As the acceptor material, 7,7,8,8-tetracyano-2,3,5,6-tetrafluoroquinodimethane ($F_4$-TCNQ), chloranil, or the like can be given. In addition, a transition metal oxide can be given. In addition, oxide of metal that belongs to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of a high electron accepting property. Among these, molybdenum oxide is especially preferable because it is stable in air, its hygroscopic property is low, and it can be easily treated.

Note that, in this specification, the term "composition" means not only a simple mixture of two materials but also a mixture of a plurality of materials in a condition where an electric charge is given and received between the materials.

As a substance having a high hole-transporting property used for the composite material, various compounds such as an aromatic amine compound, a carbazole derivative, aromatic hydrocarbon, and a high molecular compound (such as oligomer, dendrimer, or polymer) can be used. A substance having a hole mobility of $10^{-6}$ cm$^2$/Vs or higher is preferably used as a substance having a high hole-transporting property used for the composite material. However, substances other than the above-described substance can be used as long as they have a hole-transporting property which is higher than an electron-transporting property. An organic compound which can be used as a substance having a high hole-transporting property for the composite material will be specifically given below.

For example, as the aromatic amine compound which can be used for the composite material, the following can be given: 4,4'-bis[N-(1-naphthyl)-N-phenylamino]biphenyl (NPB or α-NPD); N,N'-bis(4-methylphenyl)-N,N'-diphenyl-p-phenylenediamine (DTDPPA); 4,4'-bis[N-(4-diphenylaminophenyl)-N-phenylamino]biphenyl (DPAB); N,N'-bis[4-[bis(3-methylphenyl)amino]phenyl]-N,N'-diphenyl-[1,1'-biphenyl]-4,4'-diamine (DNTPD); 1,3,5-tris[N-(4-diphenylaminophenyl)-N-phenylamino]benzene (DPA3B); and the like.

As the carbazole derivative which can be used for the composite material, the following can be given specifically: 3-[N-(9-phenylcarbazol-3-yl)-N-phenylamino]-9-phenyl-carbazole (PCzPCA1); 3,6-bis[N-(9-phenylcarbazol-3-yl)-N-phenylamino]-9-phenylcarbazole (PCzPCA2); 3-[N-(1-naphthyl)-N-(9-phenylcarbazol-3-yl)amino]-9-phenylcarbazole (PCzPCN1); and the like.

Moreover, as the carbazole derivative which can be used for the composite material, 4,4'-di(N-carbazolyl)biphenyl (CBP); 1,3,5-tris[4-(N-carbazolyl)phenyl]benzene (TCPB); 9-[4-(10-phenyl-9-anthryl)phenyl]-9H-carbazole (CzPA); 1,4-bis[4-(N-carbazolyl)phenyl]-2,3,5,6-tetraphenylbenzene; or the like can be used.

As the aromatic hydrocarbon which can be used for the composite material, the following can be given for example: 2-tert-butyl-9,10-di(2-naphthyl)anthracene (t-BuDNA);

2-tert-butyl-9,10-di(1-naphthyl)anthracene, 9,10-bis(3,5-diphenylphenyl)anthracene (DPPA); 2-tert-butyl-9,10-bis(4-phenylphenyl)anthracene (t-BuDBA); 9,10-di(2-naphthyl)anthracene (DNA); 9,10-diphenylanthracene (DPAnth); 2-tert-butylanthracene (t-BuAnth); 9,10-bis(4-methyl-1-naphthyl)anthracene (DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. As described above, the aromatic hydrocarbon which has a hole mobility of $1 \times 10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, the following can be given as examples: 4,4'-bis(2,2-diphenylvinyl)biphenyl (DPVBi); 9,10-bis[4-(2,2-diphenylvinyl)phenyl]anthracene (DPVPA); and the like.

Alternatively, a composite material which is formed using the above-described high molecular compound such as PVK, PVTPA, PTPDMA, or poly-TPD and the above-described substance with an acceptor property may be used as the hole-injecting layer.

When the composite material described above is used for the hole-injecting layer, various kinds of metal, alloys, electrically conductive compounds or mixture thereof can be used for the anode, regardless of the work function. Therefore, for example, aluminum (Al), silver (Ag), an aluminum alloy (e.g., AlSi), or the like can be used for the anode, in addition to the above-described materials. In addition, an element belonging to Group 1 or Group 2 in the periodic table, which is a low work function material, that is, alkali metal such as lithium (Li) or cesium (Cs), alkaline earth metal such as magnesium (Mg), calcium (Ca), or strontium (Sr), an alloy containing these metals (e.g., MgAg or AlLi), rare earth metal such as europium (Eu) or ytterbium (Yb), an alloy containing such rare earth metal, or the like can be used. A film of alkali metal, alkaline earth metal, or an alloy containing these metals can be formed by a vacuum evaporation method. In addition, a film of an alloy containing alkali metal or alkaline earth metal can be formed by sputtering. Moreover, silver paste or the like can be formed by an ink-jet method.

For the hole-transporting layer, appropriate materials such as N,N'-bis[N-(spiro-9,9'-bifluoren-2-yl)-N-phenylamino]biphenyl (BSPB); 4,4'-bis[N-(1-naphthyl)-N-phenylamino]biphenyl (NPB or α-NPD); N,N'-bis(3-methylphenyl)-N,N'-dipheny-[1,1'-biphenyl]-4,4'-diamine (TPD); 4,4',4"-tris(N,N-diphenylamino)triphenylamine (TDATA); 4,4',4"-tris[N-(3-methylphenyl)-N-phenylamino]triphenylamine (MTDATA); N,N'-bis[4-[bis(3-methylphenyl)amino]phenyl]-N,N'-diphenyl-[1,1'-biphenyl]-4,4'-diamine (DNTPD); 1,3,5-tris[N,N-di(m-tolyl)amino]benzene (m-MTDAB); 4,4',4"-tris(N-carbazolyl)triphenylamine (TCTA); phthalocyanine (H$_2$Pc); copper phthalocyanine (CuPc); or vanadyl phthalocyanine (VOPc) can be used. Although a substance having a hole mobility of $10^{-6}$ cm$^2$/Vs or higher is preferably used for the hole-transporting layer, any substance can be used for the hole-transporting layer as long as the hole-transporting property is higher than an electron-transporting property. Moreover, the hole-transporting layer is not limited to a single-layer structure, and may be formed as a multilayer structure in which two or more layers formed of substances which satisfy the above-described conditions are mixed. The hole-transporting layer can be formed by a vacuum evaporation method, or the like.

As the hole-transporting layer, a high molecular compound such as PVK, PVTPA, PTPDMA, or Poly-TPD can be used. In this case, a solution process such as an ink-jet method or a spin coating method can be used.

Note that the hole-transporting layer which is in contact with the light-emitting layer is preferably formed of a substance having an excitation energy higher than that of the first organic compound which is an emission center substance of the third layer 104. Such a structure makes it possible to suppress energy transfer from the light-emitting layer to the hole-transporting layer and realize high emission efficiency.

In the light-emitting layer, the third layer 104, the second layer 103, and the first layer 102 are stacked from the first electrode 101 side. The first organic compound which serves as an emission center and the second organic compound as a host material which disperses the first organic compound are contained in the first layer 102. The third organic compound which serves as an emission center and the fourth organic compound as a host material which disperses the third organic compound are contained in the second layer 103. The first organic compound which serves as an emission center and the fifth organic compound as a host material which disperses the first organic compound are contained in the third layer 104. Here, the first organic compound in the first layer 102 and the first organic compound in the third layer 104 are the same substance. The second organic compound is formed of a material having an electron-transporting property. The fourth organic compound and the fifth organic compound are formed of a material having a hole-transporting property. Note that, since a host material has a function of dispersing a substance which serves as an emission center, the amount of the host material in each layer is larger than that of the substance which serves as an emission center. Moreover, the proportion of the substance which serves as an emission center in each layer may be set to greater than or equal to 0.1 wt % and less than 50 wt %. The light-emitting layer can be formed by a vacuum evaporation method, and it can be formed by a co-evaporation method in which different materials are evaporated at the same time.

The first organic compound and the third organic compound are each a substance which serves as an emission center, and substances which emit light with different wavelengths from each other are selected for the first organic compound and the third organic compound. Although examples of the substance which serves as an emission center are given below, needless to say, the substance which serves as an emission center is not limited to the substances. As examples of substances which exhibits blue emission (emission wavelength: 400 nm to 480 nm), there are N,N'-bis[4-(9H-carbazol-9-yl)phenyl]-N,N'-diphenylstilbene-4,4'diamine (YGA2S); 4-(9H-carbazol-9-yl)-4'-(10-phenyl-9-anthryl)triphenylamine (YGAPA); 4-(9H-carbazol-9-yl)-4'-(10-phenyl-9-yl)-4'-(9,10-diphenyl-2-anthryl)triphenylamine (2YGAPPA); N,9-diphenyl-N-[4-(10-phenyl-9-anthryl)phenyl]-9H-carbazol-3-amine (PCAPA); 4-(10-phenyl-9-anthryl)-4'-(9-phenyl-9H-carbazol-3-yl)triphenylamine (PCBAPA); perylene; 2,5,8,11-tetra(tert-butyl)perylene (TBP); and the like. In addition, materials which emit phosphorescence, such as bis[2-(4',6'-difluorophenyl)pyridinato-N,C$^{2'}$]iridium(III)tetrakis(1-pyrazolyl)borate (FIr6) and bis[2-(4'6'-difluorophenyl)pyridinato-N,C$^{2'}$]iridium(III)picolinate (FIrpic) can be used. As examples of substances which exhibit blue green light emission (emission wavelength: 480 inn to 520 nm), there are N,N"-(2-tert-butylanthracene-9,10-diyldi-4,1-phenylene)bis[N,N',N'-triphenyl-1,4-phenylenediamine] (DPABPA); N,9-diphenyl-N-[4-(9,10-diphenyl-2-anthryl)phenyl]-9H-carbazole-3-amine (2PCAPPA); N-[4-(9,10-diphenyl-2-anthryl)phenyl]-N,N',N'-triphenyl-1,4-phenyldiamine (2DPAPPA); N,N,N',N',N'',N'',N''',N'''-octaphenyldibenzo[g,p]chrysene-2,7,10,15-tetramine (DBC1); coumarin 30; and the like. In addition, materials which emit phosphorescence, such as bis[2-(3',5'bistrifluoromethylphenyl)pyridinato-N,C$^{2'}$]iridium(III)picolinate (Ir(CF$_3$ ppy)$_2$(pic)); and bis[2-(4',6'-difluorophenyl) pyridinato-N,C$^{2'}$]iridium(III)acetylacetonate (FIr(acac)); can be used. As examples of substances which exhibit yellow light emission (emission wavelength: 540 nm to 600 nm), there are rubrene; 5,12-bis(1,1'-biphenyl-4-yl)-6,11-diphenyltetracene (BPT); 2-{2-[4-(dimethylamino)phenyl]ethenyl}-6-methyl-4H-pyran-4-ylidene)propanedinitrite (DCM1); 2-{2-methyl-6-[2-(2,3,6,7-tetrahydro-1H,5H-benzo[ij]quinolizin-9-yl)ethenyl]-4H-pyran-4-ylidene}propanedinitrile (DCM2); and the like. In addition, materials which emit phosphorescence, such as bis(benzo[h]quinolinato)iridium(III)acetylacetonate (Ir(bzq)$_2$(acac)); bis(2,4-diphenyl-1,3-oxazolato-N,C$^{2'}$)iridium(III)acetylacetonate (Ir(dpo)$_2$(acac)); bis[2-(4'-perfluorophenylphenyl) pyridinato]iridium(III)acetylacetonate (Ir(p-PF-ph)$_2$(acac)); and bis(2-phenylbenzothiazolato-N,C$^{2'}$)iridium(III)acetylacetonate (Ir(bt)$_2$(acac)) can be used. As examples of substances which exhibit red light emission (emission wavelength: 600 nm to 700 nm), there are N,N,N',N'-tetrakis(4-methylphenyl)tetracene-5,11-diamine (p-mPhTD); 7,13-diphenyl-N,N,N',N'-tetrakis(4-methylphenyl)acenaphtho[1,2-a]fluoranthene-3,10-diamine (p-mPhAFD); {2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTI); {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTB); 4-(dicyanomethylene)-2,6-bis[p-(dimethylamino)styryl]-4H-pyran (BisDCM); {2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (BisDCJTM); and the like. In addition, materials which emit phosphorescence, such as bis[2-(2'-benzo[4,5-α]thienyl)pyridinato-N,C$^{3'}$]iridium(III)acetylacetonate (Ir(btp)$_2$(acac)); bis(1-phenylisoquinolinato-N,C$^{2'}$) iridium(III)acetylacetonate (Ir(piq)$_2$(acac)); (acetylacetonato)bis[2,3-bis(4-fluorophenyl)quinoxalinato]iridium(III) (Ir(Fdpq)$_2$(acac)); 2,3,7,8,12,13,17,18-octaethyl-21H,23H-porphyrinplatinum(II) (PtOEP); and tris(1,3-diphenyl-1,3-propanedionato) (monophenanthroline)europium(III) (Eu(DBM)$_3$(Phen)) can be used. Note that, although materials which emit light with a wavelength of 520 nm to 540 nm are not given, it is needless to say that light-emitting materials (including materials which emit phosphorescence in its category) with a wavelength of this range can be used. Substances which have different emission wavelengths can be selected from these substances to be used so that a desired emission color can be obtained from the light-emitting element. As examples of the combinations, when 2YGAPPA is used as the first organic compound and rubrene is used as the third organic compound, white color can be obtained; when 2PCAPPA is used as the first organic compound and BisDCM is used as the third organic compound, white color can be obtained; and when 2YGAPPA is used as the first organic compound and BisDCM is used as the third organic compound, an intermediate color such as purple can be obtained.

Since the recombination region of electrons and holes is located near the interface between the first layer 102 and the second layer 103, energy transfer from an organic compound which emits light with a shorter wavelength to an organic compound which emits light with a longer wavelength occurs in some cases. In such a case, emission from the organic compound which emits light with a longer wavelength inevitably becomes higher, and it is difficult to have balance depending on a combination of colors. At this time, if the substance which emits light with a shorter wavelength is used as the first organic compound and the substance which emits light with a longer wavelength is used as the third organic compound, little light emission from the first organic compound can be obtained by recombination of the electrons penetrating the second layer 103 and holes in the third layer 104. Thus, it becomes easy to balance emission colors of the light-emitting element. Accordingly, a light-emitting element which exhibits a desired emission color and whose degree of deterioration with driving time is improved can be easily obtained. Such a structure is effective especially in adjusting white balance of a white light-emitting element.

As the second organic compound, the fourth organic compound, and the fifth organic compound which are used as a host material which disperses the first organic compound or the third organic compound, the following can be given: metal complexes such as tris(8-quinolinolato)aluminum (Alq), tris(4-methyl-8-quinolinolato)aluminum (Almq$_3$), bis(10-hydroxybenzo[h]quinolinato)beryllium or (BeBq$_2$), or bis(2-methyl-8-quinolinolato)(4-phenylphenolato)aluminum (BAlq), bis(8-quinolinolato)zinc(II) (Znq), bis[2-(2-benzoxazolyl)phenolato]zinc(II) (ZnPBO), and bis[2-(2-hydroxyphenyl)benzothiazolato]zinc(II) (ZnBTZ); heterocyclic compounds such as 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ), 2,2',2''-(1,3,5-benzenetriyl)tris(1-phenyl-1H-benzimidazole) (TPBI), bathophenanthroline (BPhen), and bathocuproine (BCP), and 9-[4-(5-phenyl-1,3,4-oxadiazol-2-yl) phenyl]carbazole (CO11); and aromatic amine compounds such as NPB (or α-NPD), TPD, and BSPB. In addition, condensed polycyclic aromatic compounds such as anthracene derivatives, phenanthrene derivatives; pyrene derivatives, chrysene derivatives, and dibenzo[g,p]chrysene derivatives are given. The following is specifically given as the condensed polycyclic aromatic compound: 9,10-diphenylanthracene (DPAnth); N,N-diphenyl-9-[4-(10-phenyl-9-anthryl)phenyl]-9H-carbazol-3-amine (CzA1PA); 4-(10-phenyl-9-anthryl)triphenylamine (DPhPA); 4-(9H-carbazol-9-yl)-4'-(10-phenyl-9-anthryl)triphenylamine (YGAPA); N,9-diphenyl-N-[4-(10-phenyl-9-anthryl)phenyl]-9H-carbazol-3-amine (PCAPA); N,9-diphenyl-N-{4-[4-(10-phenyl-9-anthryl)phenyl]phenyl}-9H-carbazol-3-amine (PCAPBA); N-9-diphenyl-N-(9,10-diphenyl-2-anthryl)-9H-carbazol-3-amine (2PCAPA); 9-phenyl-9'-[4-(10-phenyl-9-anthryl)phenyl]-3,3'-bi(9H-carbazole) (PCCPA); 4-(10-phenyl-9-anthryl)4'-(9-phenyl-9H-carbazol-3-yl)triphenylamine (PCBAPA); 6,12-dimethoxy-5,11-diphenylchrysene, N,N,N',N',N'',N'',N''',N'''-octaphenyldibenzo[g,p]chrysene-2,7,10,15-tetramine (DBC1); 9-[4-(10-phenyl-9-anthryl)phenyl]-9H-carbazole (CzPA); 3,6-diphenyl-9-[4-(10-phenyl-9-antryl)phenyl]-9H-carbazole (DPCzPA), 9,10-bis(3,5-diphenylphenyl)anthracene (DPPA), 9,10-di(2-naphthyl) anthracene (DNA), 2-tert-butyl-9,10-di(2-naphthyl) anthracene (t-BuDNA), 9,9'-bianthryl (BANT), 9,9'-(stilbene-3,3'-diyl)diphenanthrene (DPNS), 9,9'-(stilbene-4,4'-diyl)diphenanthrene (DPNS2), 3,3',3''-(benzene-1,3,5-triyl)tripyrene (TPB3) and the like. A substance having an energy gap which is larger than that of an emission center substance dispersed by each substance may be selected from these substances and known substances. Moreover, in the case where an emission center substance emits phosphorescence, a substance having a triplet energy (energy difference between a ground state and a triplet excitation state) which is higher than that of the emission center substance may be selected as a host material.

Note that the fourth organic compound and the fifth organic compound are preferably a material having a hole-transporting property, and the second organic compound is preferably a material having an electron-transporting property. As the material having a hole-transporting property, the following can be given: the above-described aromatic amine compounds and condensed polycyclic aromatic compounds such as DPAnth, CzA1PA, DPhPA, YGAPA, PCAPA, PCAPBA, 2PCAPA, and DBC1. As the materials having an electron-transporting property, the following can be given: the above-described heterocyclic compounds and condensed polycyclic aromatic compounds such as CzPA, DPCzPA, DPPA, DNA, t-BuDNA, BANT, DPNS, DPNS2, and TPB3.

Among the above-described substances, the condensed polycyclic compounds particularly have a large band gap and can be preferably used as a host material for dispersing an emission center substance; however, even if the condensed polycyclic aromatic compounds are used as the material having a hole-transporting property, it has ability to transport a certain amount of electrons and deterioration due to penetration of electrons to the hole-transporting layer is increased in some cases. Therefore, in the case where DPAnth, CzA1PA, DPhPA, YGAPA, PCAPA, PCAPBA, 2PCAPA, DBC1, PCBAPA, PCCPA, or the like which is the condensed polycyclic aromatic compound having a hole-transporting property is used as the fourth organic compound, deterioration can be suppressed very effectively by use of the structure of the light-emitting element of this embodiment mode.

In the case of using an electron-transporting layer, it is provided between a light-emitting layer and an electron-injecting layer. As suitable materials, metal complexes having a quinoline skeleton or a benzoquinoline skeleton, such as tris (8-quinolinolato)aluminum (Alq), tris(4-methyl-8-quinolinolato)aluminum (Almq$_3$), bis(10-hydroxybenzo[h]-quinolinato)beryllium (BeBq$_2$), and bis(2-methyl-8-quinolinolato) (4-phenylphenolato)aluminum (BAlq) can be used. Besides these materials, metal complexes having an oxazole ligand or a thiazole ligand, such as bis[2-(2-hydroxyphenyl)benzoxazolato]zinc (Zn(BOX)$_2$) and bis[2-(2-hydroxyphenyl)benzothiazolato]zinc (Zn(BTZ)$_2$), and the like can also be used. Furthermore, beside the metal complexes, 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), bathophenanthroline (BPhen), bathocuproine (BCP), and the like can also be used. Although a substance having an electron mobility of $10^{-6}$ cm$^2$/Vs or higher is preferably used for the electron-transporting layer, any substance can be used for the electron-transporting layer as long as it has an electron-transporting property higher than a hole-transporting property. Moreover, the electron-transporting layer is not limited to a single-layer structure, and may be formed as a multilayer structure in which two or more layers formed of substances which satisfy the above-described conditions are mixed. The electron-transporting layer can be formed by a vacuum evaporation method, or the like.

Alternatively, a high molecular compound can be used for the electron-transporting layer. For example, poly[(9,9-dihexylfluorene-2,7-diyl)-co-(pyridin-3,5-diyl)] (PF-Py), poly [(9,9-dioctylfluorene-2,7-diyl)-co-(2,2'-pyridin-6,6'-diyl)] (PF-BPy), or the like can be used. In this case, a solution process such as an ink-jet method or a spin coating method can be used.

Note that for the electron-transporting layer which is in contact with the light-emitting layer, a substance having excitation energy higher than excitation energy of the first organic compound which is an emission center substance of the third layer 104 is preferably used. Such a structure makes it possible to suppress energy transfer from the light-emitting layer to the electron-transporting layer and realize high emission efficiency.

In the case of using an electron-injecting layer, there is no particular limitation on an electron-injecting material used for forming the electron-injecting layer. Specifically, an alkali metal compound or an alkaline earth metal compound such as calcium fluoride, lithium fluoride, lithium oxide, or lithium chloride, or the like is preferable. Alternatively, a layer in which an electron-transporting material such as tris(8-quinolinolato)aluminum (Alq) or bathocuproine (BCP) is combined with alkali metal or alkaline earth metal such as lithium or magnesium can also be used. The electron-injecting layer is formed in contact with a cathode, and a carrier injection barrier is reduced by use of the electron-injecting layer, so that carriers are efficiently injected into the light-emitting element, which results in reduction of driving voltage. It is more preferable that the electron-injecting layer be formed using the layer in which a substance having an electron-transporting property is combined with alkali metal or alkaline earth metal, because electron injection from the cathode efficiently proceeds. The electron-injecting layer can be formed by a vacuum evaporation method or the like.

Note that the layer 107 containing the organic compound can be formed by either a wet process or a dry process, such as an evaporation method, an ink-jet method, a spin coating method, or a dip coating method, as well as the above-described formation method.

Moreover, when the electron-injecting layer is provided between the cathode and the electron-transporting layer, any of a variety of conductive materials such as Al, Ag, ITO, and indium tin oxide containing silicon or silicon oxide can be used regardless of its work function.

After that, a cathode is formed, so that the light-emitting element is completed. The cathode can be formed using metal, an alloy, a conductive compound, and a mixture thereof each having a low work function (specifically, 3.8 eV or lower). Specifically, metal belonging to Group 1 or 2 of the periodic table, that is, alkali metal such as lithium (Li) or cesium (Cs); alkaline earth metal such as magnesium (Mg), calcium (Ca), or strontium (Sr); or an alloy containing such metal (e.g., MgAg or AlLi); rare earth metal such as europium (Er) or ytterbium (Yb), an alloy containing these, or the like can be given. A film made of alkali metal, alkaline earth metal, or an alloy of them can be formed by a vacuum evaporation method. Further, a film made of an alloy of alkali metal or alkaline earth metal can be formed by a sputtering method. It is also possible to deposit silver paste or the like by an ink-jet method or the like.

Note that a conductive composition containing a conductive high molecule (also referred to as a "conductive polymer") can be used for the anode and the cathode. When a thin film of a conductive composition is formed as the anode or the cathode, the thin film preferably has sheet resistance of less than or equal to 10000 Ω/square and light transmittance of greater than or equal to 70% at a wavelength of 550 nm. Note that resistance of a conductive high molecule which is contained in the thin film is preferably less than or equal to 0.1 Ω·cm.

As a conductive high molecule, a so-called π electron conjugated high molecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly(3-anilinesulfonic acid).

One of the above-described conductive high molecular compounds can be used alone for the anode or the cathode, or an organic resin is added to such a conductive high molecular compound in order to adjust film characteristics such that it can be used as a conductive composition.

As for an organic resin, a thermosetting resin, a thermoplastic resin, or a photocurable resin may be used as long as such a resin is compatible to a conductive high molecule or a resin can be mixed with and dispersed into a conductive high molecule. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 6,6,polyamide 12, or polyamide 11; a fluorine resin such as polyvinylidene fluoride, polyvinyl fluoride, polytetrafluoroethylene, ethylenetetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins can be given.

Furthermore, the conductive high molecule or conductive composition may be doped with an acceptor dopant or a donor dopant so that oxidation-reduction potential of a conjugated electron in the conductive high-molecule or the conductive composition may be changed in order to adjust conductivity of the conductive high molecule or conductive composition.

As the acceptor dopant, a halogen compound, Lewis acid, proton acid, an organic cyano compound, an organometallic compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid, and organic acid such as organic carboxylic acid and organic sulfonic acid can be given. As the organic carboxylic acid and the organic sulfonic acid, carboxylic acid compounds or sulfonic acid compounds can be used. As the organic cyano compound, a compound in which two or more cyano groups are included in a conjugated bond can be used. As an organic cyano compound, a compound having two or more cyano groups in conjugated bonding, for example, tetracyanoethylene, tetracyanoethylene oxide, tetracyanobenzene, tetracyanoquinodimethane, and tetracyanoazanaphthalene are given.

As the donor dopant, alkali metal, alkaline earth metal, a quaternary amine compound, and the like can be given.

A thin film used for the anode or the cathode can be formed by a wet process using a solution in which the conductive high molecule or the conductive composition is dissolved in water or an organic solvent (e.g., an alcohol solvent, a ketone solvent, an ester solvent, a hydrocarbon solvent, or an aromatic solvent):

The solvent for dissolving the conductive high molecule or the conductive composition is not particularly limited. A solvent which dissolves the above-described conductive high molecule and polymer resin compound may be used. For example, the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyletylketone, methylisobutylketone, toluene, and/or the like.

A film of the conductive composition can be formed by a wet process such as an application method, a coating method, a droplet discharge method (also referred to as "an ink-jet method"), or a printing method after the conductive composition is dissolved in a solvent. The solvent may be dried with thermal treatment or may be dried under reduced pressure. In the case where the organic resin is a thermosetting resin, heat treatment may be further performed. In the case where the organic resin is a photocurable resin, light irradiation treatment may be performed.

Note that by change of types of the second electrode 100 and the first electrode 101, the light-emitting element of this embodiment mode has variations. When the second electrode 100 has a light-transmitting property, light is emitted from the second electrode 100 side, whereas when the second electrode 100 has a light-shielding property (reflectivity, in particular) and the first electrode 101 has a light-transmitting property, light is emitted from the first electrode 101 side. Furthermore, when both the second electrode 100 and the first electrode 101 have a light-transmitting property, light can be emitted from both the first electrode side and the second electrode side.

[Embodiment Mode 2]

In this embodiment mode, an example of a light-emitting device manufactured using the light-emitting element described in Embodiment Mode 1 will be described. Note that the light-emitting device of the present invention is not limited to a light-emitting device having a structure described below, and it includes, in its category, all modes in each of which a display portion (e.g., a pixel portion 602 in this embodiment mode) includes the light-emitting element described in Embodiment Mode 1.

Figure 3A:
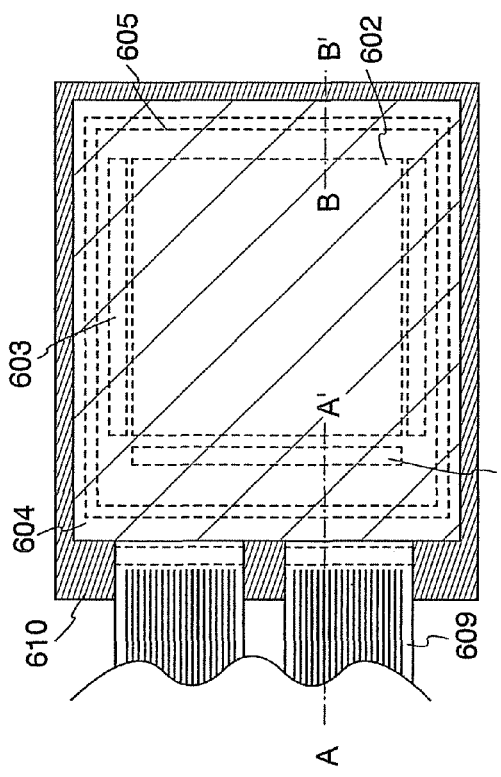
FIG. 3A is a top view of a light-emitting device of the present invention and FIG. 3B is a cross-sectional view of the same.
Figure 3B:
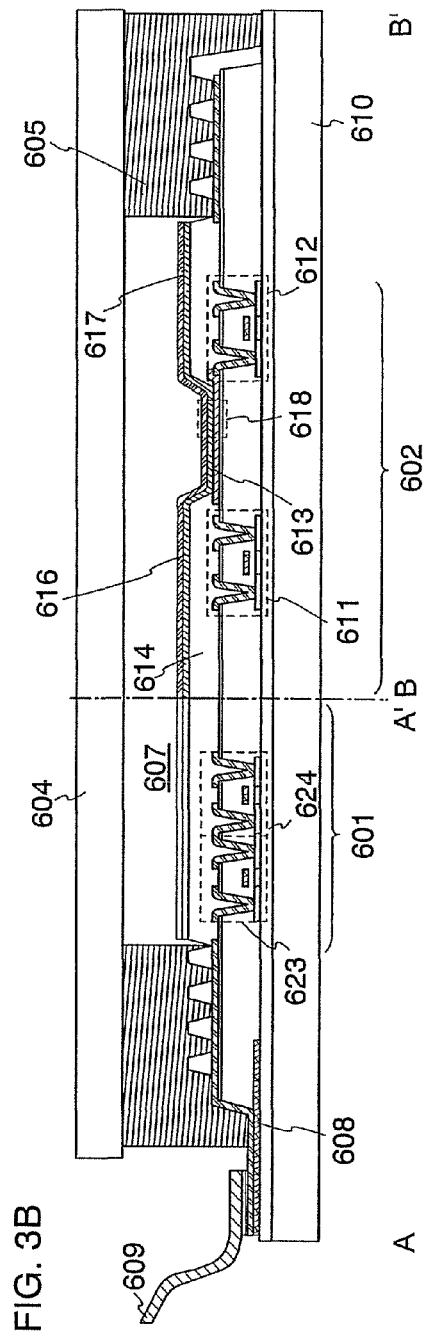

An example of a light-emitting device manufactured using the light-emitting element described in Embodiment Mode 1 will be described with reference to FIGS. 3A and 3B. FIG. 3A is a top view of the light-emitting device, and FIG. 3B is a cross-sectional view taken along A-A' and B-B' in FIG. 3A. This light-emitting device includes a driver circuit portion (a source side driver circuit) 601, a pixel portion 602, and a driver circuit portion (a gate side driver circuit) 603 in order to control the light emission of the light-emitting element. Also, a reference numeral 604 represents a sealing substrate, a reference numeral 605 represents a sealant, and the inside surrounded by the sealant 605 is a space 607.

A lead wiring 608 is a wiring for transmitting a signal to be inputted to the source side driver circuit 601 and the gate side driver circuit 603, and this wiring 608 receives a video signal, a clock signal, a start signal, a reset signal, and the like from a flexible printed circuit (FPC) 609 that is an external input terminal. Although only the FPC is illustrated here, the FPC may be provided with a printed wiring board (PWB). The light-emitting device in this specification includes not only the light-emitting device itself but also the light-emitting device to which an FPC or a PWB is attached.

Next, a cross-sectional structure will be explained with reference to FIG. 3B. The driver circuit portion and the pixel portion are formed over an element substrate 610. Here, the source driver circuit 601 which is the driver circuit portion and one pixel in the pixel portion 602 are shown.

A CMOS circuit in which an n-channel TFT 623 and a p-channel TFT 624 are combined formed for the source side driver circuit 601. The driver circuit may be formed by various CMOS circuits, PMOS circuits, or NMOS circuits. Although a driver integration type in which a driver circuit is formed over the same substrate is described in this embodiment mode, it is not necessarily formed over the same substrate and a driver circuit can be formed not over a substrate but outside a substrate.

The pixel portion 602 has a plurality of pixels, each of which includes a switching TFT 611, a current control TFT 612, a first electrode 613 which is electrically connected to a drain of the current control TFT 612, and a light-emitting element including the first electrode 613, a layer 616 containing an organic compound, and a second electrode 617. Note that an insulator 614 is formed so as to cover an end portion of the first electrode 613. In this embodiment mode, the insulator 614 is formed using a positive photosensitive acrylic resin film.

In order to obtain favorable coverage, the insulator 614 is formed to have a curved surface with curvature at an upper end portion or a lower end portion thereof. For example, in the case of using a positive photosensitive acrylic resin as a material for the insulator 614, the insulator 614 is preferably formed so as to have a curved surface with a curvature radius (0.2 μm to 3 μm) only at the upper end portion thereof. Either a negative type which becomes insoluble in an etchant by light irradiation or a positive type which becomes soluble in an etchant by light irradiation can be used as the insulator 614.

The layer 616 containing the organic compound and the second electrode 617 are formed over the first electrode 613, so that a light-emitting element is formed. As a material used for the first electrode 613 which serves as an anode, metal, an alloy, a conductive compound, and a mixture thereof each having a high work function (specifically, 4.0 eV or higher) is preferably used. Sequentially, a single layer of indium tin oxide (ITO), indium tin oxide containing silicon or silicon oxide, indium oxide containing zinc oxide (ZnO), indium oxide containing tungsten oxide and zinc oxide (IWZO), gold (Au), platinum (Pt), nickel (Ni), tungsten (W), chromium (Cr), molybdenum (Mo), iron (Fe), cobalt (Co), copper (Cu), palladium (Pd), or nitride of a metal material (e.g., titanium nitride), can be used. Moreover, a stacked-layer structure including a film containing titanium nitride and a film containing aluminum as its main component; a three-layer structure including a titanium nitride film, a film containing aluminum as its main component, and a titanium nitride film; or the like can be used. When the stacked-layer structure is used, low wiring resistance, favorable ohmic contact, and a function as an anode are achieved.

The layer 616 containing the organic compound has a similar structure to the layer 107 containing the organic compound described in Embodiment Mode 1. Either low molecular compounds or high molecular compounds (including oligomers and dendrimers) may be employed as the material used for the layer 616 containing the organic compound. Moreover, not only organic compounds but also inorganic compounds can be partially used for the material for forming the layer 616 containing the organic compound. In addition, the layer 616 containing the organic compound is formed by various methods such as an evaporation method using an evaporation mask, an ink-jet method, and a spin coating method.

As a material used for the second electrode 617, which is formed over the layer 616 containing the organic compound and serves as a cathode, a material having a low work function (Al, Mg, Li, Ca, or an alloy or a compound thereof, such as MgAg, MgIn, AlLi, LiF, or $CaF_2$) is preferably used. In the case where light generated in the layer 616 containing the organic compound is transmitted through the second electrode 617, stacked layers of a metal thin film with reduced thickness and a transparent conductive film (ITO, indium oxide containing 2 wt % to 20 wt % of zinc oxide, indium tin oxide containing silicon or silicon oxide, zinc oxide (ZnO); or the like) are preferably used as the second electrode 617.

Here, the light-emitting element includes the first electrode 613, the layer 616 containing the organic compound, and the second electrode 617. The specific structures and materials of the light-emitting element have been described in Embodiment Mode 1, and the repeated description is omitted. The description in Embodiment Mode 1 is to be referred to. Note that the first electrode 613, the layer 616 containing the organic compound, and the second electrode 617 in this embodiment mode correspond to the first electrode 101, the layer 107 containing the organic compound, and the second electrode 100 in Embodiment Mode 1, respectively.

The element substrate 610 in which TFTs for the driver circuit and the pixel portion as described above and the light-emitting element are formed is attached to the sealing substrate 604 with a sealant 605, so that a light-emitting device can be provided, in which the light-emitting element 106 described in Embodiment Mode 1 is provided in the space 607 surrounded by the element substrate 610, the sealing substrate 604, and the sealant 605. Note that the space 607 is filled with a filler. There are cases where the space 607 may be filled with an inert gas (such as nitrogen or argon), or where the space 607 may be filled with the sealant 605.

Note that an epoxy-based resin is preferably used as the sealant 605. It is preferable that the material allow as little moisture and oxygen as possible to penetrate therethrough. As the sealing substrate 604, a plastic substrate formed of FRP (fiberglass:reinforced plastics), PVF (polyvinyl fluoride), a polyester film, polyester, acrylic, or the like can be used besides a glass substrate or a quartz substrate.

As described above, a light-emitting device of the present invention manufactured using the light-emitting element described in Embodiment Mode 1 can be obtained The light-emitting device of the present invention uses the light-emitting element described in Embodiment Mode 1 whose degree of deterioration with accumulation of driving time is reduced, and thus a highly reliable light-emitting device can be obtained. Moreover, the light-emitting element easily realizes an emission color which is intended by a designer, and thus a display device with excellent display quality can be obtained.

Moreover, the light-emitting element described in Embodiment Mode 1 has a structure which is preferable as a white light-emitting element; thus, it can be preferably used for lighting.

Figure 4A:
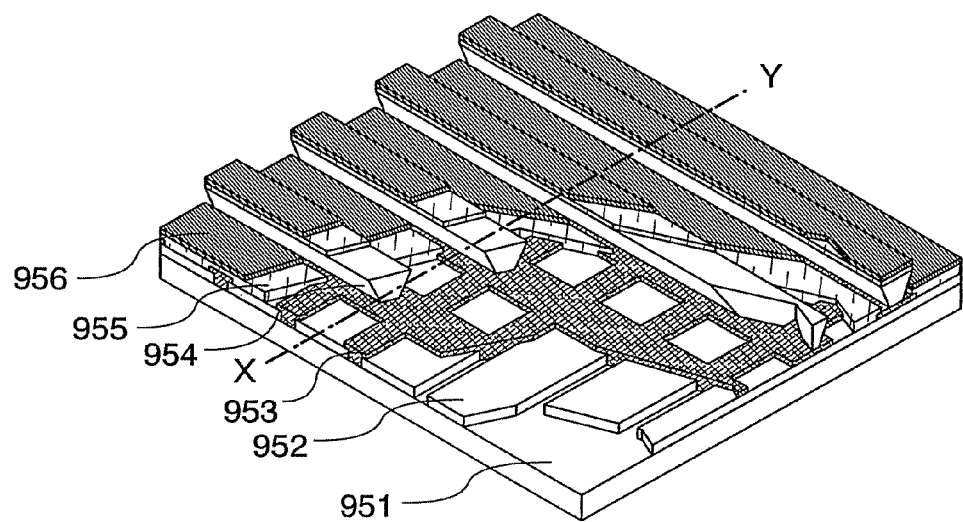
FIG. 4A is a perspective view of a light-emitting device of the present invention and FIG. 4B is a cross-sectional view of the same.
Figure 4B:
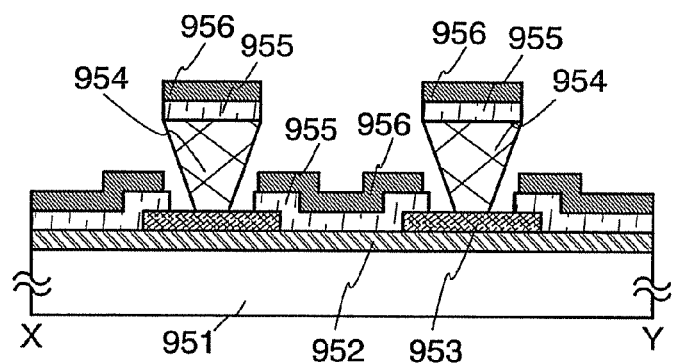

In this embodiment mode, the active light-emitting device in which the driving of the light-emitting element is controlled by a transistor has been described. However, a passive light-emitting device may be adopted. FIGS. 4A and 4B are views of a passive matrix type light-emitting device formed according to the present invention. FIG. 4A is a perspective view of the light-emitting device, and FIG. 4B is a cross-sectional view taken along a line X-Y in FIG. 4A. In FIGS. 4A and 4B, over a substrate 951, a layer 955 containing an organic compound is provided between an electrode 952 and an electrode 956. An end of the electrode 952 is covered with an insulating layer 953. Sidewalls of the partition layer 954 are slanted so that a distance between one of the sidewalls and the other becomes narrower toward a substrate surface. In other words, a cross section of the partition layer 954 in the direction of a narrow side is trapezoidal, and a base (a side which is in contact with the insulating layer 953) is shorter than an upper side (a side which is in contact with the insulating layer 953). The partition layer 954 provided in this manner can prevent the light-emitting element from being defective due to static electricity or the like. Also in a passive matrix light-emitting device, the light-emitting element described in Embodiment Mode 1 is used, whose degree of deterioration with accumulation of driving time is reduced; thus, a highly reliable light-emitting device can be obtained. Moreover, the light-emitting element easily realizes an emission color which is intended by a designer, and thus a display device with excellent display quality can be obtained.

[Embodiment Mode 3]

In this embodiment mode, electronic devices which include, as a part thereof, the light-emitting device described in Embodiment Mode 2 will be described. These electronic devices each have a display portion including the light-emitting element described in Embodiment Mode 1.

As the electronic devices having the light-emitting element described in Embodiment Mode 1, the following is given: cameras such as video cameras or digital cameras, goggle type displays, navigation systems, audio reproducing devices (e.g., car audio components and audio components), computers, game machines, portable information terminals (e.g., mobile computers, cellular phones, portable game machines, and electronic books), and image reproducing devices provided with recording media (specifically, the devices which can reproduce a recording medium such as a digital versatile disc (DVD) and is provided with a display device which is capable of displaying the reproduced images), and the like. Specific examples of these electronic devices are shown in FIGS. 5A to 5D.

Figure 5A:
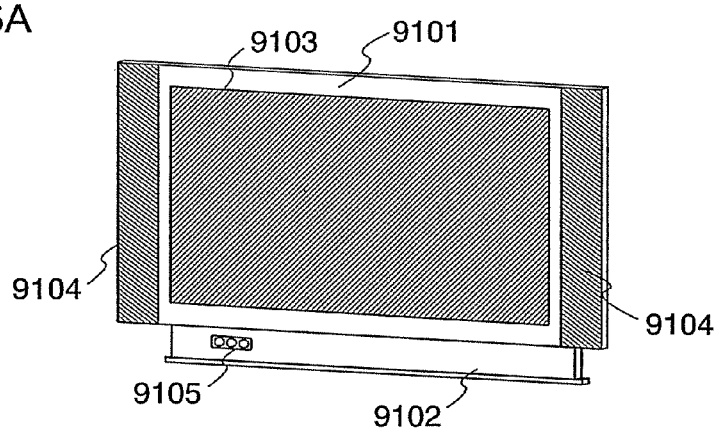
FIGS. 5A to 5D are diagrams showing electronic devices of the present invention.

FIG. 5A shows a television set of the present invention, which includes a housing 9101, a supporting base 9102, a display portion 9103, speaker portions 9104, video input terminals 9105, and the like. In this television set, the display portion 9103 is manufactured using the light-emitting element described in Embodiment Mode 1 as a display element. Moreover, the television set manufactured using the light-emitting element whose degree of deterioration with accumulation of driving time is reduced has high reliability of the display portion 9103, and the television set provided with the display portion 9103 has high reliability. Since the light-emitting element is a light-emitting element whose degree of deterioration is reduced, deterioration compensation function circuits incorporated in the television set can be greatly reduced in size and number.

Figure 5B:
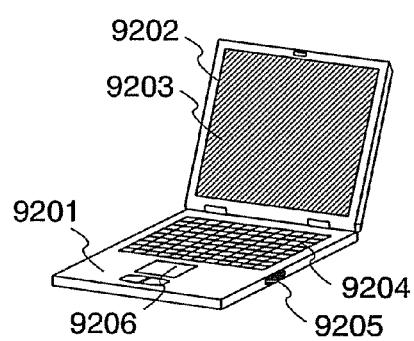

FIG. 5B shows a computer of the present invention, which includes a main body 9201, a housing 9202, a display portion 9203, a keyboard 9204, an external connection port 9205, a pointing device 9206, and the like. In this computer, the display portion 9203 is manufactured using the light-emitting element described in Embodiment Mode 1 as a display element. Moreover, the computer manufactured using the light-emitting element whose degree of deterioration with accumulation of driving time is reduced has high reliability of the display portion 9203, and the computer provided with the display portion 9203 has high reliability. Since the light-emitting element is a light-emitting element whose degree of deterioration is reduced, deterioration compensation function circuits incorporated in the computer can be greatly reduced in size and number; thus, reduction in size and weight of the computer can be achieved.

Figure 5C:
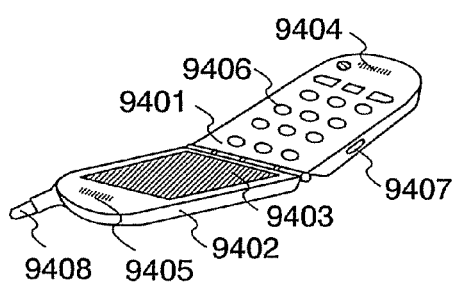

FIG. 5C shows a cellular phone of the present invention, which includes a main body 9401, a housing 9402, a display portion 9403, an audio input portion 9404, an audio output portion 9405, operation keys 9406, an external connecting port 9407, an antenna 9408, and the like. In this cellular phone, the display portion 9403 is manufactured using the light-emitting element described in Embodiment Mode 1 as a display element. Moreover, the cellular phone manufactured using the light-emitting element whose degree of deterioration with accumulation of driving time is reduced has high reliability of the display portion 9403, and the computer provided with the display portion 9403 has high reliability. Since the light-emitting element is a light-emitting element whose degree of deterioration is reduced, deterioration compensation function circuits incorporated in the computer can be greatly reduced in size and number; thus, further reduction in size and weight of the cellular phone can be achieved. The downsized and lightweight cellular phone of the present invention can have appropriate size and weight even when a variety of additional values are added to the cellular phone, and thus the cellular phone of the present invention is suitable for use as a highly functional cellular phone.

Figure 5D:
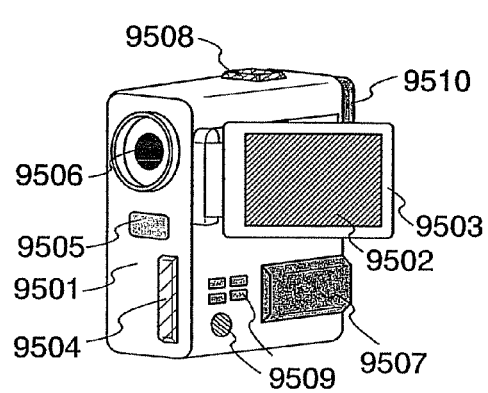

FIG. 5D shows a camera of the present invention, which includes a main body 9501, a display portion 9502, a housing 9503, an external connection port 9504, a remote control receiving portion 9505, an image receiving portion 9506, a battery 9507, an audio input portion 9508, operation keys 9509, an eye piece portion 9510, and the like. In this camera, the display portion 9502 is manufactured using the light-emitting element described in Embodiment Mode 1 as a display element. Moreover, the camera manufactured using the light-emitting element whose degree of deterioration with accumulation of driving time is reduced has high reliability of the display portion 9502, and the camera provided with the display portion 9502 has high reliability. Since the light-emitting element is a light-emitting element whose degree of deterioration is reduced, deterioration compensation function circuits incorporated in the camera can be greatly reduced in size and number; thus, reduction in size and weight of the camera can be achieved.

As described above, the application range of the light-emitting device manufactured using the light-emitting element described in Embodiment Mode 1 is so wide that the light-emitting device can be applied to electronic devices of various fields. Moreover, a display portion manufactured using the light-emitting element whose degree of deterioration with accumulation of driving time is reduced has high reliability, and electronic devices each having the display portion can have high reliability.

In addition, the light-emitting device of the present invention can also be used for a lighting device. One mode of application of the light-emitting element described in Embodiment mode 1 to a lighting device will be described with reference to FIG. 6.

Figure 6:
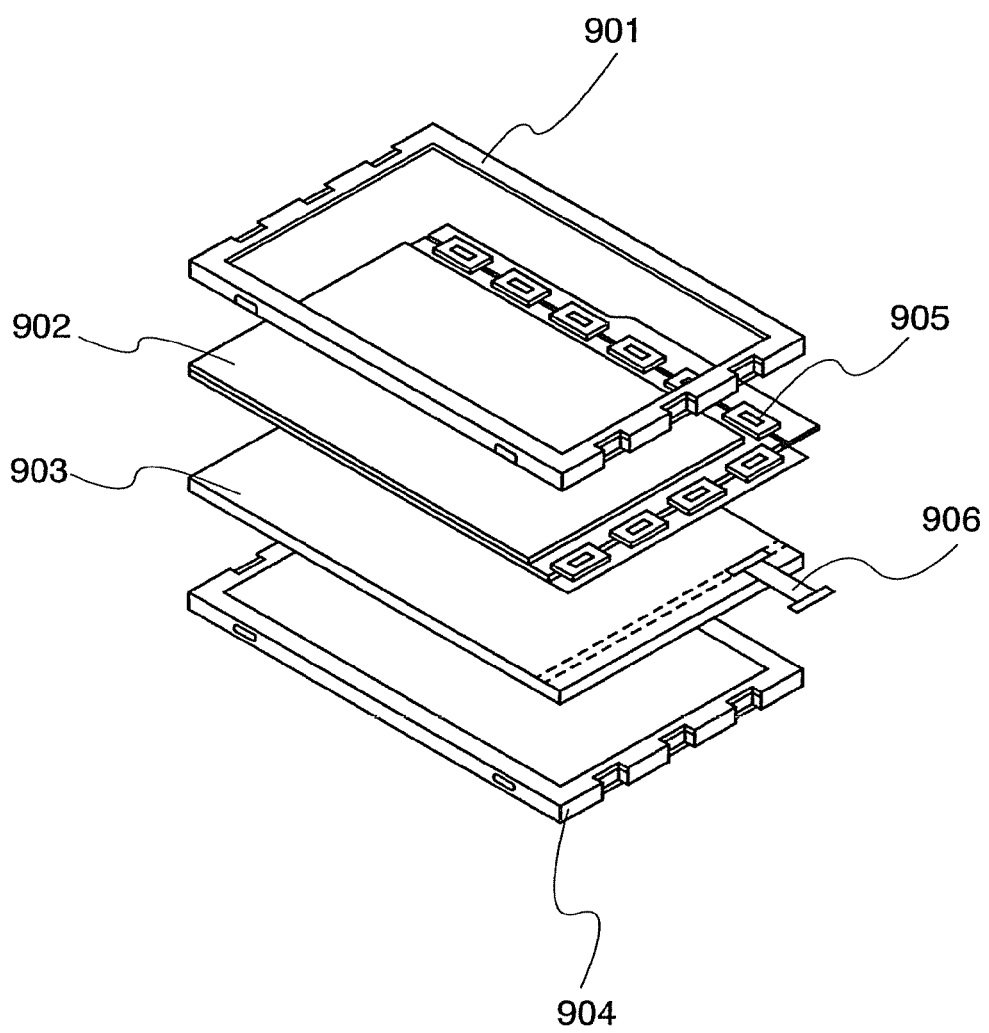
FIG. 6 is a diagram showing an electronic device of the present invention.

FIG. 6 shows an example of a liquid crystal display device in which the light-emitting element described in Embodiment Mode 1 is applied as a backlight. The liquid crystal display device shown in FIG. 6 includes a housing 901, a liquid crystal layer 902, a backlight unit 903, and a housing 904. The liquid crystal layer 902 is connected to a driver IC 905. In addition, the backlight unit 903 is formed using the light-emitting element described in Embodiment Mode 1, and current is supplied thereto through a terminal 906.

It is desirable that the backlight unit 903 of the liquid crystal exhibit an emission color which becomes suitable light when the light is transmitted through a color filter provided for each pixel and seen by eyes of people who actually watch the liquid crystal display device. That is, although a film which transmits light of red, blue, or green is normally provided for each pixel as a color filter, transmittance of light is different depending on the material of the color filter and human vision differs depending on the color, and thus the backlight desirably has desired luminance in a wavelength component of each of red, blue, and green. In this regard, color balance of the light-emitting element described in Embodiment Mode 1 is easily adjusted, and thus the light-emitting element can be used as the backlight unit 903 of the liquid crystal very preferably.

Note that only one light-emitting element described in Embodiment Mode 1 or a plurality of light-emitting elements described in Embodiment Mode 1 may be used for the backlight unit 903.

As described above, the light-emitting element described in Embodiment Mode 1 can be applied to the backlight of the liquid crystal display device. The area of the backlight can be increased, and thus the area of the liquid crystal display device can be increased. When the backlight is manufactured using the light-emitting element whose degree of deterioration with accumulation of driving time is small, the backlight with high reliability can be obtained. Furthermore, the backlight is thin and a desired emission color can be easily obtained; thus, reduction in thickness of the liquid crystal display device and improvement in quality of images become possible.

Figure 7:
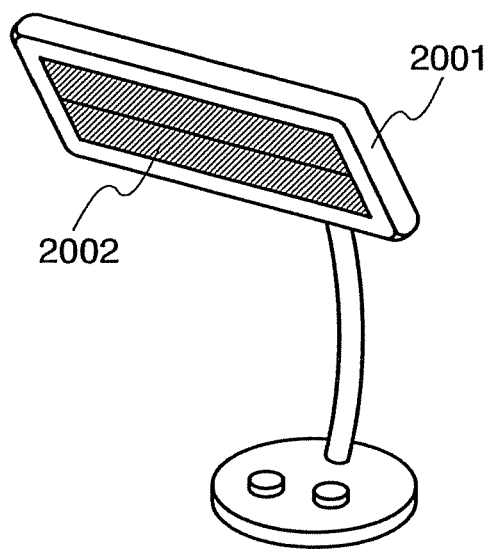
FIG. 7 is a diagram showing an electronic device of the present invention.

FIG. 7 shows an example in which the light-emitting element described in Embodiment Mode 1 is used for a desk lamp which is a lighting device. The desk lamp shown in FIG. 7 includes a chassis 2001 and a light source 2002, and the light-emitting element described in Embodiment Mode 1 is used for the light source 2002. The light source 2002 may be formed from one light-emitting element or a plurality of light-emitting elements described above. Alternatively, the light source 2002 may be formed from plural types of light-emitting elements which emit different colors. As described above, the light source 2002 can be manufactured using the light-emitting element described in Embodiment Mode 1. The light source 2002 manufactured using the light-emitting element whose degree of deterioration with accumulation of driving time is small has high reliability, and thus the desk lamp provided with the light source 2002 also has high reliability. Moreover, since color balance of the light-emitting element described in Embodiment Mode 1 is easily adjusted, a desk lamp which has emission colors for purposes, for example, eye-friendly emission colors, can be easily provided.

Figure 8:
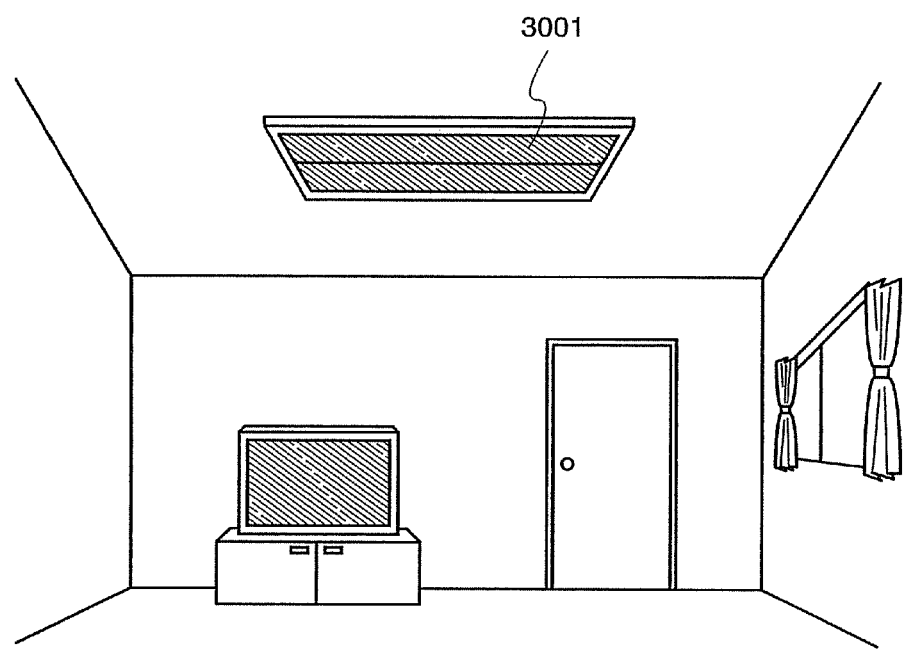
FIG. 8 is a diagram showing an electronic device of the present invention.

FIG. 8 shows an example in which the light-emitting element described in Embodiment Mode 1 is used for an indoor lighting device 3001. The lighting device 3001 may be formed from one light-emitting element or a plurality of light-emitting elements described above. Alternatively, the lighting device 3001 may be formed from plural types of light-emitting elements which emit different colors. As described above, the lighting device 3001 can be manufactured using the light-emitting element described in Embodiment Mode 1. The area of the lighting device 3001 formed using the light-emitting element can be increased, and thus it can be used as a large area lighting device. The lighting device 3001 manufactured using the light-emitting element having preferable emission efficiency can be a lighting device which is thin and consumes less power. Moreover, the lighting device 3001 manufactured using the light-emitting element whose degree of deterioration with accumulation of driving time is small can be a lighting device having high reliability. Furthermore, since color balance of the light-emitting element described in Embodiment Mode 1 is easily adjusted, various emission colors from warm colors to cold colors can be easily provided. Accordingly, a lighting device which has emission colors for purposes, for example, using a warm color for a living room and using a color with a good color rendering property for a kitchen or a dining room, can be easily provided.

[Embodiment 1]

In this embodiment, a manufacturing method and element characteristics of the light-emitting element described in Embodiment Mode 1 will be described. Note that element structures of light-emitting elements 1 to 6 are shown in Table 1.

TABLE 1

| | Light-Emitting Element | | | | | |
|---|---|---|---|---|---|---|
| | 1 | 2 | 3 (CE) | 4 | 5 | 6 (CE) |
| 2nd Electrode | Al 200 nm | | | | | |
| Electron-Injecting Layer | LiF 1 nm | | | | | |
| Electron-Transporting Layer | Bphen 20 nm Alq 10 nm | | | | | |
| 1st Layer | CzPA:2YGAPPA (1:0.05) 20 nm | | | | | |
| 2nd Layer | YGAPA:rubrene (1:0.0025) | | | PCCPA:rubrene (1:0.0025) | | |
| | 10 nm | | | | | |
| 3rd Layer | DPAnth:2YGAPPA (1:0.1) | | — | DPAnth:2YGAPPA (1:0.1) | | — |
| | 10 nm | 20 nm | | 10 nm | 20 nm | |
| Hole-Transporting Layer | NPB 10 nm | | | | | |
| Hole-Injecting Layer | NPB:MoOx (4:1) 50 nm | | | | | |
| 1st Electrode | ITSO 110 nm | | | | | |

(Light-Emitting Element 1)

First, silicon or indium tin oxide containing silicon oxide was deposited to a thickness of 110 nm over a glass substrate by a sputtering method to form a first electrode (electrode area: 2 mm×2 mm).

Next, the substrate over which the first electrode had been formed was fixed to a substrate holder provided in a vacuum evaporation apparatus so that a surface of the substrate over which the first electrode had been formed faced downward, and the pressure was reduced to about $10^{-4}$ Pa, and then 4,4'-bis[N-(1-naphthyl)-N-phenylamino]biphenyl (NPB)

and molybdenum(VI) oxide were co-evaporated, whereby a layer containing a composite material in which an organic compound and an inorganic compound were combined was formed. The thickness of the layer was 50 nm and the weight ratio between NPB and molybdenum(VI) oxide was adjusted to be 4:1 (=NPB:molybdenum oxide). Note that the co-evaporation method is an evaporation method in which evaporation is carried out from a plurality of evaporation sources at the same time in one treatment chamber.

Subsequently, NPB was deposited to a thickness of 10 nm by an evaporation method using resistance heating to form a hole-transporting layer.

After that, 9,10-diphenylanthracene (DPAnth) and 4-(9H-carbazol-9-yl)-4'-(9,10-diphenyl-2-anthryl)triphenylamine (2YGAPPA) were co-evaporated to form a third layer with a thickness of 10 nm. Here, the weight ratio between DPAnth and 2YGAPPA was adjusted to be 1:0.1 (=DPAnth:2YGAPPA).

Then, 4-(9H-carbazol-9-yl)-4'-(10-phenyl-9-anthryl)triphenylamine (YGAPA) and rubrene were co-evaporated to form a second layer with a thickness of 10 nm. Here, the weight ratio between YGAPA and rubrene was adjusted to be 1:0.0025 (=YGAPA:rubrene).

Furthermore, 9-[4-(10-phenyl-9-anthryl)phenyl]-9H-carbazole (CzPA) and 2YGAPPA were co-evaporated to form a first layer with a thickness of 20 nm. Here, the weight ratio between CzPA and 2YGAPPA was adjusted to be 1:0.05 (=CzPA:2YGAPPA).

After that, by an evaporation method using resistance heating, tris(8-quinolinolato)aluminum (Alq) was deposited to a thickness of 10 nm, and then bathophenanthroline (BPhen) was deposited to a thickness of 20 nm to form an electron-transporting layer.

Then, in a similar manner, by an evaporation method using resistance heating, lithium fluoride (LiF) was deposited to a thickness of about 1 nm to form an electron-injecting layer. Finally, aluminum was deposited to a thickness of 200 nm to form a second electrode. Accordingly, the light-emitting element 1 was manufactured.

The light-emitting element 1 obtained through the above-described steps was sealed in a glove box containing a nitrogen atmosphere so as not to be exposed to atmospheric air. Then, the operation characteristics of the light-emitting element 1 were measured. The measurement was carried out at room temperature (under an atmosphere maintaining 25° C.).

Figure 9:
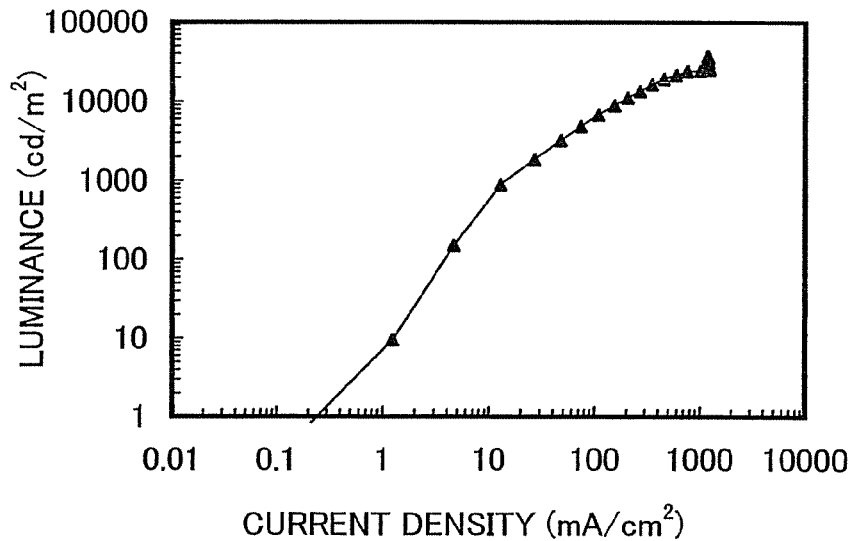
FIG. 9 is a graph showing current density-luminance characteristics of a light-emitting element 1.
Figure 10:
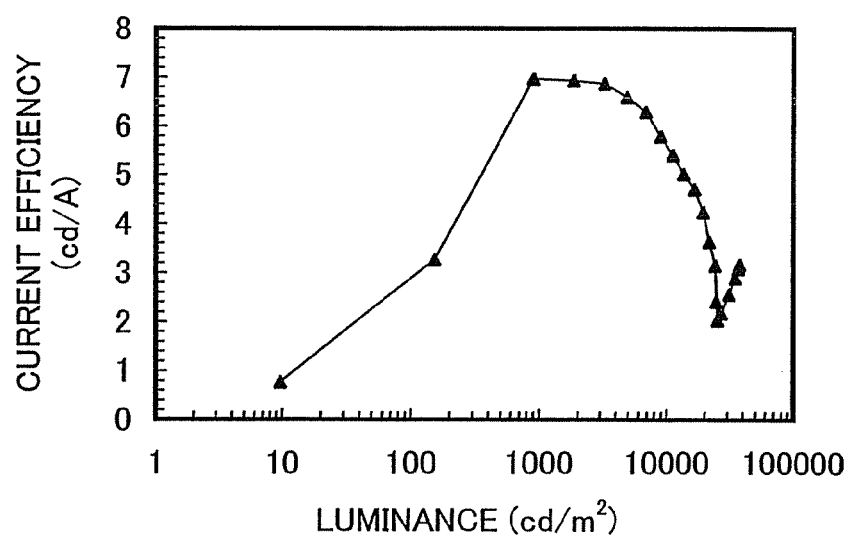
FIG. 10 is a graph showing luminance-current efficiency characteristics of a light-emitting element 1.
Figure 11:
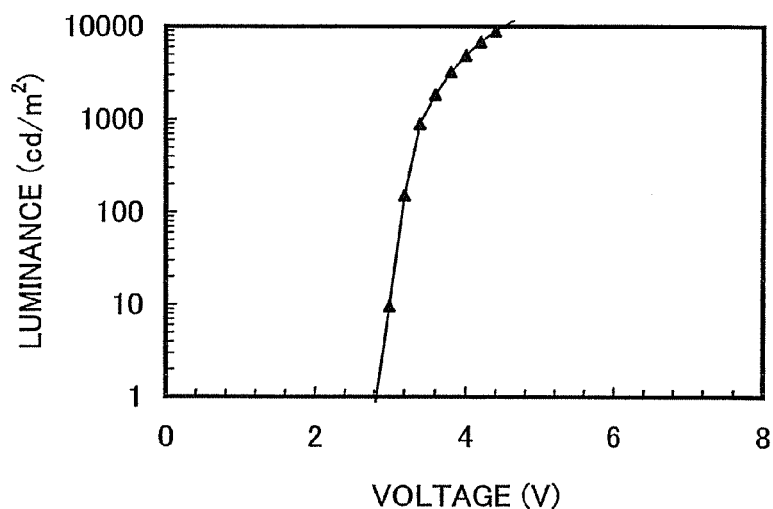
FIG. 11 is a graph showing voltage-luminance characteristics of a light-emitting element 1.
Figure 12:
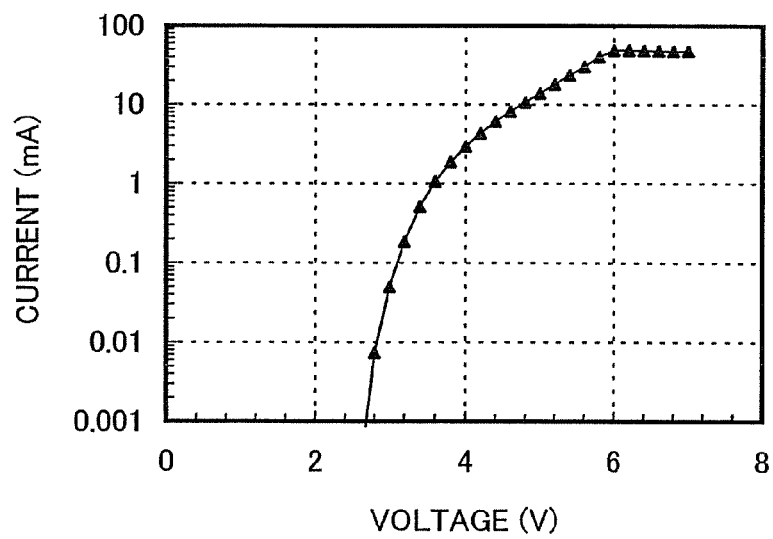
FIG. 12 is a graph showing voltage-current characteristics of a light-emitting element 1.
Figure 13:
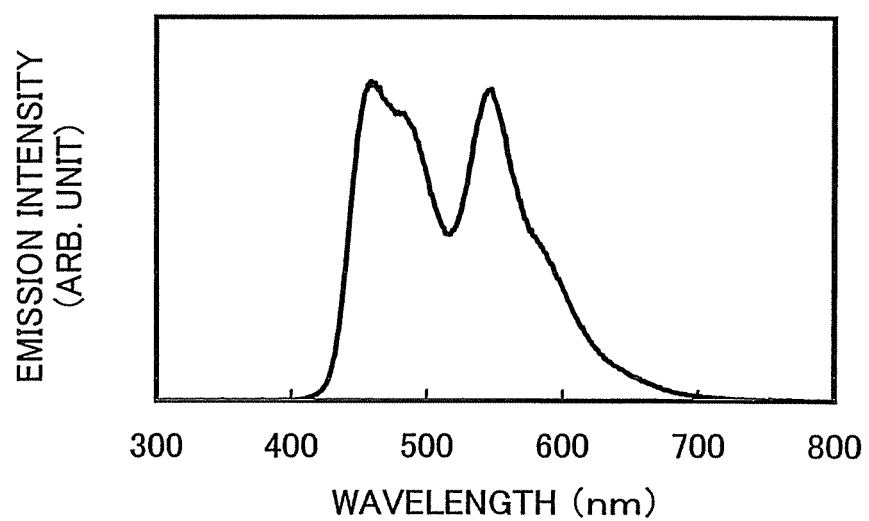
FIG. 13 is a graph showing an emission spectrum of a light-emitting element 1.

FIG. 9 shows current density-luminance characteristics of the light-emitting element 1. FIG. 10 shows luminance-current efficiency characteristics. FIG. 11 shows voltage-luminance characteristics. FIG. 12 shows voltage-current characteristics. FIG. 13 shows an emission spectrum upon feeding a current of 1 mA to the light-emitting element 1.

In the light-emitting element 1, 2YGAPPA which is an emission center substance of the first layer and the third layer emits blue light and rubrene which is an emission center substance of the second layer emits yellow light. That is, according to FIG. 13, it is found that light emission having a peak near 462 nm is light emission of 2YGAPPA; light emission having a peak near 549 nm is light emission of rubrene; and as for the light-emitting element 1, the intensity of the light emission of 2YGAPPA on the shorter wavelength side and the intensity of the light emission of rubrene on the longer wavelength side are almost the same. In a conventional structure, light emission on the longer wavelength side is higher due to influence of energy transfer and it is difficult to balance emission colors. However, with use of the structure of the present invention, like the light-emitting element 1 described above, the emission intensity on the shorter wavelength side and the emission intensity on the longer wavelength side can be made equal, and it becomes possible to easily adjust balance of emission colors. Note that the CIE chromaticity coordinate of the light-emitting element 1 at a luminance of 900 cd/m$^2$ was (x=0.26, y=0.35), and the emission color was white.

(Light-Emitting Element 2)

First, silicon or indium tin oxide containing silicon oxide was deposited to a thickness of 110 nm over a glass substrate by a sputtering method to form a first electrode (electrode area: 2 mm×2 mm).

Next, the substrate over which the first electrode had been formed was fixed to a substrate holder provided in a vacuum evaporation apparatus so that a surface of the substrate over which the first electrode had been formed faced downward, and the pressure was reduced to about 10$^{-4}$ Pa, and then NPB and molybdenum(VI) oxide were co-evaporated, whereby a layer containing a composite material in which an organic compound and an inorganic compound were combined was formed. The thickness of the layer was 50 nm and the weight ratio between NPB and molybdenum(VI) oxide was adjusted to be 4:1 (=NPB:molybdenum oxide). Note that the co-evaporation method is an evaporation method in which evaporation is carried out from a plurality of evaporation sources at the same time in one treatment chamber.

Subsequently, NPB was deposited to a thickness of 10 nm by an evaporation method using resistance heating to form a hole-transporting layer.

After that, DPAnth and 2YGAPPA were co-evaporated to form a third layer with a thickness of 20 nm. Here, the weight ratio between DPAnth and 2YGAPPA was adjusted to be 1:0.1 (=DPAnth:2YGAPPA).

Then, YGAPA and rubrene were co-evaporated to form a second layer with a thickness of 10 nm. Here, the weight ratio between YGAPA and rubrene was adjusted to be 1:0.0025 (=YGAPA:rubrene).

Furthermore, CzPA and 2YGAPPA were co-evaporated to form a first layer with a thickness of 20 nm. Here, the weight ratio between CzPA and 2YGAPPA was adjusted to be 1:0.05 (=CzPA:2YGAPPA).

After that, by an evaporation method using resistance heating, Alq was deposited to a thickness of 10 nm, and then BPhen was deposited to a thickness of 20 nm to form an electron-transporting layer.

Then, in a similar manner, by an evaporation method using resistance heating, lithium fluoride (LiF) was deposited to a thickness of about 1 nm to form an electron-injecting layer. Finally, aluminum was deposited to a thickness of 200 nm to form a second electrode. Accordingly, the light-emitting element 2 was manufactured.

The light-emitting element 2 obtained through the above-described steps was sealed in a glove box containing a nitrogen atmosphere so as not to be exposed to atmospheric air. Then, the operation characteristics of the light-emitting element 2 were measured. The measurement was carried out at room temperature (under an atmosphere maintaining 25° C.).

Figure 14:
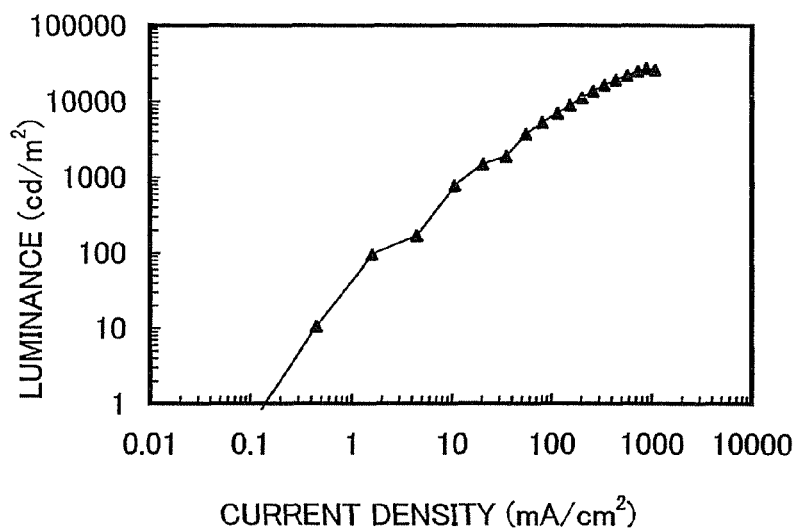
FIG. 14 is a graph showing current density-luminance characteristics of a light-emitting element 2.
Figure 15:
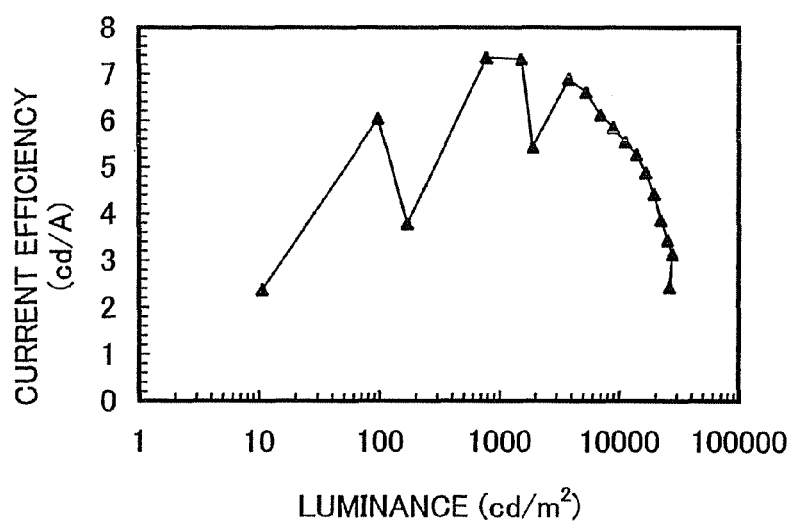
FIG. 15 is a graph showing luminance-current efficiency characteristics of a light-emitting element 2.
Figure 16:
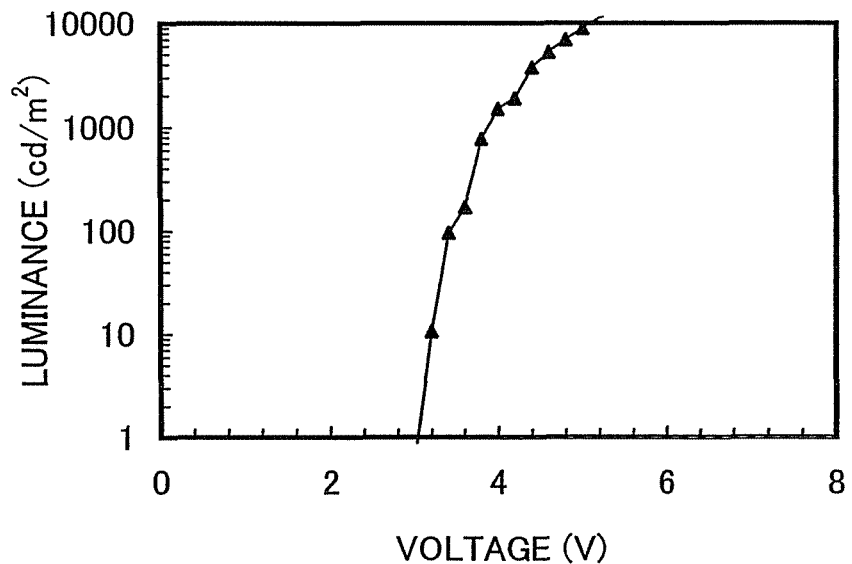
FIG. 16 is a graph showing voltage-luminance characteristics of a light-emitting element 2.
Figure 17:
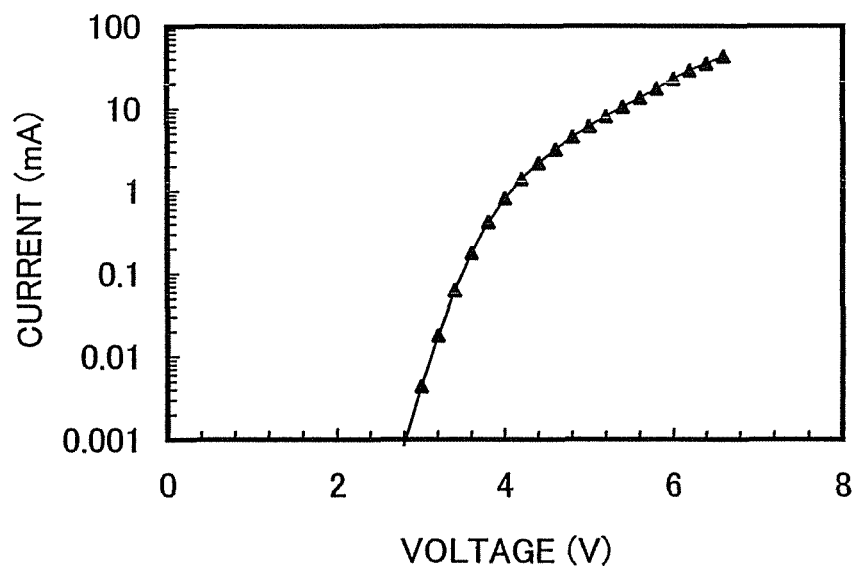
FIG. 17 is a graph showing voltage-current characteristics of a light-emitting element 2.
Figure 18:
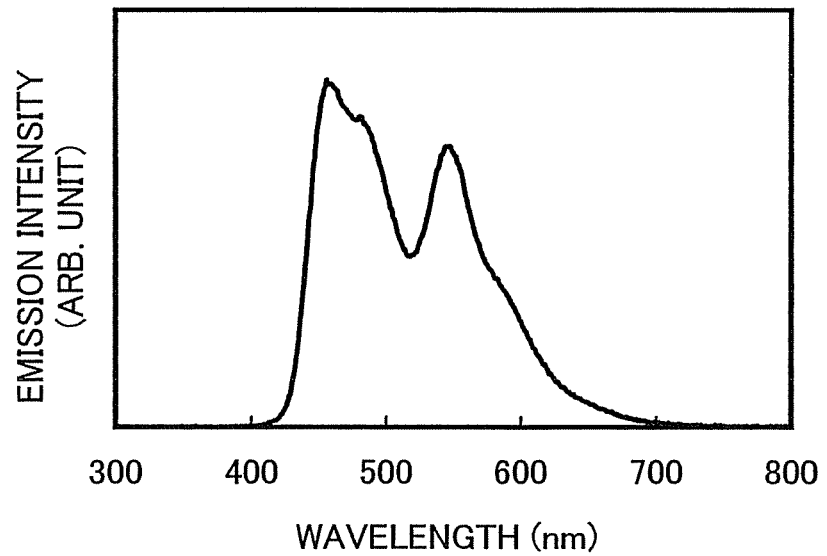
FIG. 18 is a graph showing an emission spectrum of a light-emitting element 2.

FIG. 14 shows current density-luminance characteristics of the light-emitting element 2. FIG. 15 shows luminance-current efficiency characteristics. FIG. 16 shows voltage-luminance characteristics. FIG. 17 shows voltage-current characteristics. FIG. 18 shows an emission spectrum upon feeding a current of 1 mA to the light-emitting element 2.

In the light-emitting element 2, 2YGAPPA which is an emission center substance of the first layer and the third layer emits blue light and rubrene which is an emission center substance of the second layer emits yellow light. That is, according to FIG. 18, it is found that light emission having a peak near 462 nm is light emission of 2YGAPPA; light emission having a peak near 549 nm is light emission of rubrene; and as for the light-emitting element 2, the intensity of the light emission of 2YGAPPA on the shorter wavelength side is higher than the intensity of the light emission of rubrene on the longer wavelength side. In a conventional structure, light emission on the longer wavelength side is higher due to influence of energy transfer and it is difficult to balance emission colors. However, with use of the structure of the present invention, like the light-emitting element 2 described above, the emission intensity on the shorter wavelength side can be higher than the emission intensity on the longer wavelength side, and it becomes possible to easily adjust balance of emission colors. Note that the CIE chromaticity coordinate of the light-emitting element 2 at a luminance of 780 cd/m$^2$ was (x=0.26, y=0.34), and the emission color was white.

(Light-Emitting Element 3)

As the light-emitting element 3, which is used as a comparative example (CE) of the light-emitting element 1 and the light-emitting element 2, a light-emitting element in which a third layer was not formed, that is, a light-emitting element having the structure of the light-emitting element 115 described as the conventional example in Embodiment Mode 1 was manufactured. First, silicon or indium tin oxide containing silicon oxide was deposited to a thickness of 110 nm over a glass substrate by a sputtering method to form a first electrode (electrode area: 2 mm×2 mm).

Next, the substrate over which the first electrode had been formed was fixed to a substrate holder provided in a vacuum evaporation apparatus so that a surface of the substrate over which the first electrode had been formed faced downward, and the pressure was reduced to about $10^{-4}$ Pa, and then NPB and molybdenum(VI) oxide were co-evaporated, whereby a layer containing a composite material in which an organic compound and an inorganic compound were combined was formed. The thickness of the layer was 50 nm and the weight ratio between NPB and molybdenum(VI) oxide was adjusted to be 4:1 (=NPB:molybdenum oxide). Note that the co-evaporation method is an evaporation method in which evaporation is carried out from a plurality of evaporation sources at the same time in one treatment chamber.

Subsequently, NPB was deposited to a thickness of 10 nm by an evaporation method using resistance heating to form a hole-transporting layer.

Then, YGAPA and rubrene were co-evaporated to form a second layer with a thickness of 10 nm. Here, the weight ratio between YGAPA and rubrene was adjusted to be 1:0.0025 (=YGAPA:rubrene).

Furthermore, CzPA and 2YGAPPA were co-evaporated to form a first layer with a thickness of 20 nm. Here, the weight ratio between CzPA and 2YGAPPA was adjusted to be 1:0.05 (=CzPA:2YGAPPA).

After that, by an evaporation method using resistance heating, Alq was deposited to a thickness of 10 nm, and then BPhen was deposited to a thickness of 20 nm to form an electron-transporting layer.

Then, in a similar manner, by an evaporation method using resistance heating, lithium fluoride (LiF) was deposited to a thickness of about 1 nm to form an electron-injecting layer. Finally, aluminum was deposited to a thickness of 200 nm to form a second electrode. Accordingly, the light-emitting element 3 was manufactured.

The light-emitting element 3 obtained through the above-described steps was sealed in a glove box containing a nitrogen atmosphere so as not to be exposed to atmospheric air.

Then, the operation characteristics of the light-emitting element 3 were measured. The measurement was carried out at room temperature (under an atmosphere maintaining 25° C.).

Figure 19:
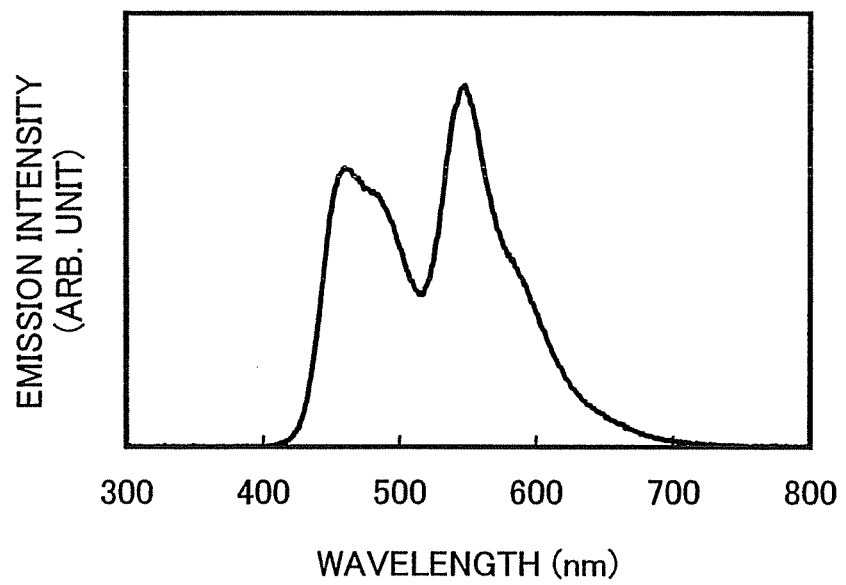
FIG. 19 is a graph showing an emission spectrum of a light-emitting element 3.

FIG. 19 shows an emission spectrum of the light-emitting element 3. In the light-emitting element 3, 2YGAPPA which is an emission center substance of the first layer emits blue light and rubrene which is an emission center substance of the second layer emits yellow light. That is, according to FIG. 19, it is found that light emission having a peak near 465 nm is light emission of 2YGAPPA; light emission having a peak near 549 nm is light emission of rubrene; and as for the light-emitting element 3, the intensity of the light emission of rubrene on the longer wavelength side is higher than the intensity of the light emission of 2YGAPPA on the shorter wavelength side. Here, with reference to the structure of the second layer, YGAPA and rubrene was co-evaporated at a ratio of 1:0.0025, and this is the lowest level of the concentration of rubrene which can be controlled by the inventor at the moment. In other words, it is found that even if the concentration of rubrene is made as low as possible, light emission of rubrene having an emission color on the longer wavelength side is higher, and it is difficult to control emission colors in a conventional structure. Note that the CIE chromaticity coordinate of the light-emitting element 3 at a luminance of 1740 cd/m$^2$ was (x=0.28, y=0.38), and the emission color was blue white.

Figure 20:
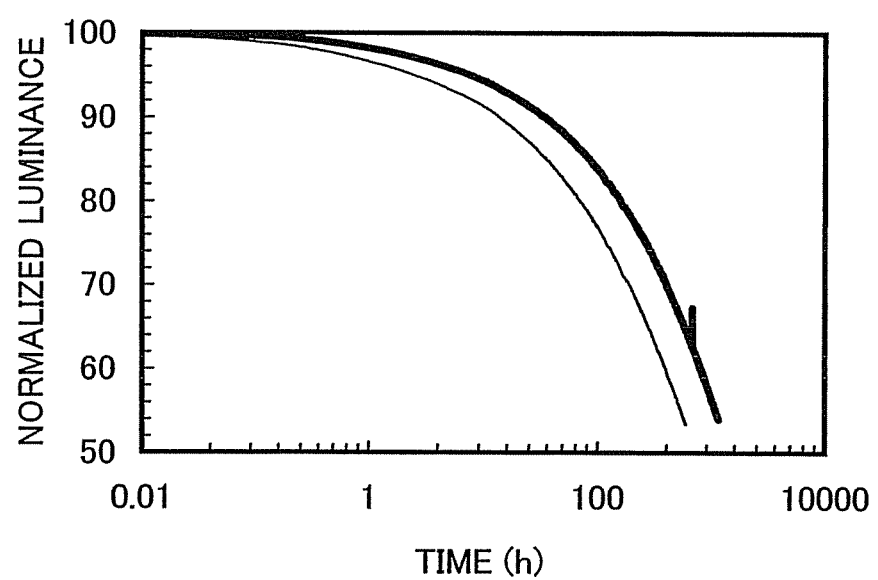
FIG. 20 is a graph showing time dependence of normalized luminance of a light-emitting element 1 and a light-emitting element 3.

Next, evaluation results on reliability are shown. FIG. 20 shows time dependence of normalized luminance of the light-emitting element 1 and the light-emitting element 3 when the light-emitting element 1 and the light-emitting element 3 were driven at an initial luminance of 1000 cd/m$^2$ and constant current density. Note that, in the graph, the thick line represents the result of the light-emitting element 1 and the thin line represents the result of the light-emitting element 3. Also according to FIG. 20, it is found that decrease in luminance of the light-emitting element 1 is suppressed more than that of the light-emitting element 3 which is the comparative example (CE). Note that the luminance of the light-emitting element 3 decreased to 53% in 590 hours, whereas the luminance of the light-emitting element 1 was 54% in 1100 hours, which means the life of the light-emitting element 1 is twice as long as the light-emitting element 3.

(Light-Emitting Element 4)

First, silicon or indium tin oxide containing silicon oxide was deposited to a thickness of 110 nm over a glass substrate by a sputtering method to form a first electrode (electrode area: 2 mm×2 mm).

Next, the substrate over which the first electrode had been formed was fixed to a substrate holder provided in a vacuum evaporation apparatus so that a surface of the substrate over which the first electrode was formed faced downward, and the pressure had been reduced to about $10^{-4}$ Pa, and then NPB and molybdenum(VI) oxide were co-evaporated, whereby a layer containing a composite material in which an organic compound and an inorganic compound were combined was formed. The thickness of the layer was 50 nm and the weight ratio between NPB and molybdenum(VI) oxide was adjusted to be 4:1 (=NPB:molybdenum oxide). Note that the co-evaporation method is an evaporation method in which evaporation is carried out from a plurality of evaporation sources at the same time in one treatment chamber.

Subsequently, NPB was deposited to a thickness of 10 nm by an evaporation method using resistance heating to form a hole-transporting layer.

After that, DPAnth and 2YGAPPA were co-evaporated to form a third layer with a thickness of 10 nm. Here, the weight ratio between DPAnth and 2YGAPPA was adjusted to be 1:0.1 (=DPAnth:2YGAPPA).

Then, 9-phenyl-9'-[4-(10-phenyl-9-anthryl)phenyl]-3,3'-bi(9H-carbazole) (PCCPA) and rubrene were co-evaporated to form a second layer with a thickness of 10 nm. Here, the weight ratio between PCCPA and rubrene was adjusted to be 1:0.0025 (=PCCPA:rubrene).

Furthermore, CzPA and 2YGAPPA were co-evaporated to form a first layer with a thickness of 20 nm. Here, the weight ratio between CzPA and 2YGAPPA was adjusted to be 1:0.05 (=CzPA:2YGAPPA).

After that, by an evaporation method using resistance heating, Alq was deposited to a thickness of 10 nm, and then BPhen was deposited to a thickness of 20 nm to form an electron-transporting layer.

Then, in a similar manner, by an evaporation method using resistance heating, lithium fluoride (LiF) was deposited to a thickness of about 1 nm to form an electron-injecting layer. Finally, aluminum was deposited to a thickness of 200 nm to form a second electrode. Accordingly, the light-emitting element 4 was manufactured.

The light-emitting element 4 obtained through the above-described steps was sealed in a glove box containing a nitrogen atmosphere so as not to be exposed to atmospheric air. Then, the operation characteristics of the light-emitting element 4 were measured. The measurement was carried out at room temperature (under an atmosphere maintaining 25° C.).

Figure 21:
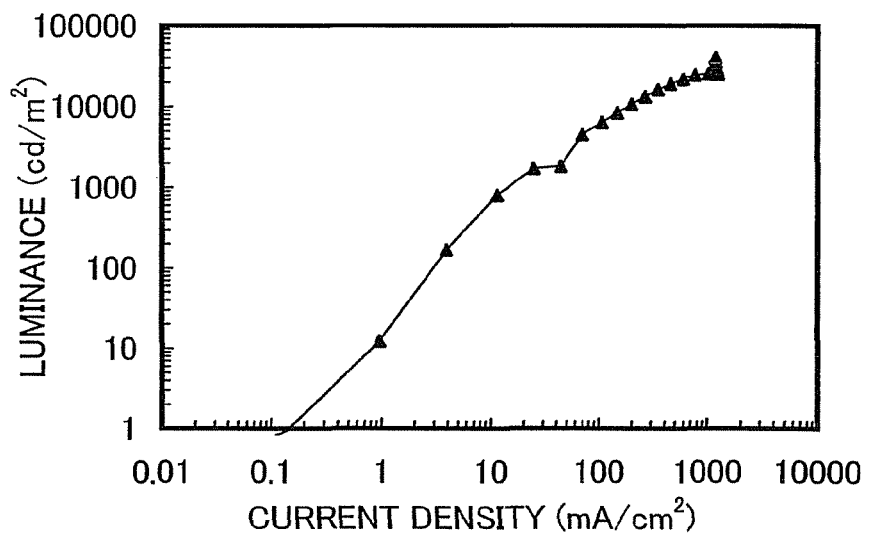
FIG. 21 is a graph showing current density-luminance characteristics of a light-emitting element 4.
Figure 22:
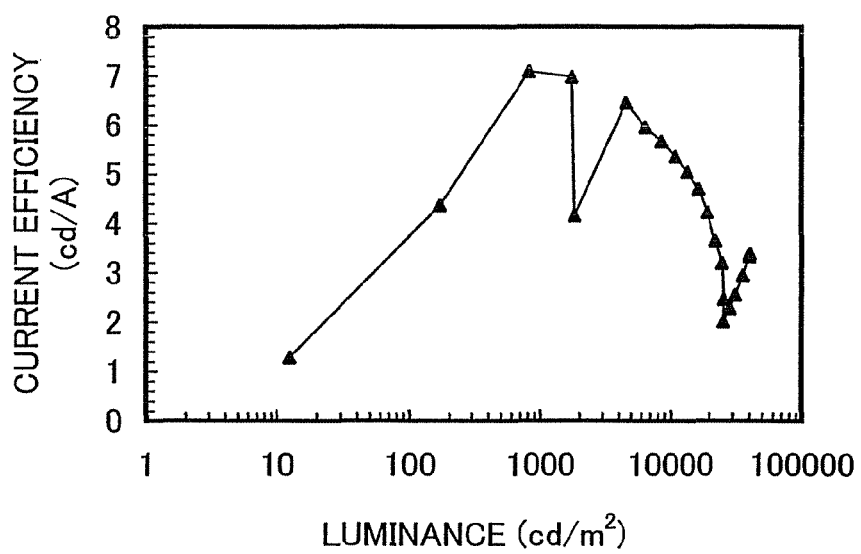
FIG. 22 is a graph showing luminance-current efficiency characteristics of a light-emitting element 4.
Figure 23:
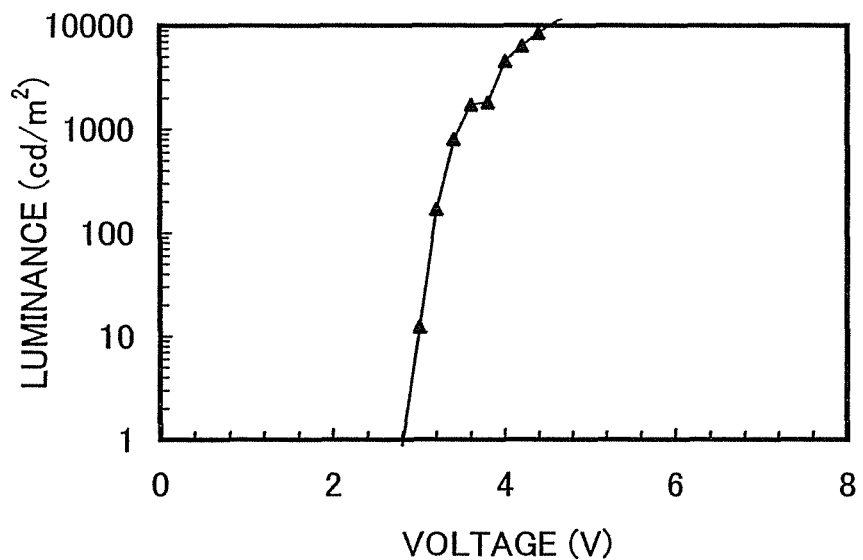
FIG. 23 is a graph showing voltage-luminance characteristics of a light-emitting element 4.
Figure 24:
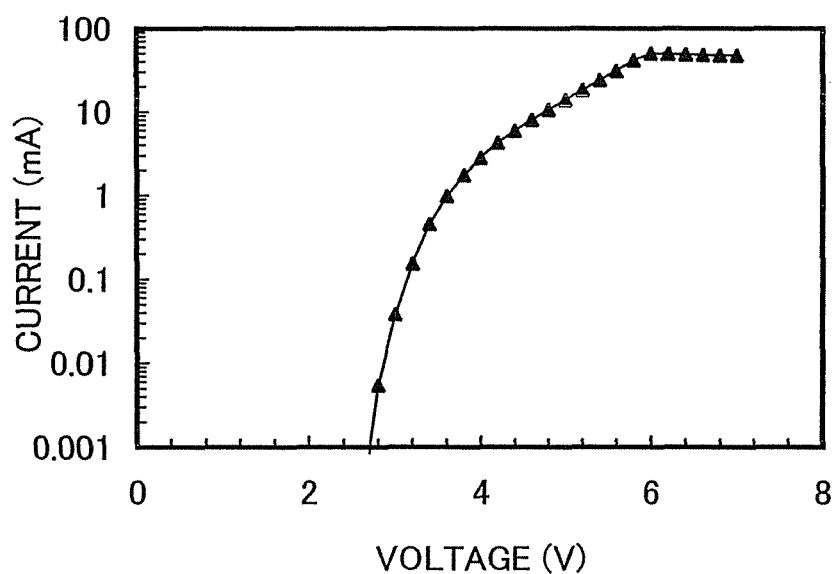
FIG. 24 is a graph showing voltage-current characteristics of a light-emitting element 4.
Figure 25:
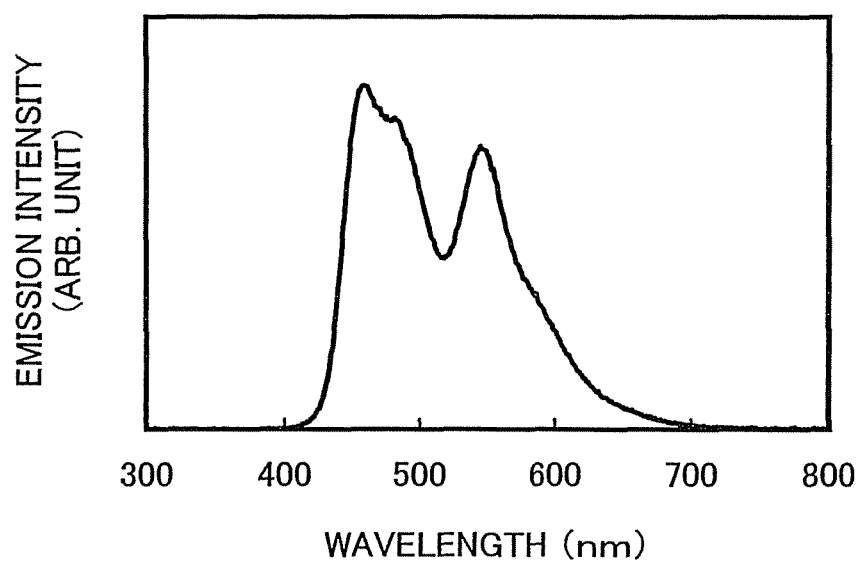
FIG. 25 is a graph showing an emission spectrum of a light-emitting element 4.

FIG. 21 shows current density-luminance characteristics of the light-emitting element 4. FIG. 22 shows luminance-current efficiency characteristics. FIG. 23 shows voltage-luminance characteristics. FIG. 24 shows voltage-current characteristics. FIG. 25 shows an emission spectrum upon feeding a current of 1 mA to the light-emitting element 4.

In the light-emitting element 4, 2YGAPPA which is an emission center substance of the first layer and the third layer emits blue light and rubrene which is an emission center substance of the second layer emits yellow light. That is, according to FIG. 25, it is found that light emission having a peak near 462 nm is light emission of 2YGAPPA; light emission having a peak near 549 nm is light emission of rubrene; and as for the light-emitting element 4, the intensity of the light emission of 2YGAPPA on the shorter wavelength side is higher than the intensity of the light emission of rubrene on the longer wavelength side. In a conventional structure, light emission on the longer wavelength side is higher due to influence of energy transfer and it is difficult to balance emission colors. However, with use of the structure of the present invention, like the light-emitting element 4 described above, the emission intensity on the shorter wavelength side can be higher than the emission intensity on the longer wavelength side, and it becomes possible to easily adjust balance of emission colors. Note that the CIE chromaticity coordinate of the light-emitting element 4 at a luminance of 810 cd/m$^2$ was (x=0.25, y=0.34), and the emission color was bluish white.

(Light-Emitting Element 5)

First, silicon or indium tin oxide containing silicon oxide was deposited to a thickness of 110 nm over a glass substrate by a sputtering method to form a first electrode (electrode area: 2 mm×2 mm).

Next, the substrate over which the first electrode had been formed was fixed to a substrate holder provided in a vacuum evaporation apparatus so that a surface of the substrate over which the first electrode had been formed faced downward, and the pressure was reduced to about 10$^{-4}$ Pa, and then NPB and molybdenum(VI) oxide were co-evaporated, whereby a layer containing a composite material in which an organic compound and an inorganic compound were combined was formed. The thickness of the layer was 50 nm and the weight ratio between NPB and molybdenum(VI) oxide was adjusted to be 4:1 (=NPB:molybdenum oxide). Note that the co-evaporation method is an evaporation method in which evaporation is carried out from a plurality of evaporation sources at the same time in one treatment chamber.

Subsequently, NPB was deposited to a thickness of 10 nm by an evaporation method using resistance heating to form a hole-transporting layer.

After that, DPAnth and 2YGAPPA were co-evaporated to form a third layer with a thickness of 20 nm. Here, the weight ratio between DPAnth and 2YGAPPA was adjusted to be 1:0.1 (=DPAnth:2YGAPPA).

Then, PCCPA and rubrene were co-evaporated to form a second layer with a thickness of 10 nm. Here, the weight ratio between PCCPA and rubrene was adjusted to be 1:0.0025 (=PCCPA:rubrene).

Furthermore, CzPA and 2YGAPPA were co-evaporated to form a first layer with a thickness of 20 nm. Here, the weight ratio between CzPA and 2YGAPPA was adjusted to be 1:0.05 (=CzPA:2YGAPPA).

After that, by an evaporation method using resistance heating, Alq was deposited to a thickness of 10 nm, and then BPhen was deposited to a thickness of 20 nm to form an electron-transporting layer.

Then, in a similar manner, by an evaporation method using resistance heating, lithium fluoride (LiF) was deposited to a thickness of about 1 nm to form an electron-injecting layer. Finally, aluminum was deposited to a thickness of 200 nm to form a second electrode. Accordingly, the light-emitting element 5 was manufactured.

The light-emitting element 5 obtained through the above-described steps was sealed in a glove box containing a nitrogen atmosphere so as not to be exposed to atmospheric air. Then, the operation characteristics of the light-emitting element 5 were measured. The measurement was carried out at room temperature (under an atmosphere maintaining 25° C.).

Figure 26:
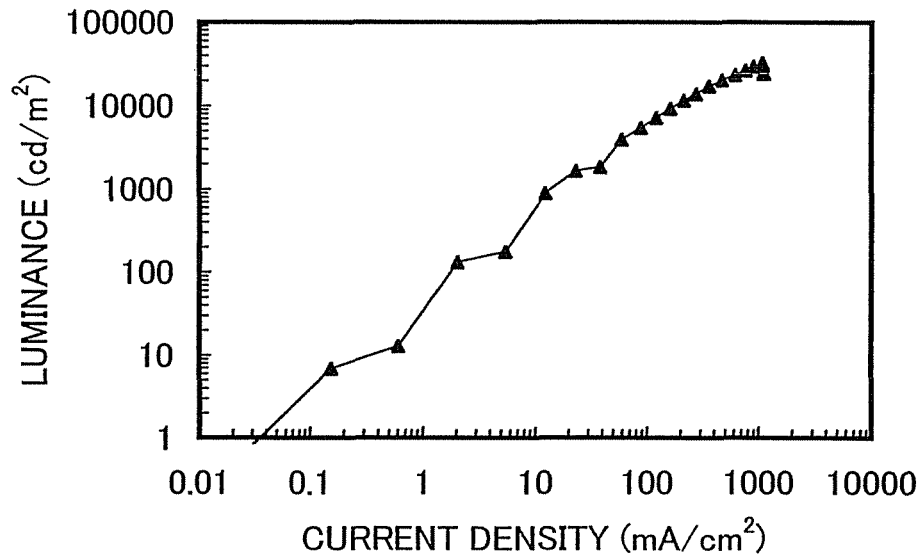
FIG. 26 is a graph showing current density-luminance characteristics of a light-emitting element 5.
Figure 27:
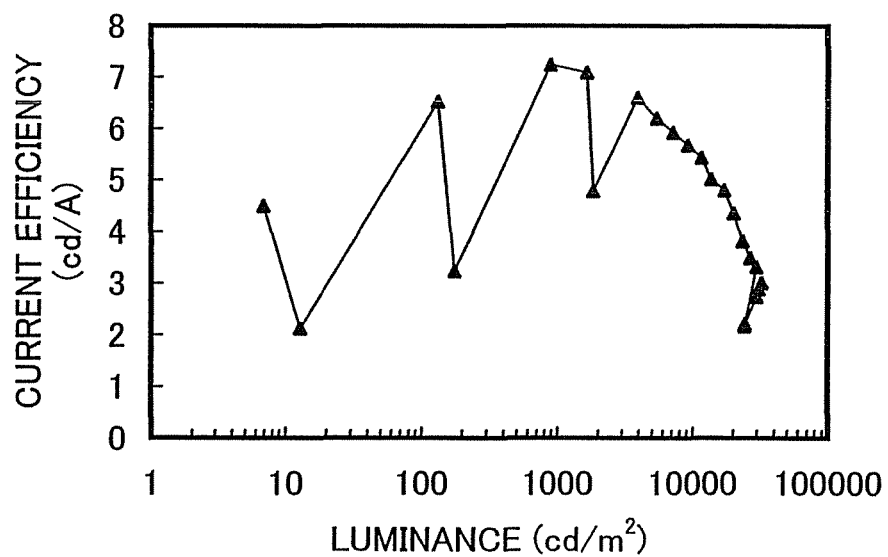
FIG. 27 is a graph showing luminance-current efficiency characteristics of a light-emitting element 5.
Figure 28:
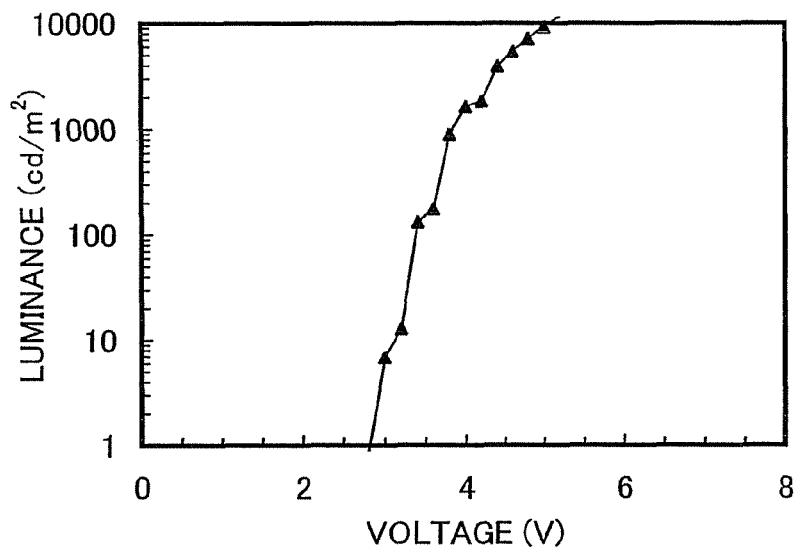
FIG. 28 is a graph showing voltage-luminance characteristics of a light-emitting element 5.
Figure 29:
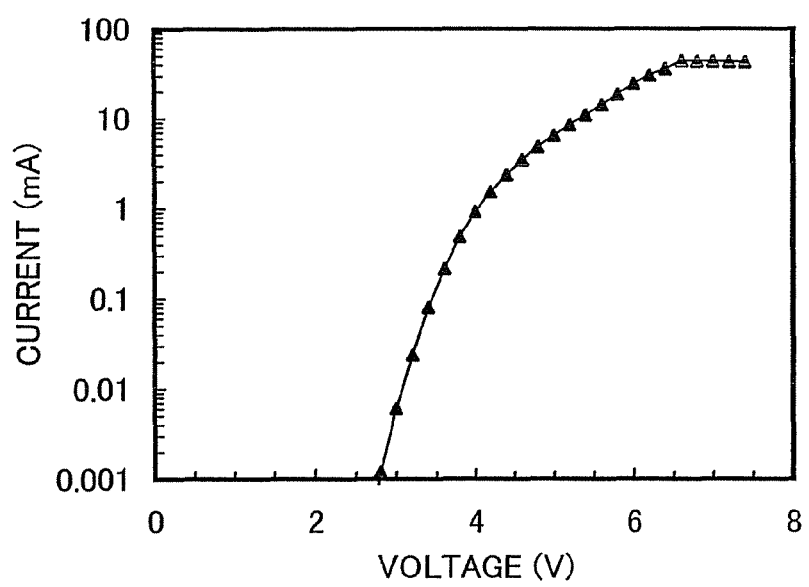
FIG. 29 is a graph showing voltage-current characteristics of a light-emitting element 5.
Figure 30:
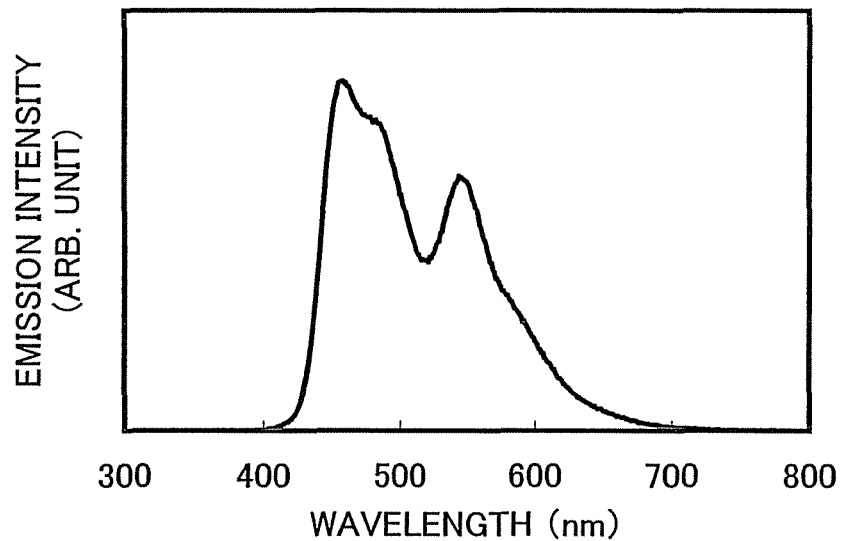
FIG. 30 is a graph showing an emission spectrum of a light-emitting element 5.

FIG. 26 shows current density-luminance characteristics of the light-emitting element 5. FIG. 27 shows luminance-current efficiency characteristics. FIG. 28 shows voltage-luminance characteristics. FIG. 29 shows voltage-current characteristics. FIG. 30 shows an emission spectrum upon feeding a current of 1 mA to the light-emitting element 5.

In the light-emitting element 5, 2YGAPPA which is an emission center substance of the first layer and the third layer emits blue light and rubrene which is an emission center substance of the second layer emits yellow light. That is, according to FIG. 30, it is found that light emission having a peak near 462 nm is light emission of 2YGAPPA; light emission having a peak near 549 nm is light emission of rubrene; and as for the light-emitting element 5, the intensity of the light emission of 2YGAPPA on the shorter wavelength side is higher than the intensity of the light emission of rubrene on the longer wavelength side. In a conventional structure, light emission on the longer wavelength side is higher due to influence of energy transfer and it is difficult to balance emission colors. However, with use of the structure of the present invention, like the light-emitting element 5 described above, the emission intensity on the shorter wavelength side can be higher than the emission intensity on the longer wavelength side, and it becomes possible to easily adjust balance of emission colors. Note that the CIE chromaticity coordinate of the light-emitting element 5 at a luminance of 890 cd/m$^2$ was (x=0.25, y=0.33), and the emission color was slightly bluish white.

(Light-Emitting Element 6)

As the light-emitting element 6, which is used as a comparative example (CE) of the light-emitting element 4 and the light-emitting element 5, a light-emitting element in which a third layer was not formed was manufactured. First, silicon or indium tin oxide containing silicon oxide was deposited to a thickness of 110 nm over a glass substrate by a sputtering method to form a first electrode (electrode area: 2 min×2 mm).

Next, the substrate over which the first electrode had been formed was fixed to a substrate holder provided in a vacuum evaporation apparatus so that a surface of the substrate over which the first electrode was formed faced downward, and the pressure was reduced to about $10^{-4}$ Pa, and then NPB and molybdenum(VI) oxide were co-evaporated, whereby a layer containing a composite material in which an organic compound and an inorganic compound were combined was formed. The thickness of the layer was 50 nm and the weight ratio between NPB and molybdenum(VI) oxide was adjusted to be 4:1 (=NPB:molybdenum oxide). Note that the co-evaporation method is an evaporation method in which evaporation is carried out from a plurality of evaporation sources at the same time in one treatment chamber.

Subsequently, NPB was deposited to a thickness of 10 nm by an evaporation method using resistance heating to form a hole-transporting layer.

Then, PCCPA and rubrene were co-evaporated to form a second layer with a thickness of 10 nm. Here, the weight ratio between PCCPA and rubrene was adjusted to be 1:0.0025 (=PCCPA:rubrene).

Furthermore, CzPA and 2YGAPPA were co-evaporated to form a first layer with a thickness of 20 nm. Here, the weight ratio between CzPA and 2YGAPPA was adjusted to be 1:0.05 (=CzPA:2YGAPPA).

After that, by an evaporation method using resistance heating, Alq was deposited to a thickness of 10 nm, and then BPhen was deposited to a thickness of 20 nm to form an electron-transporting layer.

Then, in a similar manner, by an evaporation method using resistance heating, lithium fluoride (LiF) was deposited to a thickness of about 1 nm to form an electron-injecting layer. Finally, aluminum was deposited to a thickness of 200 nm to form a second electrode. Accordingly, the light-emitting element 6 was manufactured.

The light-emitting element 6 obtained through the above-described steps was sealed in a glove box containing a nitrogen atmosphere so as not to be exposed to atmospheric air. Then, the operation characteristics of the light-emitting element 6 were measured. The measurement was carried out at room temperature (under an atmosphere maintaining 25° C.).

Figure 31:
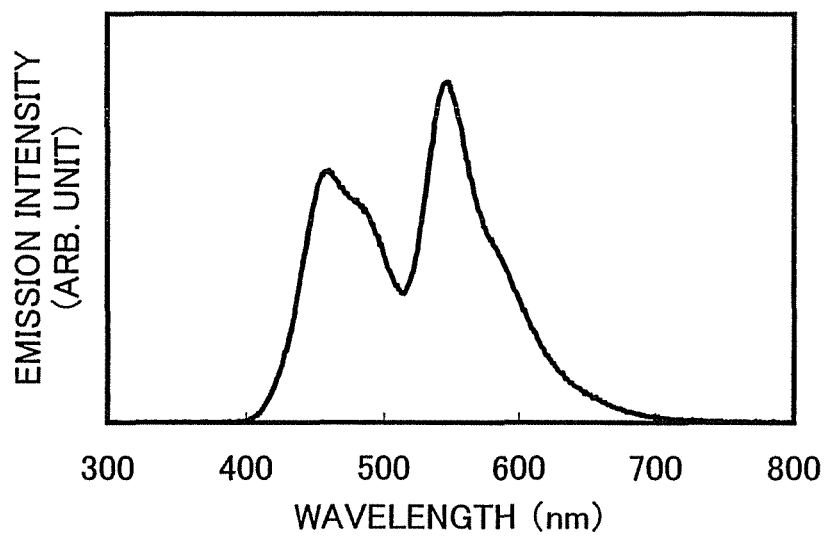
FIG. 31 is a graph showing an emission spectrum of a light-emitting element 6.

FIG. 31 shows an emission spectrum of the light-emitting element 6. In the light-emitting element 6, 2YGAPPA which is an emission center substance of the first layer emits blue light and rubrene which is an emission center substance of the second layer emits yellow light. That is, according to FIG. 31, it is found that light emission having a peak near 465 nm is light emission of 2YGAPPA; light emission having a peak near 549 nm is light emission of rubrene; and as for the light-emitting element 6, the intensity of the light emission of rubrene on the longer wavelength side is higher than the intensity of the light emission of 2YGAPPA on the shorter wavelength side. Note that the CIE chromaticity coordinate of the light-emitting element 6 at a luminance of 1520 cd/m² was (x=0.28, y=0.36), and the emission color was slightly bluish white.

Figure 32:
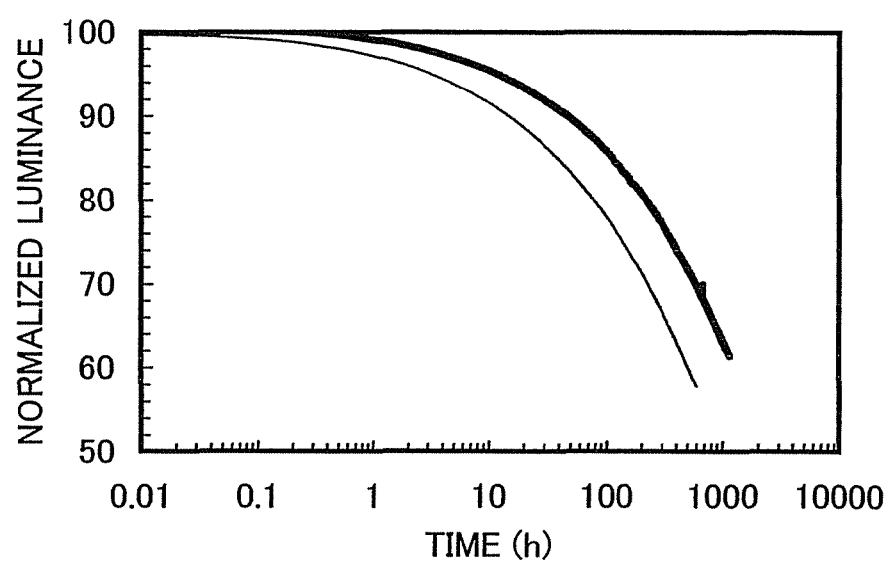
FIG. 32 is a graph showing time dependence of normalized luminance of a light-emitting element 4 and a light-emitting element 6.

Next, evaluation results on reliability are shown. FIG. 32 shows time dependence of normalized luminance of the light-emitting element 4 and the light-emitting element 6 when the light-emitting element 4 and the light-emitting element 6 were driven at an initial luminance of 1000 cd/m² and constant current density. Note that, in the graph, the thick line represents the result of the light-emitting element 4 and the thin line represents the result of the light-emitting element 6. Also according to FIG. 32, it is found that decrease in luminance of the light-emitting element 4 is suppressed more than decrease in luminance of the light-emitting element 6 which is the comparative example (CE). Note that the luminance of the light-emitting element 6 decreased to 58% in 590 hours, whereas the luminance of the light-emitting element 4 was 61% in 1100 hours, which means the life of the light-emitting element 4 is twice as long as the light-emitting element 6.

[Embodiment 2]

In this embodiment, a manufacturing method and element characteristics of the light-emitting element described in Embodiment Mode 1 will be described. Note that element structures of light-emitting elements 7 and 8 are shown in Table 2.

TABLE 2

|  | Light-Emitting Element | |
| --- | --- | --- |
|  | 7 | 8 |
| 2nd Electrode | Al | |
|  | 200 nm | |
| Electron-Injecting Layer | LiF | |
|  | 1 nm | |
| Electron-Transporting Layer | Bphen | |
|  | 20 nm | |
|  | Alq | |
|  | 10 nm | |
| 1st Layer | CzPA:PCBAPA (1:0.05) | |
|  | 20 nm | |
| 2nd Layer | PCCPA:2PCAPA (1:0.005) | PCBAPA:2PCAPA (1:0.02) |
|  | 10 nm | |
| 3rd Layer | PCCPA:PCBAPA (1:0.1) | |
|  | 10 nm | |
| Hole-Transporting Layer | NPB | |
|  | 10 nm | |
| Hole-Injecting Layer | NPB:MoOx (4:1) | |
|  | 50 nm | |
| 1ˢᵗ Electrode | ITSO | |
|  | 110 nm | |

(Light-Emitting Element 7)

First, silicon or indium tin oxide containing silicon oxide was deposited to a thickness of 110 nm over a glass substrate by a sputtering method to form a first electrode (electrode area: 2 mm×2 mm).

Next, the substrate over which the first electrode had been formed was fixed to a substrate holder provided in a vacuum evaporation apparatus so that a surface of the substrate over which the first electrode had been formed faced downward, and the pressure was reduced to about $10^{-4}$ Pa, and then 4,4'-bis[N-(1-naphthyl)-N-phenylamino]biphenyl (NPB) and molybdenum(VI) oxide were co-evaporated, whereby a layer containing a composite material in which an organic compound and an inorganic compound were combined was formed. The thickness of the layer was 50 nm and the weight ratio between NPB and molybdenum(VI) oxide was adjusted to be 4:1 (=NPB:molybdenum oxide). Note that the co-evaporation method is an evaporation method in which evaporation is carried out from a plurality of evaporation sources at the same time in one treatment chamber.

Subsequently, NPB was deposited to a thickness of 10 nm by an evaporation method using resistance heating to form a hole-transporting layer.

After that, 9-phenyl-9'-[4-(10-phenyl-9-anthryl)phenyl]-3,3'-bi(9H-carbazole) (PCCPA) and 4-(10-phenyl-9-anthryl)4'-(9-phenyl-9H-carbazol-3-yl)triphenylamine (PCBAPA) were co-evaporated to form a third layer with a thickness of 10 nm. Here, the weight ratio between PCCPA and PCBAPA was adjusted to be 1:0.1 (=PCCPA:PCBAPA).

Then, PCCPA and N-(9,10-diphenyl-2-anthryl)-N,9-diphenyl-9H-carbazol-3-amine (2PCAPA) were co-evaporated to form a second layer with a thickness of 10 nm. Here, the weight ratio between PCCPA and 2PCAPA was adjusted to be 1:0.005 (=PCCPA:2PCAPA).

Furthermore, CzPA and PCBAPA were co-evaporated to form a first layer with a thickness of 20 nm. Here, the weight ratio between CzPA and PCBAPA was adjusted to be 1:0.05 (=CzPA:PCBAPA).

After that, by an evaporation method using resistance heating, tris(8-quinolinolato)aluminum (Alq) was deposited to a thickness of 10 nm, and then bathophenanthroline (BPhen) was deposited to a thickness of 20 nm to form an electron-transporting layer.

Then, in a similar manner, by an evaporation method using resistance heating, lithium fluoride (LiF) was deposited to a thickness of about 1 nm to form an electron-injecting layer. Finally, aluminum was deposited to a thickness of 200 nm to form a second electrode. Accordingly, the light-emitting element 7 was manufactured.

The light-emitting element 7 obtained through the above-described steps was sealed in a glove box containing a nitrogen atmosphere so as not to be exposed to atmospheric air. Then, the operation characteristics were measured. The measurement was carried out at room temperature (under an atmosphere maintaining 25° C.).

Figure 33:
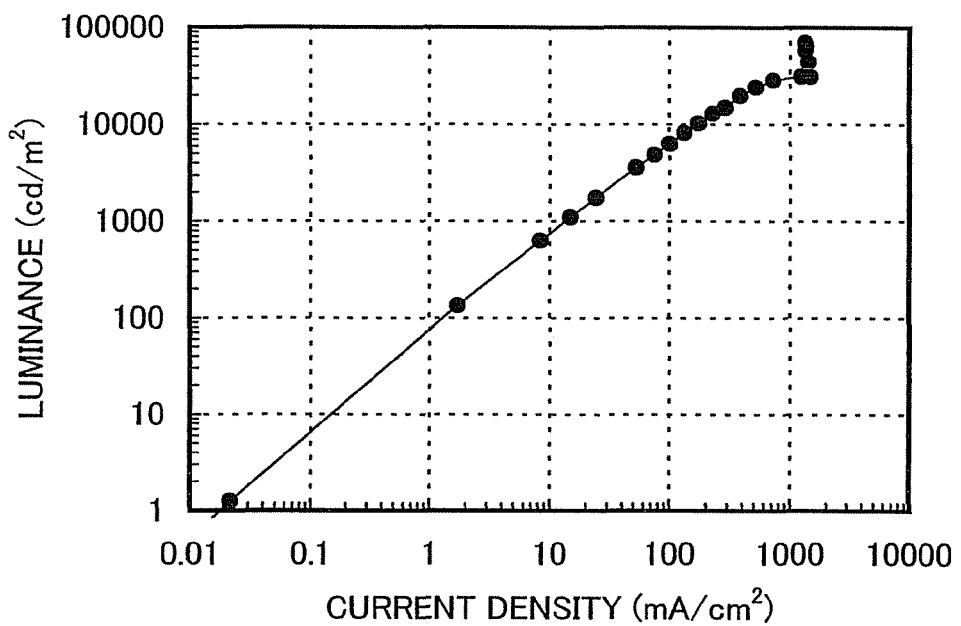
FIG. 33 is a graph showing current density-luminance characteristics of a light-emitting element 7.
Figure 34:
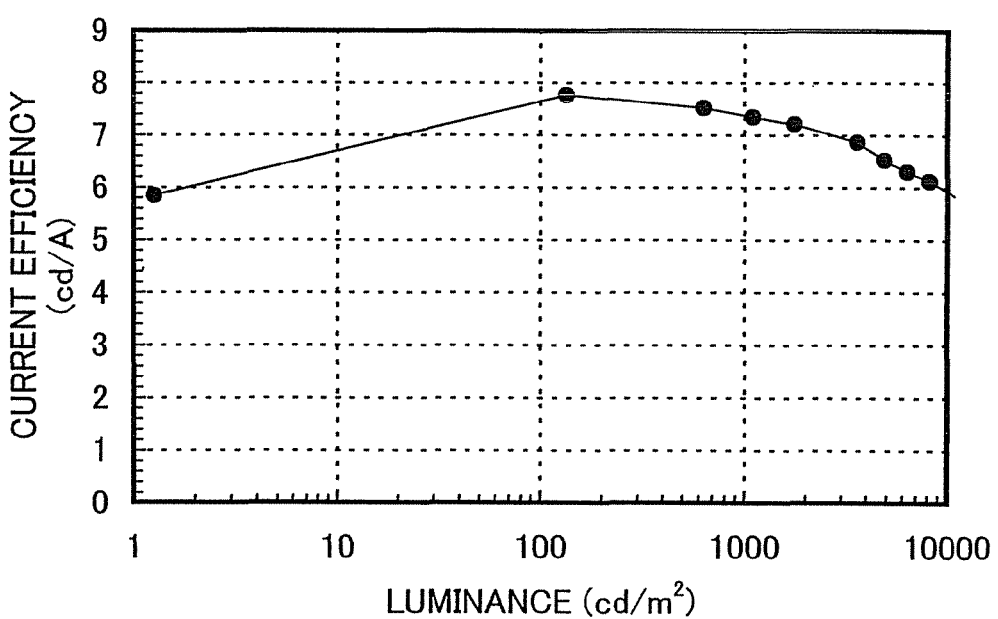
FIG. 34 is a graph showing luminance-current efficiency characteristics of a light-emitting element 7.
Figure 35:
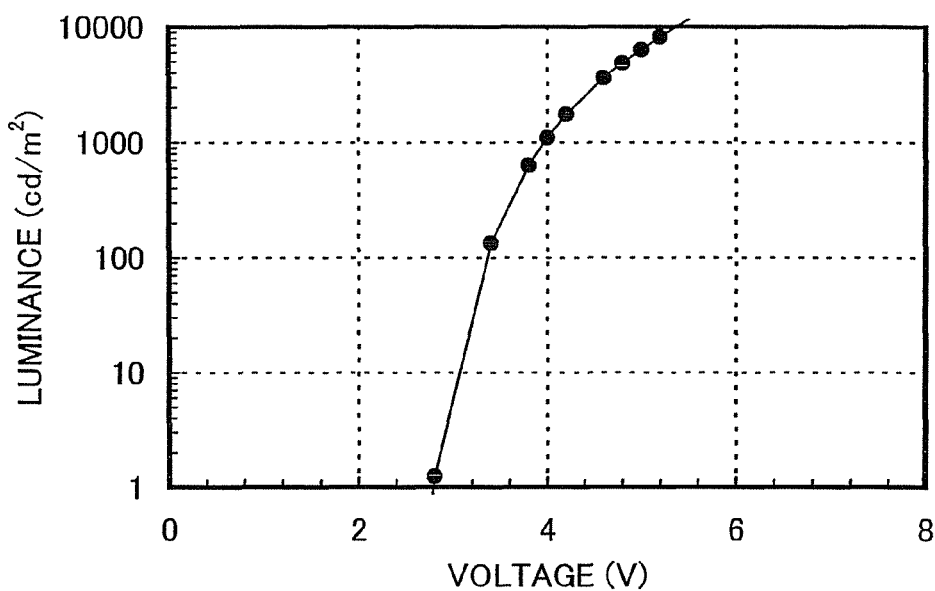
FIG. 35 is a graph showing voltage-luminance characteristics of a light-emitting element 7.
Figure 36:
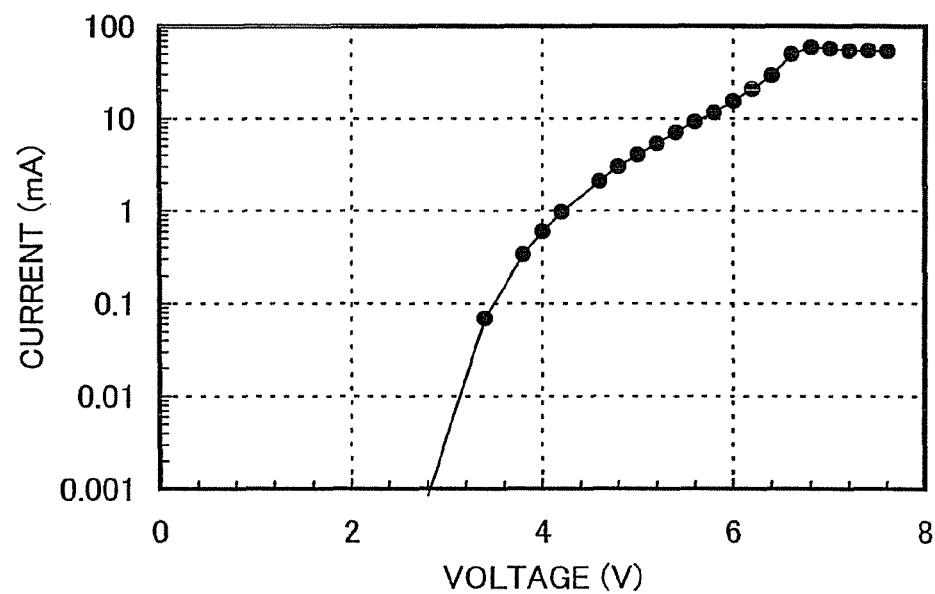
FIG. 36 is a graph showing voltage-current characteristics of a light-emitting element 7.
Figure 37:
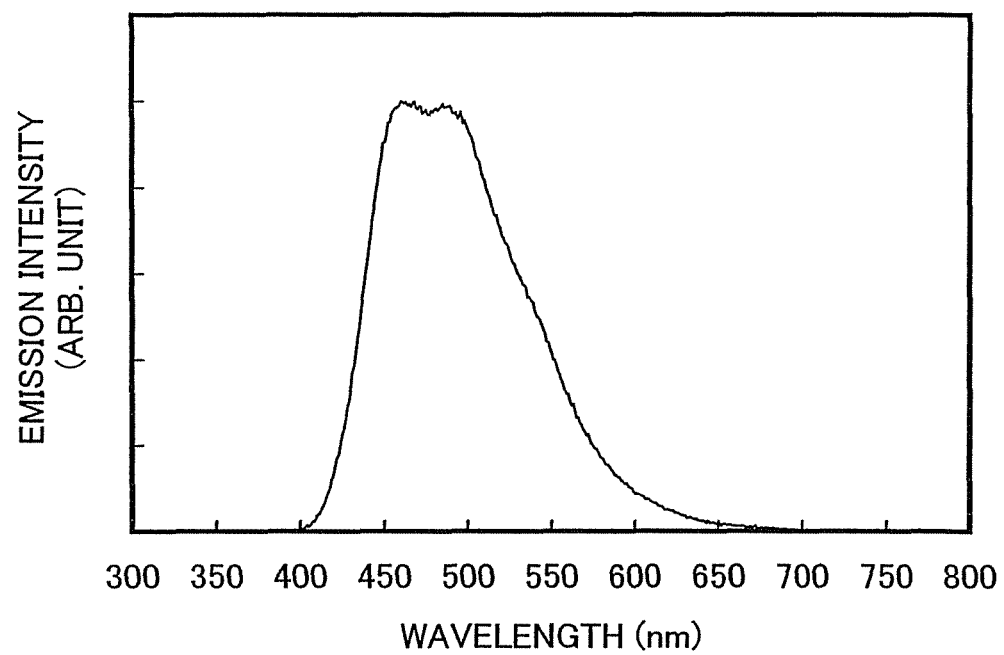
FIG. 37 is a graph showing an emission spectrum of a light-emitting element 7.

FIG. 33 shows current density-luminance characteristics of the light-emitting element 7. FIG. 34 shows luminance-current efficiency characteristics. FIG. 35 shows voltage-luminance characteristics. FIG. 36 shows voltage-current characteristics. FIG. 37 shows an emission spectrum upon feeding a current of 1 mA to the light-emitting element 7.

In the light-emitting element 7, PCBAPA which is an emission center substance of the first layer and the third layer emits blue light and 2PCAPA which is an emission center substance of the second layer emits green light. That is, according to FIG. 37, it is found that light emission having a peak near 466 nm is light emission of PCBAPA; light emission having a peak near 493 nm is light emission of 2PCAPA; and as for the light-emitting element 7, the intensity of the light emission of PCBAPA on the shorter wavelength side and the intensity of the light emission of 2PCAPA on the longer wavelength side are almost the same. In a conventional structure, light emission on the longer wavelength side is higher due to influence of energy transfer and it is difficult to balance emission colors. However, with use of the structure of the present invention, like the light-emitting element 7 described above, the emission intensity on the shorter wavelength side and the emission intensity on the longer wavelength side can be made equal, and it becomes possible to easily adjust balance of emission colors. Note that the CIE chromaticity coordinate of the light-emitting element 7 at a luminance of 1100 cd/m$^2$ was (x=0.18, y=0.27), and the emission color was blue green.

(Light-Emitting Element 8)

As for the manufacture of a light-emitting element 8, the steps up through formation of a third layer were performed in a similar manner to the steps of the light-emitting element 7.

Subsequently, PCBAPA and 2PCAPA were co-evaporated to form a second layer with a thickness of 10 nm. Here, the weight ratio between PCBAPA and 2PCAPA was adjusted to be 1:0.02 (=PCBAPA:2PCAPA).

After that, the steps of formation of from a first layer to a cathode were performed in a similar manner to the steps of the light-emitting element 7. Accordingly, the light-emitting element 8 was manufactured.

The light-emitting element 8 obtained through the above-described steps was sealed in a glove box containing a nitrogen atmosphere so as not to be exposed to atmospheric air. Then, the operation characteristics were measured. The measurement was carried out at room temperature (under an atmosphere maintaining 25° C.).

Figure 38:
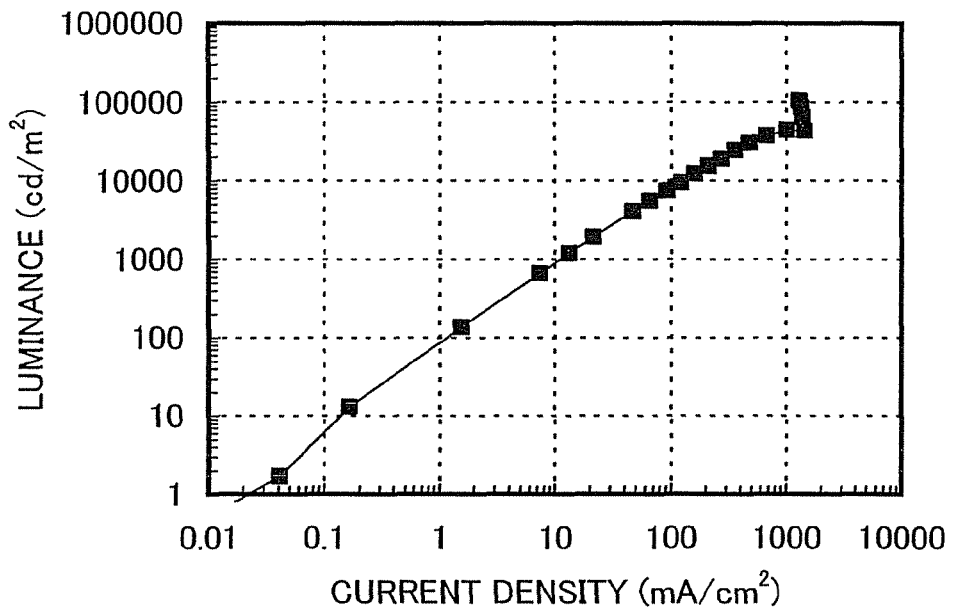
FIG. 38 is a graph showing current density-luminance characteristics of a light-emitting element 8.
Figure 39:
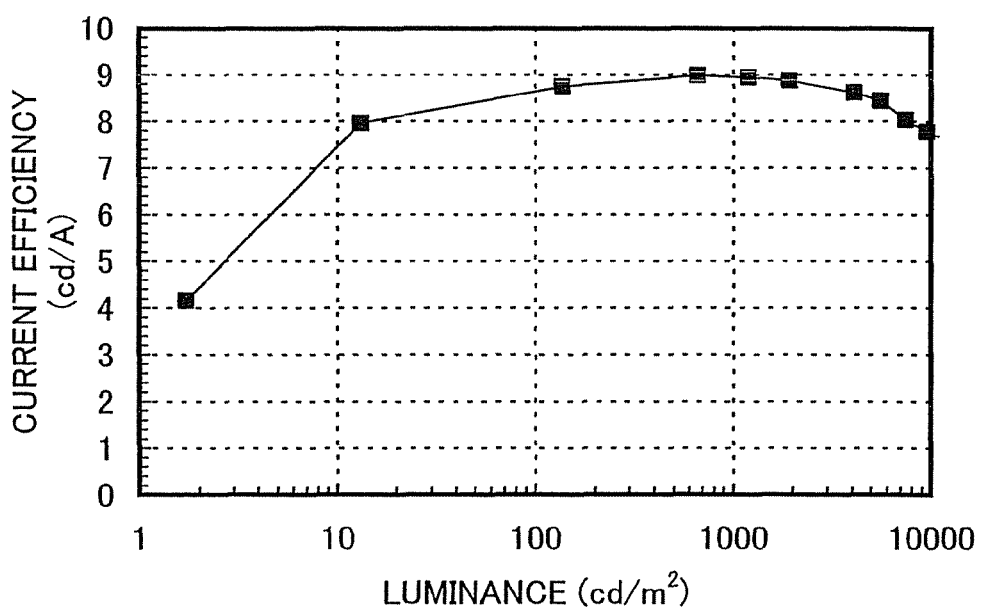
FIG. 39 is a graph showing luminance-current efficiency characteristics of a light-emitting element 8.
Figure 40:
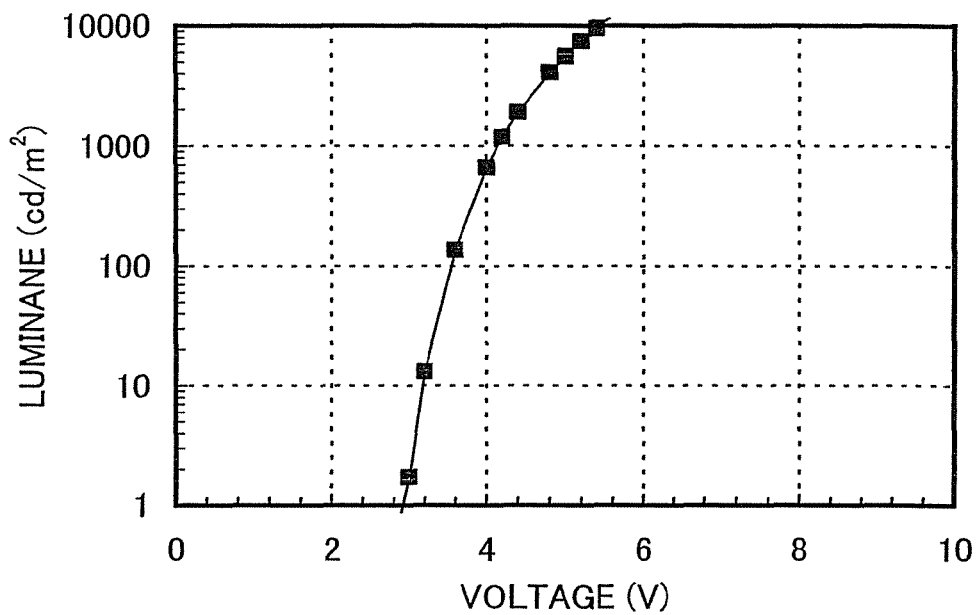
FIG. 40 is a graph showing voltage-luminance characteristics of a light-emitting element 8.
Figure 41:
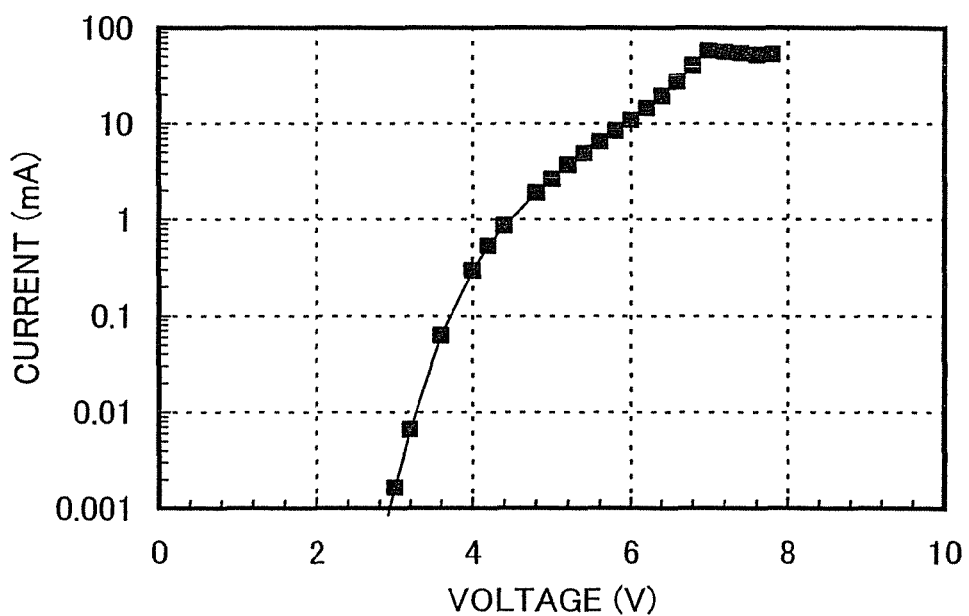
FIG. 41 is a graph showing voltage-current characteristics of a light-emitting element 8.
Figure 42:
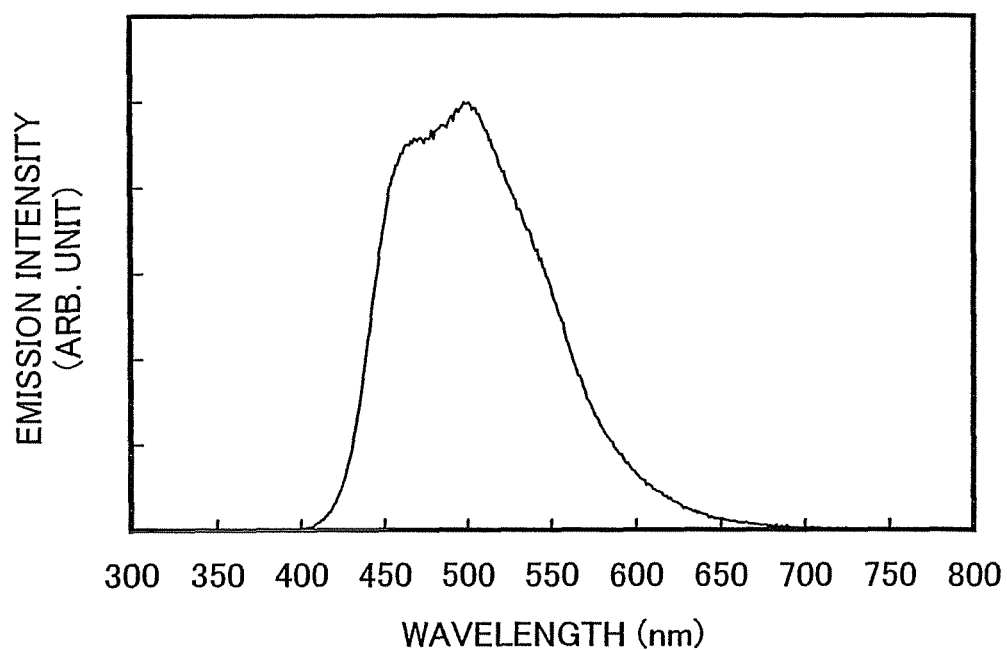
FIG. 42 is a graph showing an emission spectrum of a light-emitting element 8.

FIG. 38 shows current density-luminance characteristics of the light-emitting element 8. FIG. 39 shows luminance-current efficiency characteristics. FIG. 40 shows voltage-luminance characteristics. FIG. 41 shows voltage-current characteristics. FIG. 42 shows an emission spectrum upon feeding a current of 1 mA to the light-emitting element 8.

In the light-emitting element 8, PCBAPA which is an emission center substance of the first layer and the third layer emits blue light and 2PCAPA which is an emission center substance of the second layer emits green light. That is, according to FIG. 42, light emission having a peak near 470 nm is light emission of PCBAPA, and light emission having a peak near 500 nm is light emission of 2PCAPA. As described above, it can be said that the light-emitting element of the present invention is also capable of emitting light of high intensity of an emission center substance on the longer wavelength side and capable of easily adjusting balance of emission colors. Note that the CIE chromaticity coordinate of the light-emitting element 8 at a luminance of 1190 cd/m$^2$ was (x=0.20, y=0.33), and the emission color was blue green.

Note that by formation of a light-emitting element having, as a layer containing an organic compound, a stacked-layer structure (stacked structure including the hole-injecting layer to the electron-injecting layer) which provides blue green emission and a stacked-layer structure which provides red emission, a light-emitting element which emits white light can be provided. At this time, a charge generation layer is provided between the stacked layer which provides blue green emission and the stacked layer which provides red emission. The charge generation layer can be formed of the composite material described in Embodiment Mode 1. In addition, the charge generation layer may have a stacked structure of a layer formed of the composite material and a layer formed of another material. In that case, as the layer formed of another material, a layer containing a substance having an electron donating property and a substance having a high electron-transporting property, or a layer formed of a transparent conductive film can be used. As for a light-emitting element having such a structure, even when red emission is phosphorescence and blue green emission is fluorescence, problems such as energy transfer and quenching are unlikely to occur, and a white light-emitting element which has both high light emission efficiency and long life can be easily obtained due to expansion in the range of selection of materials. Moreover, since blue green emission can be easily adjusted, there is an advantage in that white emission with a desired color can be easily obtained.

REFERENCE EXAMPLE

Since 2YGAPPA used for the light-emitting elements 1 to 6 is not a known substance, a synthetic method thereof will be described. Note that 2YGAPPA is represented by the following structural formula (1).

[Chemical Formula 1]

(1)

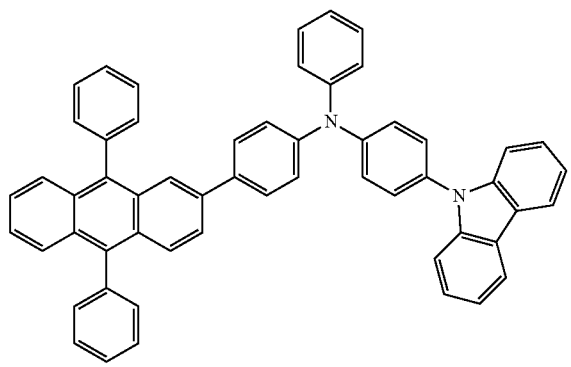

[Step 1] Synthesis of 2-bromo-9,10-diphenylanthracene (i) Synthesis of 2-bromo-9,10-anthraquinone A synthesis scheme of 2-bromo-9,10-anthraquinone is shown in (A-1).

[Chemical Formula 2]

(A-1)

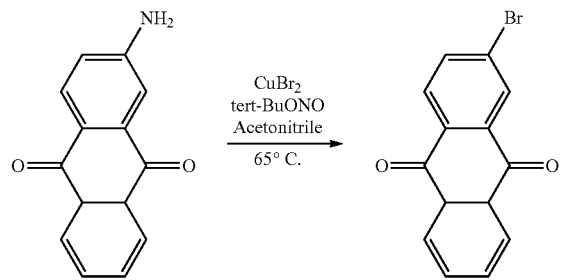

46 g (0.20 mol) of copper(II) bromide and 500 mL of acetonitrile were put into a 1 L three-neck flask. Then, 17 g (0.17 mol) of tert-butyl nitrite was added thereto. The mixture was heated to 65° C. 25 g (0.11 mol) of 2-amino-9,10-anthraquinone was added to the mixture, and the mixture was stirred at the same temperature for six hours. After reaction, a reaction solution was poured into 500 mL of hydrochloric acid with 3 mol/L, and this suspension was stirred for three hours, so that a solid substance was precipitated. The precipitate was collected by suction filtration, and washed with water and ethanol while being suction-filtrated. The precipitate was dissolved in toluene. The mixture was suction-filtrated through Florisil (produced by Wako Pure Chemical Industries, Ltd., Catalog No. 540-00135), Celite (produced by Wako Pure Chemical Industries, Ltd., Catalog No. 531-16855), and alumina. The obtained filtrate was concentrated, so that a solid substance was obtained. This solid substance was recrystallized with a mixed solvent of chloroform and hexane, so that 18.6 g of 2-bromo-9,10-anthraquinone as a milky white powdered solid substance, which was an object, was obtained in a yield of 58%.

ii) Synthesis of 2-bromo-9,10-diphenyl-9,10-dihydroanthracene-9,10-diol

A synthesis scheme of 2-bromo-9,10-diphenyl-9,10-dihydroanthracene-9,10-diol is shown in (A-2).

[Chemical Formula 3]

(A-2)

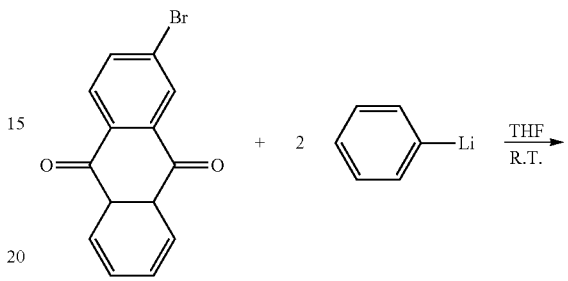

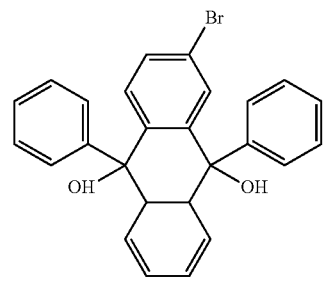

4.9 g (17 mmol) of 2-bromo-9,10-anthraquinone was put into a 300 mL three-neck flask. The atmosphere in the flask was substituted with nitrogen. 100 mL of tetrahydrofuran (THF) was added and dissolved well. After that, 18 mL (37 mmol) of phenyl lithium was dripped into the solution, and the mixture was stirred at room temperature for about 12 hours. After the reaction, the solution was washed with water. Then, the aqueous layer was extracted with ethyl acetate. The extracted solution and an organic layer were mixed to be dried with magnesium sulfate. After the drying, this mixture was suction-filtrated and the filtrate was concentrated, so that 2-bromo-9,10-diphenyl-9,10-dihydroanthracene-9,10-diol (about 7.6 g), which was an object, was obtained.

(iii) Synthesis of 2-bromo-9,10-diphenylanthracene

A synthesis scheme of 2-bromo-9,10-diphenylanthracene is shown in (A-3).

[Chemical Formula 4]

(A-3)

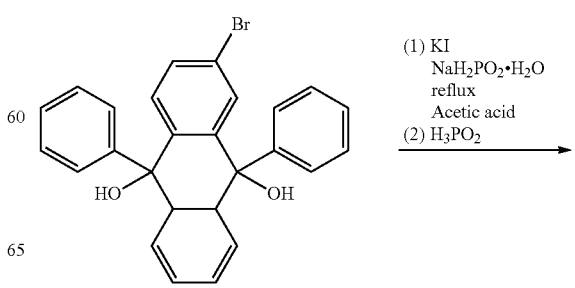

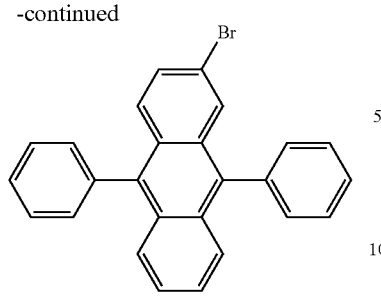

About 7.6 g (17 mmol) of 2-bromo-9,10-diphenyl-9,10-dihydroanthracene-9,10-diol, which was obtained, 5.1 g (31 mmol) of potassium iodide, 9.7 g (92 mmol) of sodium phosphinate monohydrate, and 50 mL of glacial acetic acid were put into a 500 mL three-neck flask. The mixture was refluxed at 120° C. for two hours. After that, 30 mL of 50% phosphinic acid was added to the mixture, and the mixture was stirred at 120° C. for one hour. After the reaction, the solution was washed with water. Then, an aqueous layer was extracted with ethyl acetate. The extracted solution and an organic layer were mixed to be dried with magnesium sulfate. After the drying, this mixture was suction-filtrated and the filtrate was concentrated, so that a solid substance was obtained. This solid substance was dissolved in toluene, and then the mixture was filtered through Celite, Florisil, and then alumina. The obtained filtrate was concentrated to obtain a solid substance, and the solid substance was recrystallized with a mixed solvent of chloroform and hexane, so that 5.1 g of 2-bromo-9,10-diphenylanthracene as a light yellow powdered solid substance, which was an object, was obtained. The yield of the two stages (ii) and (iii) was 74%.

[Step 2] Synthesis of 2-(4-bromophenyl)-9,10-diphenylantracene (i) Synthesis of 2-iodo-9,10-diphenylanthracene Synthesis scheme of 2-iodo-9,10-diphenylanthracene is shown in (A-4).

[Chemical Formula 5]

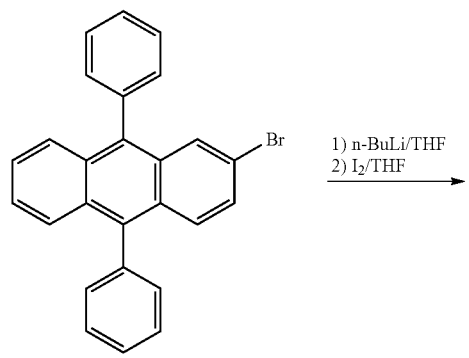

(A-4)

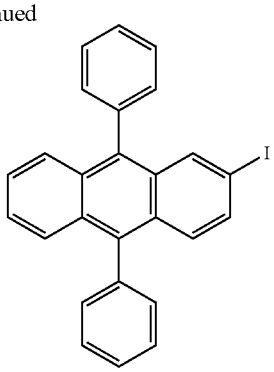

10 g (24 mmol) of 2-bromo-9,10-diphenylanthracene was put into a 500 mL three-neck flask, the atmosphere in the flask was substituted with nitrogen, and then 150 mL of tetrahydrofuran was added thereto and dissolved well. This solution was stirred at −78° C. 19 mL of n-butyllithium solution (1.6 mmol/L) was dropped into this solution with a syringe and the mixture was stirred at −78° C. for one hour, so that a white solid substance was precipitated. After reaction, a solution in which 12 g (49 mmol) of iodine was dissolved into 80 mL of tetrahydrofuran was dropped into this reacted mixture with use of a dropping funnel. After the dropping, the mixture was stirred at −78° C. for one hour and at room temperature for 12 hours. After reaction, a sodium thiosulfate solution was added into the reaction solution, and was stirred at room temperature for one hour. Ethyl acetate was added into this mixture for extraction. An aqueous layer and an organic layer were separated, and the organic layer was washed with sodium thiosulfate solution and saturated saline in this order. The aqueous layer and the organic layer were separated and the organic layer was dried with magnesium sulfate. This mixture was suction-filtrated to remove the magnesium sulfate. The obtained filtrate was concentrated, so that a solid substance was obtained. Methanol was added into this solid substance and washed by ultrasonic wave irradiation, so that a solid substance was precipitated. This solid substance was collected by suction filtration, so that 9.9 g of a light yellow powdered solid substance was obtained in a yield of 90%.

(ii) Synthesis of 2-(4-bromophenyl)-9,10-diphenylanthracene

Synthesis scheme of 2-(4-bromophenyl)-9,10-diphenylanthracene is shown in (A-5).

[Chemical Formula 6]

(A-5)

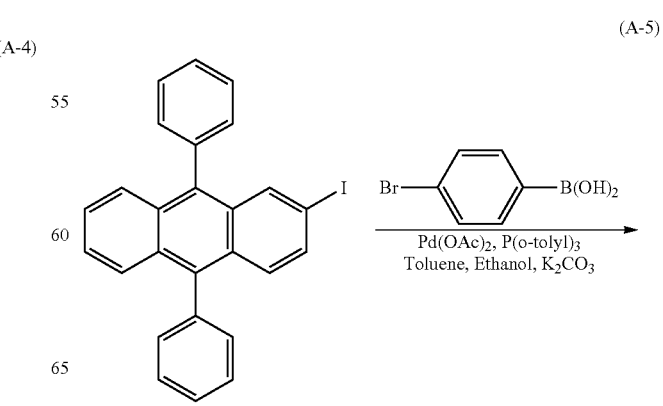

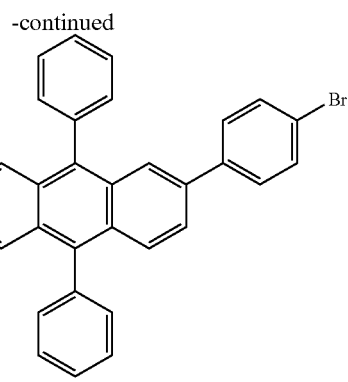

2.0 g (9.9 mmol) of 4-bromophenyl boronic acid, 0.02 g (0.089 mmol) of palladium(0) acetate, 5.0 g (11 mmol) of 2-iodo-9,10-diphenylanthracene, and 0.30 g (0.99 mmol) of tris(o-tolyl)phosphine were put into a 200 mL three-neck flask, and the atmosphere in the flask was substituted with nitrogen. 50 mL of toluene, 20 mL (2 mol/L) of a potassium carbonate aqueous solution, and 10 mL of ethanol were put into the mixture. The mixture was stirred at 100° C. for eight hours to be reacted. After the reaction, toluene was added into the reacted mixture, and this suspension was washed with saturated sodium hydrogen carbonate water and a saturated saline in this order. An organic layer and an aqueous layer were separated, and the organic layer was suction-filtrated through Celite, alumina, and Florisil to obtain a filtrate. The obtained filtrate was concentrated, so that a solid substance was obtained. Methanol was added into this solid substance and washed by ultrasonic wave irradiation, so that a solid substance was precipitated. This solid substance was collected by suction filtration, so that 4.6 g of a light yellow powdered solid substance was obtained in a yield of 87% yield. This compound was proved to be 2-(4-bromophenyl)-9,10-diphenylanthracene by a nuclear magnetic resonance measurement (NMR).

¹H NMR data of 2-(4-bromophenyl)-9,10-diphenylanthracene is shown below. ¹H NMR (CDCl₃, 300 MHz): δ=7.33-7.36 (m, 2H), 7.40 (d, J=8.4 Hz, 2H), 7.49-7.72 (m, 15H), 7.78 (d, J=9.3 Hz, 1H), 7.85 (d, J=1.5 Hz, 1H).

[Step 1] Synthesis of 4-(carbazol-9-yl)diphenylamine (YGA)

(i) Synthesis of N-(4-bromophenyl)carbazole

A synthesis scheme of N-(4-bromophenyl)carbazole is shown in (A-6).

[Chemical Formula 7]

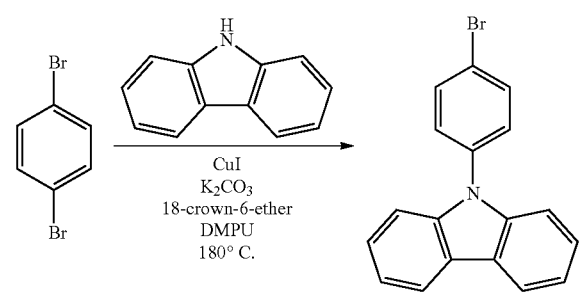

(A-6)

First, a synthesis method of N-(4-bromophenyl)carbazole is described. 56 g (0.24 mol) of 1,4-dibromobenzene, 31 g (0.18 mol) of carbazole, 4.6 g (0.024 mol) of copper(I) iodide, 66 g (0.48 mol) of potassium carbonate, and 2.1 g (0.008 mol) of 18-crown-6-ether were put into a 300 mL three-neck flask, and the atmosphere in the flask was substituted with nitrogen.

Then, 8 mL of 1,3-dimethyl-3,4,5,6-tetrahydro-2(1H)-pyrimidinone (DMPU) was added, and the mixture was stirred at 180° C. for six hours. After the reacted mixture was cooled to room temperature, the precipitation was removed by suction filtration. The filtrate was washed with a diluted hydrochloric acid, a saturated sodium hydrogen carbonate aqueous solution, and saturated saline in this order. An organic layer was dried with magnesium sulfate. After the drying, the mixture was filtered naturally, and the obtained filtrate was concentrated, so that an oily substance was obtained. The oily substance was purified by silica gel column chromatography (hexane:ethyl acetate=9:1). The obtained solid substance was recrystallized with a mixed solvent of chloroform and hexane, so that 21 g of N-(4-bromophenyl)carbazole as a light brown plate-like crystal was obtained in a yield of 35%. This compound was proved to be N-(4-bromophenyl)carbazole by the nuclear magnetic resonance measurement (NMR).

¹H NMR data of this compound is shown below. ¹H NMR (300 MHz, CDCl₃): δ=8.14 (d, J=7.8 Hz, 2H), 7.73 (d, J=8.7 Hz, 2H), 7.46 (d, J=8.4 Hz, 2H), 7.42-7.26 (m, 6H).

(ii) Synthesis of 4-(carbazol-9-yl)diphenylamine (YGA)

A synthesis scheme of 4-(carbazol-9-yl)diphenylamine (YGA) is shown in (A-7).

[Chemical Formula 8]

(A-7)

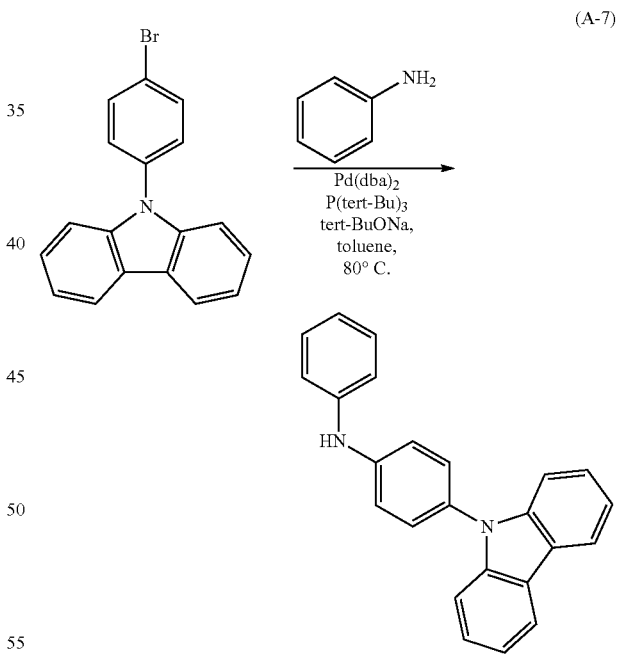

5.4 g (17.0 mmol) of N-(4-bromophenyl)carbazole obtained in the above-described step (i), 1.8 mL (20.0 mmol) of aniline, 100 mg (0.17 mmol) of bis(dibenzylideneacetone) palladium(0), and 3.9 g (40 mmol) of sodium tert-butoxide were put into a 200 mL three-neck flask, and the atmosphere in the flask was substituted with nitrogen. Then, 0.1 mL of tri(tert-butyl)phosphine (10 wt % of hexane solution) and 50 mL of toluene were added to the mixture. The mixture was stirred at 80° C. for six hours. After reaction, the reacted mixture was filtered through Florisil, Celite, and alumina.

The filtrate was washed with water and saturated saline. An organic layer was dried. The mixture was filtered, and the filtrate was concentrated, so that an oily substance was obtained. The oily substance was purified by silica gel column chromatography (hexane:ethyl acetate=9:1), so that 4.1 g of 4-(carbazol-9-yl)diphenylamine (YGA), which was an object, was obtained in a yield of 73%. This compound was proved to be 4-(carbazol-9-yl)diphenylamine (YGA) by a nuclear magnetic resonance measurement (NMR).

$^1$H NMR data of this compound is shown below. $^1$H NMR (300 MHz, DMSO-$d_6$): δ=8.47 (s, 1H), 8.22 (d, J=7.8 Hz, 2H), 7.44-7.16 (m, 14H), 6.92-6.87 (m, 1H).

[Step 4] Synthesis Method of 2YGAPPA

A synthesis scheme of 2YGAPPA is shown in (A-8).

After the reaction, toluene was added to the reacted mixture, and this suspension was suction-filtrated through Florisil, Celite, and alumina. The obtained filtrate was washed with water and saturated saline and then magnesium sulfate was added into an organic layer for drying. The mixture was suction-filtrated to remove magnesium sulfate, and the obtained filtrate was concentrated to obtain a solid substance. The obtained solid substance was purified using a silica gel column chromatography. In the silica gel column chromatography, a mixed solvent of toluene and hexane (toluene:hexane=1:10) was used as a developing solvent, and then a mixed solvent of toluene and hexane (toluene:hexane=1:5) was used as a developing solution. The obtained fraction was concentrated to obtain a solid substance. The solid substance was recrystallized with a mixture solvent of dichloromethane and

[Chemical Formula 9]

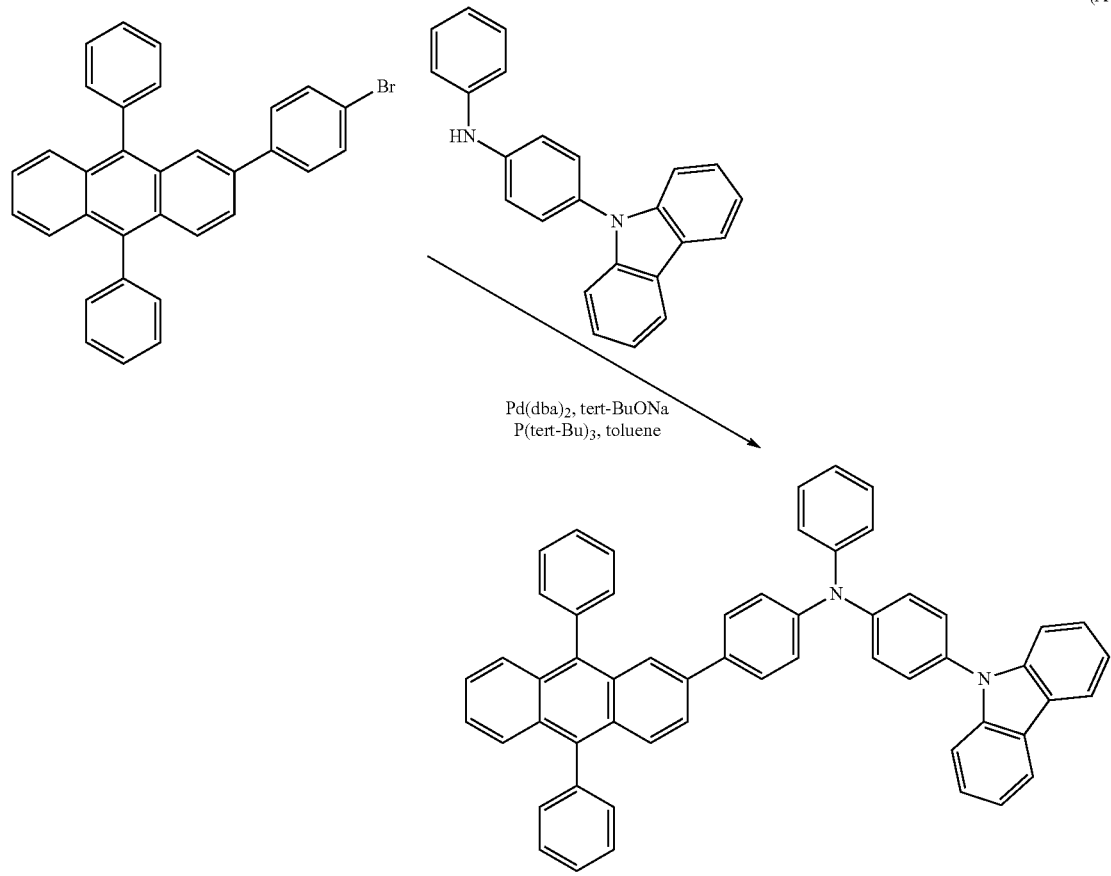

(A-8)

0.51 g (1.1 mmol) of 2-(4-bromophenyl)-9,10-diphenylanthracene synthesized in Step 2, 0.20 g (2.1 mmol) of tert-BuONa, 0.35 g (1.1 mmol) of 4-(carbazol-9-yl)diphenylamine, 0.02 g (0.04 mmol) of bis(dibenzylideneacetone)palladium(0) were put into a 50 mL three-neck flask, and the atmosphere in the flask was substituted with nitrogen. 10 mL of toluene and 0.02 mL of 10 wt % hexane solution of tri(tert-butyl)phosphine were added into the mixture. The mixture was heated and stirred at 80° C. for three hours to be reacted.

methanol, so that 0.51 g of a yellow powdered solid substance was obtained in a yield of 65%. This compound was proved to be 2-(4-{N-[4-(carbazol-9-yl) phenyl]-N-phenylamino}phenyl)-9,10-diphenylanthracene (2YGA-PPA) by a nuclear magnetic resonance measurement (NMR).

1.4 g of the obtained yellow solid substance was purified by train sublimation. The sublimation was conducted under a low pressure of 7.0 Pa, an argon flow rate of 3 mL/min, at 333° C. for nine hours. 1.2 g of the solid substance was obtained in a yield of 86%.

$^1$H NMR data of the obtained compound is shown below. According to the $^1$H NMR data, it was found that YGAPPA represented by the above-described structural formula (1) was obtained.

$^1$H NMR data of the obtained compound is shown below.
$^1$H NMR (CDCl$_3$, 300 MHz): δ=7.06-7.15 (m, 1H), 7.17-7.74 (m, 33H), 7.78 (d, J=9.8 Hz, 1H), 7.90 (s, 1H), 8.14 (d, J=7.8 Hz, 2H).

In this manner, 2YGAPPA can be synthesized.

Subsequently, the synthetic method of PCCPA used for the light-emitting elements 4 to 6 will be described because PCCPA is also not a known substance. PCCPA is a substance having the structure represented by the structural formula (2).

[Chemical Formula 10]

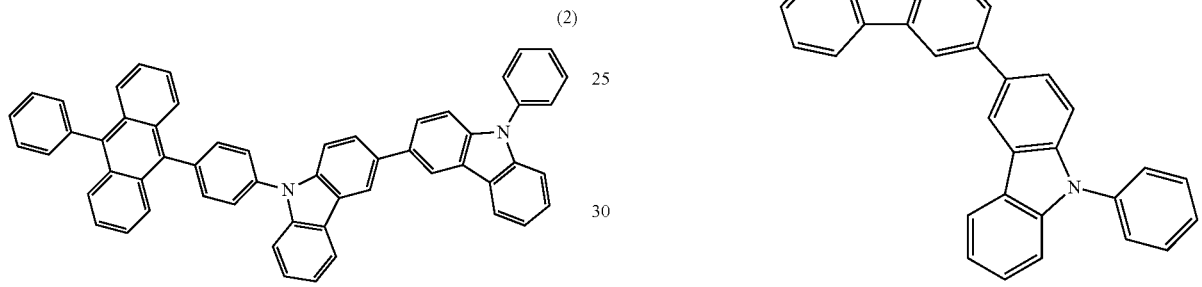

(2)

[Chemical Formula 11]

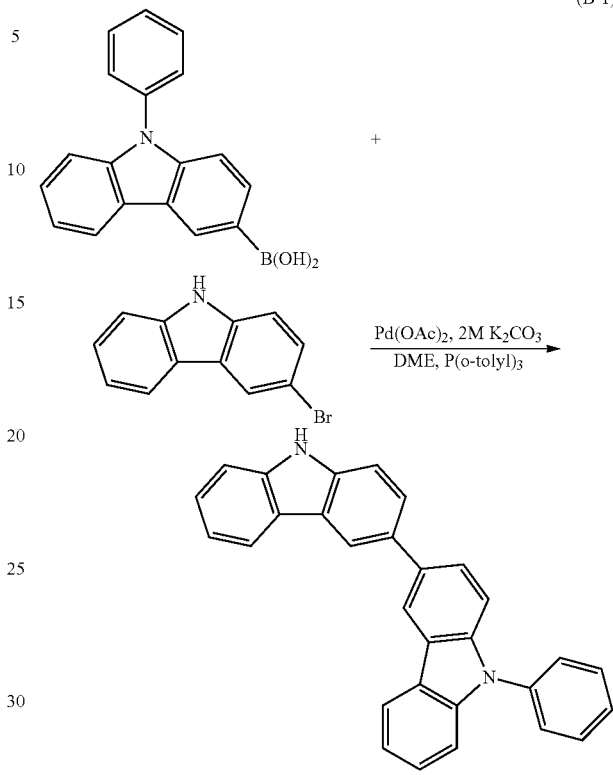

(B-1)

Step 1: Synthesis of 9-phenyl-3,3'-bi(9H-carbazole) (PCC)

2.5 g (10 mmol) of 3-bromocarbazole, 2.9 g (10 mmol) of N-phenylcarbazole-3-boronate, and 152 mg (0.50 mmol) of tri(ortho-tolyl)phosphine were put into a 200 mL three-neck flask. The atmosphere in the flask was substituted with nitrogen. 50 mL of dimethoxyethanol (DME) and 10 mL of potassium carbonate solution (2 mol/L) were added to the mixture. The mixture was stirred while pressure is reduced so as to be deaerated. After the deaeration, 50 mg (0.2 mmol) of palladium acetate was added. The mixture was stirred at 80° C. for three hours under a nitrogen stream. After the stir, about 50 mL of toluene was added to the mixture and the mixture was stirred for about 30 minutes, and then the mixture was washed with water and saturated saline in this order. After the washing, an organic layer was dried with magnesium sulfate. The mixture was naturally filtrated, and the obtained filtrate was concentrated, so that an oily substance was obtained. The obtained oily substance was dissolved in toluene, the solution was filtrated through Florisil, alumina, and celite, and the obtained filtrate was concentrated, so that 3.3 g of a white solid substance, which was the object, was obtained in a yield of 80%. The synthesis scheme of Step 1 is shown in the following (B-1).

$^1$H NMR spectrum of the solid substance obtained in above Step 1 was measured by nuclear magnetic resonance measurement. The measurement data are shown below.
$^1$H NMR (DMSO-d$_6$, 300 MHz): (=7.16-7.21 (m, 1H), 7.29-7.60 (m, 8H), 7.67-7.74 (m, 4H), 7.81-7.87 (m, 2H), 8.24 (d, J=7.8 Hz, 1H), 8.83 (d, J=7.8 Hz, 1H), 8.54 (d, J=1.5 Hz, 1H), 8.65 (d, J=1.5 Hz, 1H), 11.30 (s, 1H).

Step 2: Synthesis of PCCPA 1.2 g (3.0 mmol) of 9-phenyl-10-(4-bromophenyl)anthracene, 1.2 g (3.0 mmol) of PCC, and 1.0 g (10 mmol) of tert-BuONa were put into a 100 mL three-neck flask. The atmosphere in the flask was substituted with nitrogen. 20 mL of toluene and 0.1 mL of tri(tert-butyl)phosphine (10 wt % of hexane solution) were added to the mixture. The mixture was stirred while pressure is reduced so as to be deaerated. After the deaeration, 96 mg (0.17 mmol) of bis(dibenzylideneacetone)palladium(0) was added to the mixture. The mixture was refluxed at 110° C. for eight hours under a nitrogen stream. After the reflux, about 50 mL of toluene was added to the mixture, the mixture was stirred for about 30 minutes, and the mixture was washed with water and saturated saline in this order. After the washing, an organic layer was dried with magnesium sulfate. The mixture was naturally filtrated, and the obtained filtrate was concentrated, so that an oily substance was obtained. The obtained oily substance was purified by silica gel column chromatography (hexane (developing solvent):toluene=1:1). The obtained light yellow solid substance was recrystallized with chloroform/hexane, so that 1.2 g of a light yellow powdered solid substance of PCCPA, which was an object, was obtained in a yield of 54%. 2.4 g of the obtained light yellow powdered solid substance was sublimated and purified by train sublimation. The conditions for sublimation purification were as follows: the pressure was 8.7 Pa, the argon gas flow rate was 3.0 mL/min, and the heating temperature of PCCPA was 350° C. After the sublimation purification, 2.2 g of a light yellow powdered solid substance of PCCPA was obtained in a yield of 94%. The synthesis scheme of Step 2 is shown in the following (B-2).

[Chemical Formula 12]

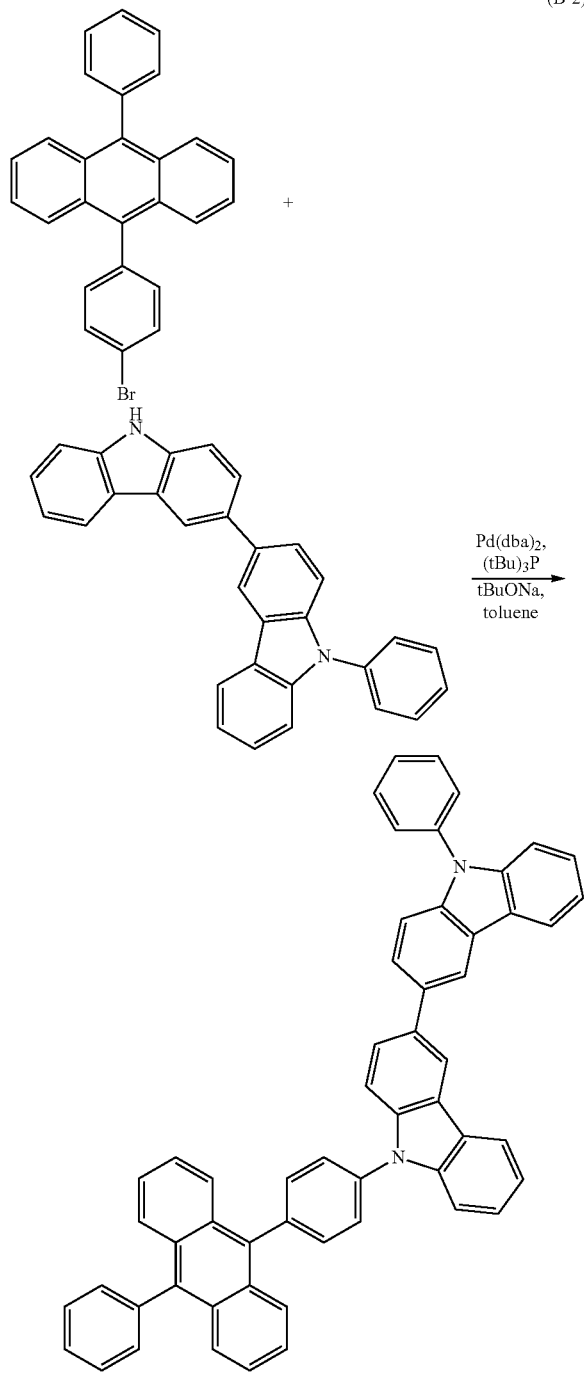

(B-2)

$^1$H NMR spectrum of the solid substance obtained in above Step 2 was measured. The measurement data are shown below. According to the measurement data, it was found that PCCPA represented by the above-described structural formula (2) was obtained.

$^1$H NMR (CDCl$_3$, 300 MHz): δ=7.34-7.91 (m, 32H), 8.27 (d, J=7.2 Hz, 1H), 8.31 (d, J=7.5 Hz, 1H), 8.52 (dd, J$_1$=1.5 Hz, J$_2$=5.4 Hz, 2H).

The synthesis method of PCBAPA used for the light-emitting elements 7 and 8 will be described because PCBAPA is also not a known substance. PCBAPA is a substance having the structure represented by the structural formula (3).

[Chemical Formula 13]

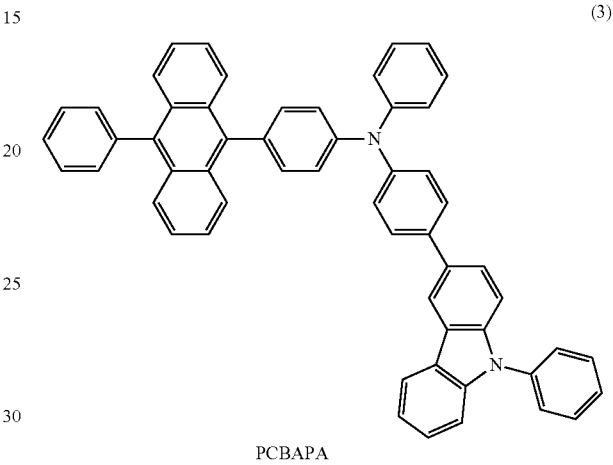

(3)

PCBAPA

Step 1: Synthesis of 9-phenyl-9H-carbazole-3-boronic acid 10 g (31 mmol) of 3-bromo-9-phenyl-9H-carbazole was put into a 500 mL three-neck flask. The atmosphere in the flask was substituted with nitrogen. 150 mL of tetrahydrofuran (THF) was added to the three-neck flask and 3-bromo-9-phenyl-9H-carbazole was dissolved. The solution was cooled to −80° C. Into this solution, 20 mL (32 mmol) of n-butyl-lithium (1.58 mol/L hexane solution) was dropped with a syringe. After the dropping, the solution was stirred at the same temperature for one hour. After the stir, 3.8 mL (34 mmol) of trimethyl borate was added into the solution, and while the temperature of the solution was being increased to room temperature, the solution was stirred for about 15 hours. After the stir, about 150 mL of dilute hydrochloric acid (1.0 mol/L) was added to the solution and stirred for one hour. After the stir, an aqueous layer of the mixture was extracted with ethyl acetate and the extracted solution and an organic layer were washed together with a saturated sodium hydrogen carbonate aqueous solution. The organic layer was dried with magnesium sulfate, and then the mixture was naturally filtrated. The obtained filtrate was concentrated, so that a light-brown oily substance was obtained. The oily substance was dried with pressure reduced, so that 7.5 g of a light-brown solid substance, which was an object, was obtained in a yield of 86%. The synthesis scheme of Step 1 is shown in the following (C-1).

[Chemical Formula 14]

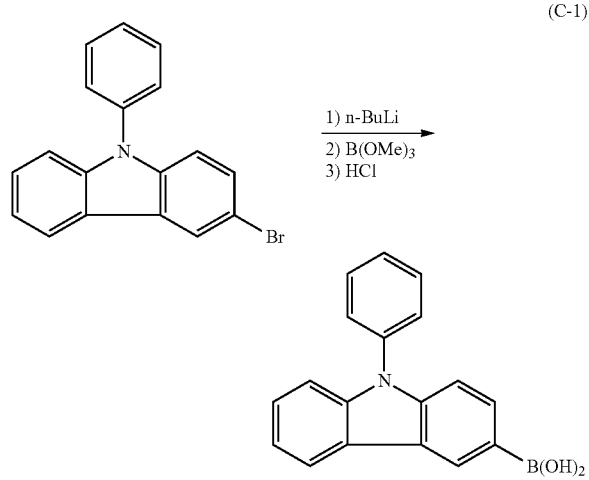

Step 2: Synthesis of
4-(9-phenyl-9H-carbazol-3-yl)diphenylamine
(PCBA)

6.5 g (26 mmol) of 4-bromodiphenylamine, 7.5 g (26 mmol) of 9-phenyl-9H-carbazole-3-boronic acid which was synthesized in Step 1, and 400 mg (1.3 mmol) of tri(o-tolyl)phosphine were put into a 500 mL three-neck flask. The atmosphere in the flask was substituted with nitrogen. 100 mL of toluene, 50 mL of ethanol, and 14 mL of potassium carbonate solution (0.2 mol/L) were added to the mixture. The mixture was stirred under low pressure so as to be deaerated. After the deaeration, 67 mg (30 mmol) of palladium(II) acetate was added. The mixture was refluxed at 100° C. for 10 hours. After the reflux, an aqueous layer of the mixture was extracted with toluene and the extracted solution and an organic layer were washed together with a saturated saline. The organic layer was dried with magnesium sulfate, and then the mixture was naturally filtrated. The obtained filtrate was concentrated, so that a light-brown oily substance was obtained. The obtained oily substance was purified by silica gel column chromatography (hexane:toluene=4:6 (developing solvent). After the purification, the obtained white solid substance was recrystallized with a mixed solvent of dichloromethane and hexane, so that 4.9 g of a white solid substance of PCBA was obtained in a yield of 45%. The synthesis scheme of Step 2 is shown in the following (C-2).

[Chemical Formula 15]

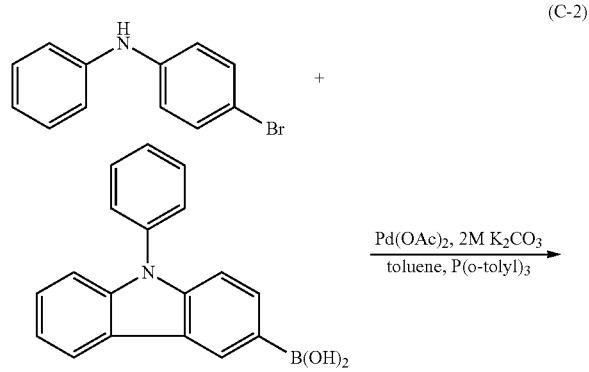

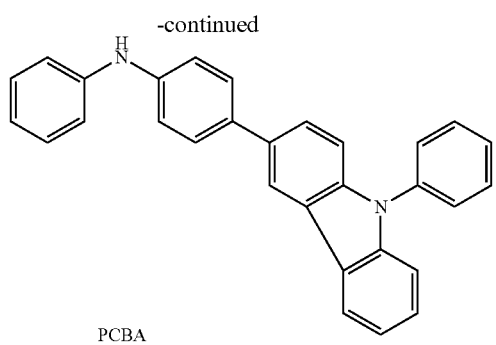

PCBA

Step 3: Synthesis of PCBAPA 7.8 g (12 mmol) of 9-(4-bromophenyl)-10-phenylanthracene, 4.8 g (12 mmol) of PCBA, and 5.2 g (52 mmol) of sodium tert-butoxide were put into a 300 mL three-neck flask. The atmosphere in the flask was substituted by nitrogen. 60 mL of toluene and 0.30 mL of tri(tert-butyl)phosphine (10 wt % of hexane solution) were added to the mixture. The mixture was stirred under low pressure so as to be deaerated. After the deaeration, 136 mg (0.24 mmol) of bis(dibenzylideneacetone)palladium(0) was added to the mixture. The mixture was stirred at 100° C. for three hours. After the stir, about 50 mL of toluene was added to the mixture, and then the mixture was suction-filtrated through Celite (produced by Wako Pure Chemical Industries, Ltd., Catalog No. 531-16855), alumina, and Florisil (produced by Wako Pure Chemical Industries, Ltd., Catalog No. 540-00135). The obtained filtrate was concentrated, so that a yellow solid substance was obtained. The solid substance was recrystallized with a mixed solvent of toluene and hexane, so that 6.6 g of a light yellow solid substance of PCBAPA, which was an object, was obtained in a yield of 75%. 3.0 g of the obtained light yellow powdered solid substance was sublimated and purified by train sublimation. The conditions for sublimation purification were as follows: the pressure was 8.7 Pa, the argon gas flow rate was 3.0 mL/min, and the heating temperature of PCBAPA was 350° C. After the sublimation purification, 2.7 g of a light yellow powdered solid substance of PCBAPA was obtained in a yield of 90%. The synthesis scheme of Step 3 is shown in the following (C-3).

[Chemical Formula 16]

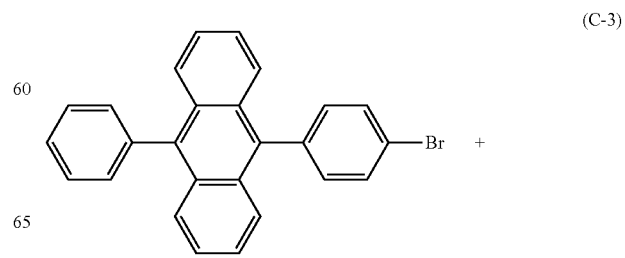

PCBAPA

¹H NMR spectrum of the solid substance obtained in above Step 3 was measured. The measurement data are shown below. According to the measurement result, it was found that PCBAPA represented by the above-described structural formula (3) was obtained.

¹H NMR (CDCl₃, 300 MHz): δ=7.08-7.14 (m, 3H), 7.32-7.72 (m, 33H), 7.88 (d, J=7.8 Hz, 2H), 8.19 (d, J=7.8 Hz, 1H), 8.37 (d, J=1.5 Hz, 1H).

This application is based on Japanese Patent Application serial No. 2007-250512 filed with Japan Patent Office on Sep. 27, 2007, the entire contents of which are hereby incorporated by reference.

What is claimed is:

1. A light-emitting element comprising:
    an anode and a cathode over a substrate; and
    a first layer, a second layer and a third layer between the anode and the cathode,
    wherein the first layer is between the anode and the second layer,
    wherein the third layer is between the second layer and the cathode,
    wherein the first layer is a mixture including a first organic compound having a hole-transporting property and a second organic compound having a light-emitting property,
    wherein the second layer is a mixture including a third organic compound having a hole-transporting property and a fourth organic compound having a light-emitting property,
    wherein the third layer is a mixture including a fifth organic compound having an electron-transporting property and the second organic compound,
    wherein the fourth organic compound is a different compound from the second organic compound,
    wherein a color of light emitted from the second organic compound and a color of light emitted from the fourth organic compound have a relationship of complementary colors, and
    wherein the color of light emitted from the second organic compound is blue, and the color of light emitted from the fourth organic compound is yellow.

2. The light-emitting element according to claim 1, wherein the first organic compound includes PCCPA.

3. The light-emitting element according to claim 1, wherein the second organic compound includes an anthracene derivative having amino group and carbazolyl group.

4. The light-emitting element according to claim 1, wherein the second organic compound includes 2YGAPPA.

5. The light-emitting element according to claim 1, wherein the second organic compound includes PCBAPA.

6. The light-emitting element according to claim 1, further comprising a hole-transporting layer between the first layer and the anode, and an electron-transporting layer between the third layer and the cathode.

7. The light-emitting element according to claim 1, wherein the light-emitting element is incorporated in an electronic device selected from the group consisting of a television set, a computer, a phone, and a camera.

8. A light-emitting element comprising:
    an anode and a cathode over a substrate; and
    a first layer, a second layer and a third layer between the anode and the cathode,
    wherein the first layer is between the anode and the second layer,
    wherein the third layer is between the second layer and the cathode,
    wherein the first layer is a mixture including a first organic compound having a hole-transporting property and a second organic compound having a light-emitting property,
    wherein the second layer is a mixture including a third organic compound having a hole-transporting property and a fourth organic compound having a light-emitting property,
    wherein the third layer is a mixture including a fifth organic compound having an electron-transporting property and the second organic compound,
    wherein the fourth organic compound is a different compound from the second organic compound,
    wherein the third organic compound is a same compound as the first organic compound
    wherein a color of light emitted from the second organic compound and a color of light emitted from the fourth organic compound have a relationship of complementary colors, and
    wherein the color of light emitted from the second organic compound is blue, and the color of light emitted from the fourth organic compound is yellow.

9. The light-emitting element according to claim 8, wherein the first organic compound includes PCCPA.

10. The light-emitting element according to claim 8, wherein the second organic compound includes an anthracene derivative having amino group and carbazolyl group.

11. The light-emitting element according to claim 8, wherein the second organic compound includes 2YGAPPA.

12. The light-emitting element according to claim 8, wherein the second organic compound includes PCBAPA.

13. The light-emitting element according to claim 8, further comprising a hole-transporting layer between the first layer and the anode, and an electron-transporting layer between the third layer and the cathode.

14. The light-emitting element according to claim 8, wherein the light-emitting element is incorporated in an electronic device selected from the group consisting of a television set, a computer, a phone, and a camera.

* * * * *

UNITED STATES PATENT AND TRADEMARK OFFICE
CERTIFICATE OF CORRECTION

PATENT NO. : 8,664,849 B2
APPLICATION NO. : 13/614151
DATED : March 4, 2014
INVENTOR(S) : Takahiro Ushikubo It is certified that error appears in the above-identified patent and that said Letters Patent is hereby corrected as shown below:

In the Specification:

Column 14, line 67; Change "480 inn" to --480 nm--.

Column 15, line 16; Change "propanedinitrite" to --propanedinitrile--.

Column 16, line 26; Change "beryllium or (BeBq$_2$)," to --beryllium(BeBq2),--.

Column 16, line 28; Change "(BAIq)," to --(BAlq),--.

Column 16, line 41; Change "derivatives;" to --derivatives,--.

Column 20, line 15; Change "solvent):" to --solvent).--.

Column 22, line 19; Change "AILi," to --AlLi,--.

Column 22, line 25; Change "(ZnO);" to --(ZnO),--.

Column 22, line 54; Change "fiberglass:reinforced" to --fiberglass-reinforced--.

Column 42, line 24; Change "(YGA)" to --(YGA).--.

Column 50, line 30; Change "palladium(0)" to --palladium(O)--.

Signed and Sealed this
First Day of July, 2014

Michelle K. Lee
*Deputy Director of the United States Patent and Trademark Office*